United States Patent
Mun et al.

(10) Patent No.: US 9,900,623 B2
(45) Date of Patent: Feb. 20, 2018

(54) RECEIVING SYSTEM AND METHOD FOR PROCESSING DIGITAL BROADCAST SIGNAL IN THE RECEIVING SYSTEM

(71) Applicant: LG ELECTRONICS INC., Seoul (KR)

(72) Inventors: Chulkyu Mun, Seoul (KR); Jinwoo Kim, Seoul (KR); Inhwan Choi, Seoul (KR); Byounggill Kim, Seoul (KR); Wongyu Song, Seoul (KR)

(73) Assignee: LG ELECTRONICS INC, Seoul (KR)

( * ) Notice: Subject to any disclaimer, the term of this patent is extended or adjusted under 35 U.S.C. 154(b) by 289 days.

(21) Appl. No.: 14/598,956

(22) Filed: Jan. 16, 2015

(65) Prior Publication Data

US 2015/0163517 A1    Jun. 11, 2015

Related U.S. Application Data

(63) Continuation of application No. 13/277,062, filed on Oct. 19, 2011, now Pat. No. 8,964,857.
(Continued)

(51) Int. Cl.
*H04N 19/66* (2014.01)
*H04L 27/06* (2006.01)
(Continued)

(52) U.S. Cl.
CPC ........ *H04N 19/66* (2014.11); *H03M 13/2721* (2013.01); *H03M 13/293* (2013.01);
(Continued)

(58) Field of Classification Search
CPC ......... H04L 27/06; H04L 27/01; H04L 27/04; H04L 27/063; H04L 1/004; H04L 29/06;
(Continued)

(56) References Cited

U.S. PATENT DOCUMENTS

| | | | |
|---|---|---|---|
| 6,178,209 B1* | 1/2001 | Hulyalkar | H04L 1/0054 375/341 |
| 7,251,281 B2* | 7/2007 | Marko | H04L 1/0041 375/260 |

(Continued)

OTHER PUBLICATIONS

Forward Error Correction in Digital Television Broadcast Systems, by Michael Francis and Robert Green, White Papers WP 270 v. 1.0.1., Apr. 21, 2008.

*Primary Examiner* — Dramos I Kalapodas
(74) *Attorney, Agent, or Firm* — Dentons US LLP

(57) ABSTRACT

A transmitting system, a receiving system, and a method of processing broadcast signals are disclosed. The method for processing a broadcast signal in a broadcast receiver comprises receiving a DTV signal including a data group, the data group including mobile service data, segmented known data sequences, long known data sequences and transmission parameter data, compensating carrier frequency offset of the DTV signal and channel-equalizing the carrier frequency offset compensated DTV signal using at least one of the long known data sequences and segmented known data sequences in the data group of the DTV signal, wherein the channel-equalizing includes performing a Error Correction (FEC) decoding on data located between the segmented known data sequences, and estimating Channel Impulse Response (CIR) using the FEC decoded data as known data.

8 Claims, 59 Drawing Sheets

Related U.S. Application Data

(60) Provisional application No. 61/394,789, filed on Oct. 20, 2010.

(51) Int. Cl.

| | | |
|---|---|---|
| *H04L 29/00* | (2006.01) | |
| *H04N 7/24* | (2011.01) | |
| *H04N 21/2383* | (2011.01) | |
| *H04N 21/2389* | (2011.01) | |
| *H04N 21/438* | (2011.01) | |
| *H04N 21/61* | (2011.01) | |
| *H04L 1/00* | (2006.01) | |
| *H04L 25/02* | (2006.01) | |
| *H03M 13/27* | (2006.01) | |
| *H03M 13/29* | (2006.01) | |
| *H03M 13/35* | (2006.01) | |
| *H04N 21/236* | (2011.01) | |
| *H04N 21/2362* | (2011.01) | |
| *H04L 27/00* | (2006.01) | |
| *H03M 13/09* | (2006.01) | |
| *H03M 13/15* | (2006.01) | |
| *H03M 13/25* | (2006.01) | |
| *H04H 20/57* | (2008.01) | |

(52) U.S. Cl.
CPC ... *H03M 13/2921* (2013.01); *H03M 13/2966* (2013.01); *H03M 13/2972* (2013.01); *H03M 13/356* (2013.01); *H04L 1/005* (2013.01); *H04L 1/006* (2013.01); *H04L 1/0057* (2013.01); *H04L 1/0065* (2013.01); *H04L 1/0071* (2013.01); *H04L 25/0212* (2013.01); *H04L 27/06* (2013.01); *H04L 29/00* (2013.01); *H04N 7/24* (2013.01); *H04N 21/2383* (2013.01); *H04N 21/2389* (2013.01); *H04N 21/4382* (2013.01); *H04N 21/4383* (2013.01); *H04N 21/6112* (2013.01); *H03M 13/09* (2013.01); *H03M 13/1515* (2013.01); *H03M 13/256* (2013.01); *H04H 20/57* (2013.01); *H04L 1/0061* (2013.01); *H04L 2001/0093* (2013.01); *H04L 2027/0026* (2013.01); *H04N 21/2362* (2013.01); *H04N 21/23608* (2013.01); *H04N 21/23611* (2013.01)

(58) Field of Classification Search
CPC ....... H04L 1/00; H04L 1/0006; H04L 1/0071; H04L 1/0065; H04L 1/0059; H04H 40/27; H04H 60/11; H04H 20/65; H04H 20/71; H04H 20/55; H04H 20/95; H03M 13/253; H03M 13/6538; H03M 13/2732; H03M 13/2936; H03M 13/256; H03M 13/2924; H03M 13/27; H03M 13/1515; H03M 13/29; H03M 13/35; H03D 1/00; H04N 19/70; H04N 13/29; H04N 13/09; H04N 13/098; H04N 21/41407; H04N 21/235; H04N 21/4425; H04N 21/4345; H04N 21/4382; H04N 21/435; H04N 21/2383; H04N 21/64322; H04N 19/65; H04N 7/16; H04N 19/66; G06F 11/08
See application file for complete search history.

(56) References Cited

U.S. PATENT DOCUMENTS

| | | | |
|---|---|---|---|
| 8,005,166 B2 * | 8/2011 | Limberg | H03M 13/253 375/265 |
| 8,149,948 B2 * | 4/2012 | Song | H03M 13/2721 375/240.01 |
| 2007/0201516 A1 * | 8/2007 | Lee | H04L 1/0047 370/538 |
| 2008/0075201 A1 | 3/2008 | Limberg | |
| 2008/0192858 A1 | 8/2008 | Kim et al. | |
| 2008/0260014 A1 * | 10/2008 | Yang | H04L 25/03057 375/232 |
| 2009/0034630 A1 | 2/2009 | Cho et al. | |
| 2009/0037959 A1 * | 2/2009 | Suh | H04N 21/4345 725/62 |
| 2009/0046816 A1 * | 2/2009 | Hong | H04L 1/0045 375/340 |
| 2009/0103632 A1 * | 4/2009 | Choi | H03M 13/27 375/240.25 |
| 2009/0180571 A1 * | 7/2009 | Song | H03M 13/2721 375/295 |
| 2009/0228764 A1 * | 9/2009 | Lee | H03M 13/27 714/776 |
| 2010/0046631 A1 * | 2/2010 | Raveendran | H04N 21/4348 375/240.25 |
| 2010/0201872 A1 | 8/2010 | Choi et al. | |
| 2010/0220779 A1 | 9/2010 | Kwon et al. | |
| 2010/0284473 A1 | 11/2010 | Suh et al. | |
| 2010/0293589 A1 | 11/2010 | Kim et al. | |
| 2010/0306618 A1 | 12/2010 | Kim et al. | |
| 2011/0274178 A1 | 11/2011 | Onno et al. | |
| 2012/0069892 A1 | 3/2012 | Kim et al. | |

\* cited by examiner

FIG. 7

| Parade Type | Ensembles | | Compatible to | | Group Format | # of MHE Pkt per slot |
|---|---|---|---|---|---|---|
| | Primary | Secondary | DTV | M/H1.0 | | |
| (1) | ABCD | - | Y | Y(Full) | V1.0 | 118 |
| (2) | AB | CD | Y | Y(Full) | V1.0 | 118 |
| (3) | ABCD | E | Y | Y(Full) | V1.1 E1 | 148 |
| (4) | AB | CDE | Y | Y(Partial) | V1.1 E2 | 148 |
| (5) | ABCDE | - | Y | N | V1.1 E2 | 148 |
| (6) | ABCD | E | N | Y(Full) | V1.1 F1 | 156 |
| (7) | AB | CDE | N | Y(Partial) | V1.1 F2 | 156 |
| (8) | ABCDE | - | N | N | V1.1 F3 | 156 |

Rows (1)–(5): Fixed DTV program(s) coexists.
Rows (6)–(8): Full Channel Case

Black : V1.0 Ensemble
Bold : V1.1 Ensemble

Full : Region-ABCD Compatible
Partial : Region-AB Compatible

FIG. 8
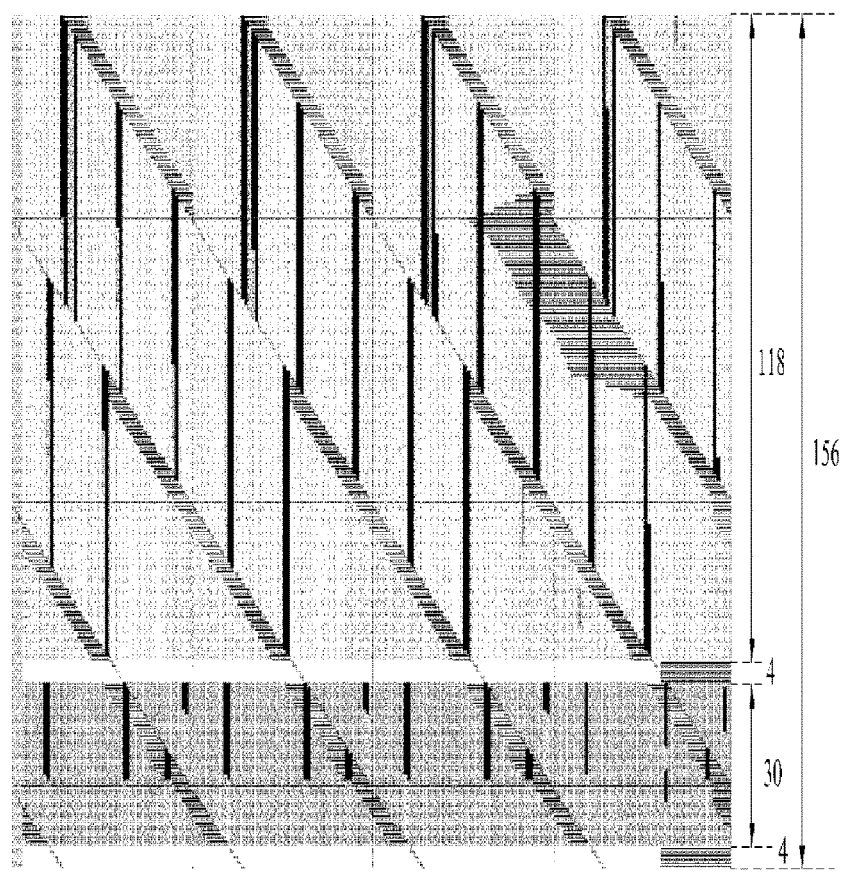
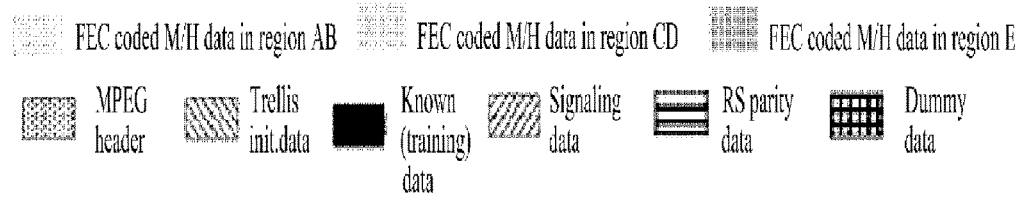

FIG. 10
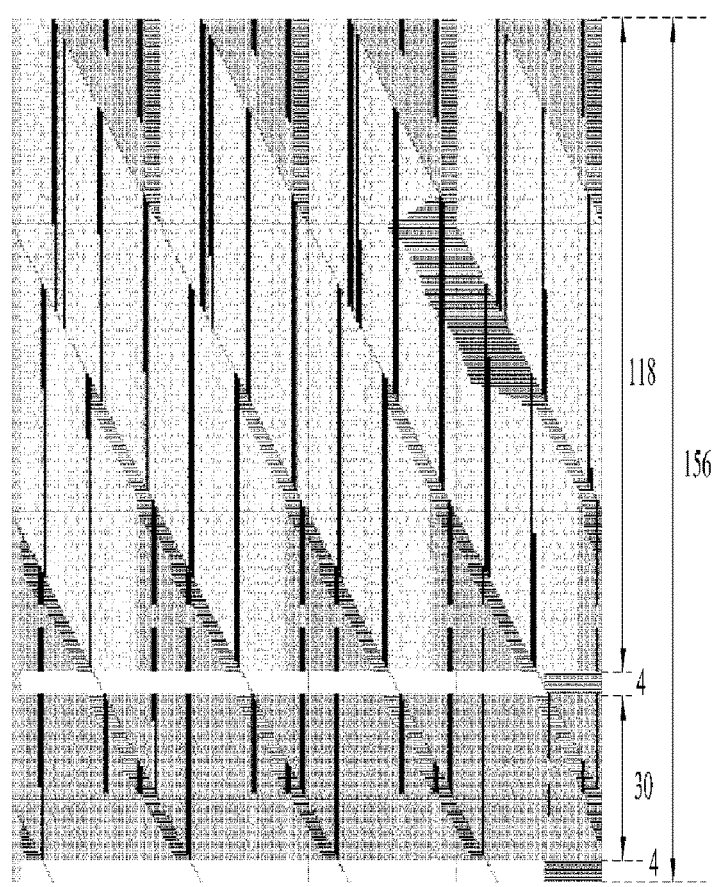
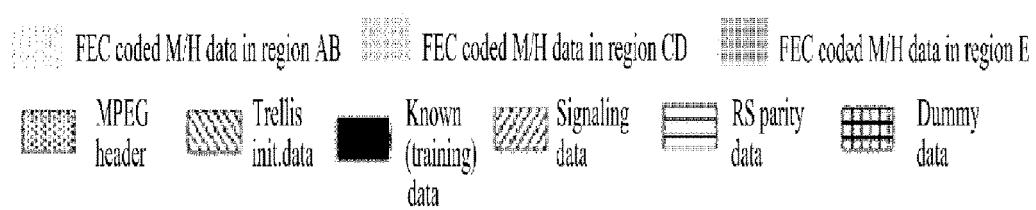

FIG. 18

| Syntax | No. of Bits | Format |
|---|---|---|
| TPC_data { | | |
| sub-frame_number | 3 | uimsbf |
| slot_number | 4 | uimsbf |
| parade_id | 7 | uimsbf |
| if(sub-frame_number≤1) { | | |
| current_starting_group_number | 4 | uimsbf |
| current_number_of_groups_minus_1 | 3 | uimsbf |
| } | | |
| if(sub-frame_number≥2) { | | |
| next_starting_group_number | 4 | uimsbf |
| next_number_of_groups_minus_1 | 3 | uimsbf |
| } | | |
| parade_repetition_cycle_minus_1 | 3 | uimsbf |
| if(sub-frame_number≤1) { | | |
| current_rs_frame_mode | 2 | bslbf |
| current_rs_code_mode_primary | 2 | bslbf |
| current_rs_code_mode_secondary | 2 | bslbf |
| current_sccc_block_mode | 2 | bslbf |
| current_sccc_outer_code_mode_a | 2 | bslbf |
| current_sccc_outer_code_mode_b | 2 | bslbf |
| current_sccc_outer_code_mode_c | 2 | bslbf |
| current_sccc_outer_code_mode_d | 2 | bslbf |
| } | | |
| if(sub-frame_number≥2) { | | |
| next_rs_frame_mode | 2 | bslbf |
| next_rs_code_mode_primary | 2 | bslbf |
| next_rs_code_mode_secondary | 2 | bslbf |
| next_sccc_block_mode | 2 | bslbf |
| next_sccc_outer_code_mode_a | 2 | bslbf |
| next_sccc_outer_code_mode_b | 2 | bslbf |
| next_sccc_outer_code_mode_c | 2 | bslbf |
| next_sccc_outer_code_mode_d | 2 | bslbf |
| } | | |
| fic_version | 5 | uimsbf |
| parade_continuity_counter | 4 | uimsbf |
| if(sub-frame_numbers≤1) { | | |
| current_TNoG | 5 | uimsbf |
| reserved | 5 | bslbf |
| } | | |
| if(sub-frame_number≥2) { | | |
| next_TNoG | 5 | uimsbf |
| current_TNoG | 5 | uimsbf |
| } | | |
| reserved | 16 | bslbf |
| tpc_protocol_version | 5 | bslbf |
| } | | |

FIG. 33

Index     : 0  1   2   3  ... 11997 11998 11999 12000 12001 12002 ... 23997 23998 23999 ...
Output    : 0  89 267 534 ... 6267  6089  6000  6000  6089  6267  ... 267   89    0    ...
Direction : <------ forward ------><-------- reverse -------->

Fig. 45
(a)
(b)
Data segment sync symbols   FEC coded MPH service data, main data, Rs   Training data symbols
parity data, dummy data, trellis initialization data,
or part of training data symbols Fig. 48
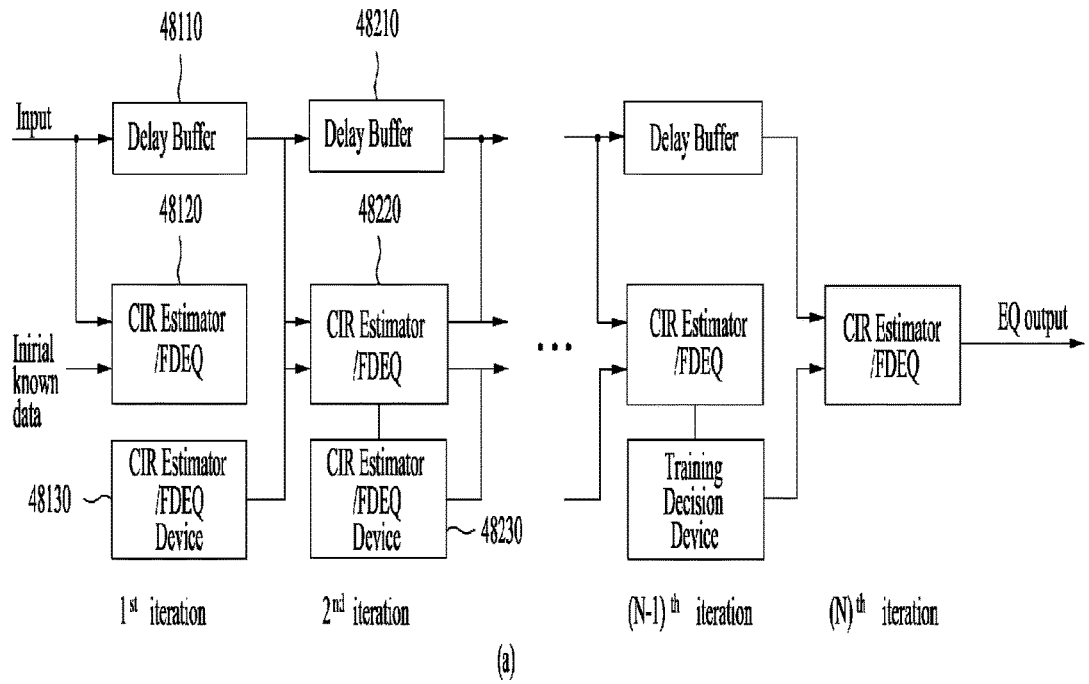
(a)
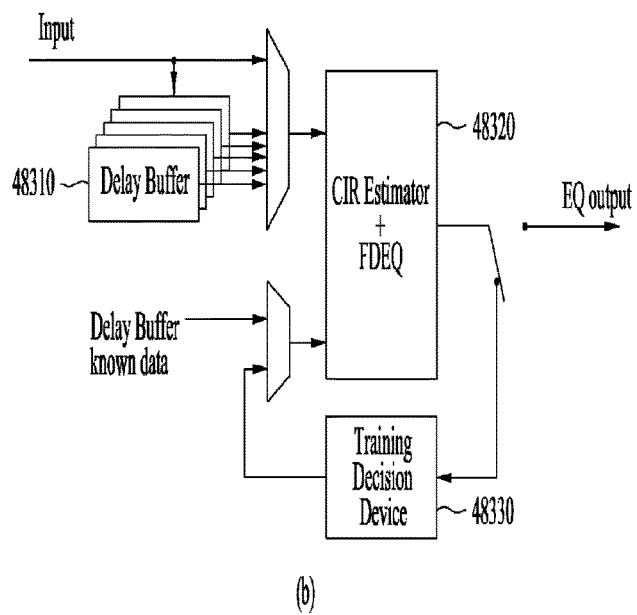
(b)

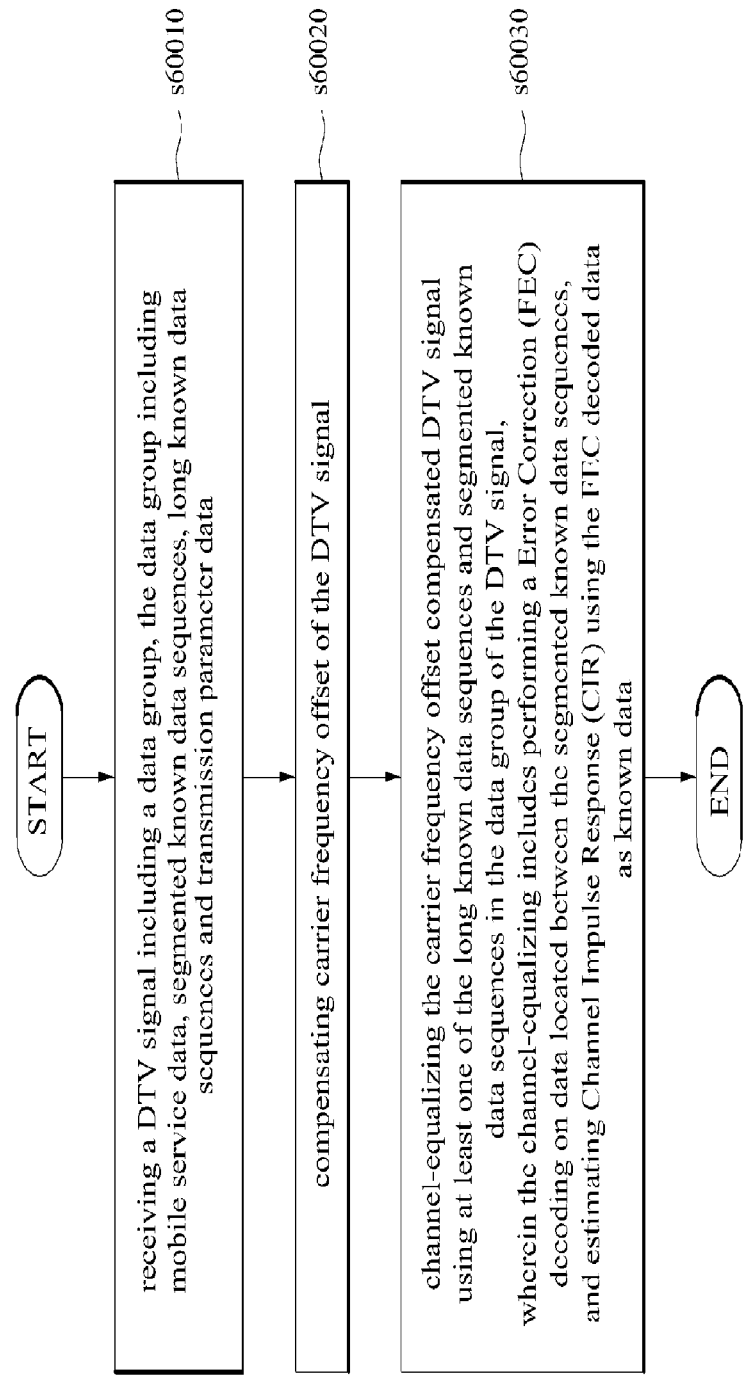

RECEIVING SYSTEM AND METHOD FOR PROCESSING DIGITAL BROADCAST SIGNAL IN THE RECEIVING SYSTEM

This application is a continuation of U.S. patent application Ser. No. 13/277,062, filed Oct. 19, 2011, which claims priority of U.S. Provisional Patent Application 61/394,789, filed Oct. 10, 2010, both of which is incorporated by reference for all purposes as if fully set forth herein.

BACKGROUND OF THE INVENTION

The Field of the Invention

The present invention relates to a digital broadcasting system for transmitting and receiving a digital broadcast signal, and more particularly, to a transmitting system for processing and transmitting the digital broadcast signal, and a method of processing data in the transmitting system and the receiving system.

Description of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a transmitting system and a method of processing a digital broadcast signal in a transmitting system that substantially obviate one or more problems due to limitations and disadvantages of the related art. An object of the present invention is to provide a transmission system which is able to transmit additional mobile service data while simultaneously maintaining the compatibility with a conventional system for transmitting a digital broadcast signal, and a method for processing a broadcast signal.

Another object of the present invention is to provide a transmission system which additionally inserts mobile service data and known data recognized by an agreement between a transmission system and a reception system into a conventional mobile service data area, thereby enhancing the reception performance of the mobile service data at the reception system, and a method for processing a broadcast signal.

Another object of the present invention is to provide a transmission system which forms continuous known data sequences by interconnecting discontinuous known data belonging to each data group through a concatenated structure of adjacent data groups, thereby enhancing the reception performance of a broadcast signal at a reception system, and a method for processing a broadcast signal.

Another object of the present invention is to provide a transmission system which generates information of additional mobile service data by extending signaling information and transmits the generated information to a reception system, such that the transmission system and the reception end can smoothly communicate with each other, and a method for processing a broadcast signal.

A further object of the present invention is to provide a transmitting system, a receiving system, and a method for processing broadcast signals that can enhance the receiving performance of the receiving system by performing carrier recovery and channel equalization using the known data Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for processing a broadcast signal in a broadcast receiver comprises receiving a DTV signal including a data group, the data group including mobile service data, segmented known data sequences, long known data sequences and transmission parameter data, compensating carrier frequency offset of the DTV signal and channel-equalizing the carrier frequency offset compensated DTV signal using at least one of the long known data sequences and segmented known data sequences in the data group of the DTV signal, wherein the channel-equalizing includes performing a Error Correction (FEC) decoding on data located between the segmented known data sequences, and estimating Channel Impulse Response (CIR) using the FEC decoded data as known data.

The channel-equalizing includes estimating a first CIR using the long known data sequence, performing FEC decoding the data located between the segmented known data sequences at a decision device, and estimating a second CIR using the segmented known data sequence and the FEC decoded data.

The channel-equalizing further includes iterating estimating CIR by using feedback of the FEC decoded data from the decision device and DTV signal which is buffered for a period during a processing in the decision device.

The channel-equalizing further includes performing a pre-equalizing for the carrier frequency offset compensated DTV signal, performing a FEC decoding on the data located between the segmented known data sequences of the pre-equalized DTV signal at a decision device, performing a buffering the carrier frequency offset compensated DTV signal during a processing of the pre-equalizing and decision device and estimating CIR for the buffered DTV signal using the FEC decoded data as known data.

The channel-equalizing further includes selecting first CIR of which value is over a threshold value and estimating second CIR using a filter having length which is shorter than a channel length and covers the first CIR.

Also, an apparatus for processing a digital broadcasting signal in a transmitter is described herein, the apparatus comprises means for fulfilling above mentioned method.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 7 illustrates a table that includes classification of regions contained in a data group depending on a parade type, transmission regions of respective ensembles, compatibility, the number of mobile service data packets contained in one slot, etc. according to an embodiment of the present invention.

FIG. 8 illustrates a structure provided before a data group is interleaved, when the data group includes (118+M) mobile service data packets, according to an embodiment of the present invention.

FIG. 10 illustrates a structure provided before a data group is interleaved, when the data group includes (118+M) mobile service data packets, according to an embodiment of the present invention.

FIG. 18 illustrates a syntax structure of a data field for signaling digital broadcast data according to an embodiment of the present invention.

FIG. 33 illustrates an example of a symbol interleaving pattern when an offset value is set to '0' according to an embodiment of the present invention.

FIG. 45 is a diagram showing the form of a known data sequence according to an embodiment of the present invention.

FIG. 48 is a diagram showing an iterative channel equalizer according to an embodiment of the present invention.

FIG. 60 is a flowchart illustrating a method of receiving and processing a broadcast signal at a receiver according to an embodiment of the present invention.

DESCRIPTION OF THE PREFERRED EMBODIMENTS

Figure 1:
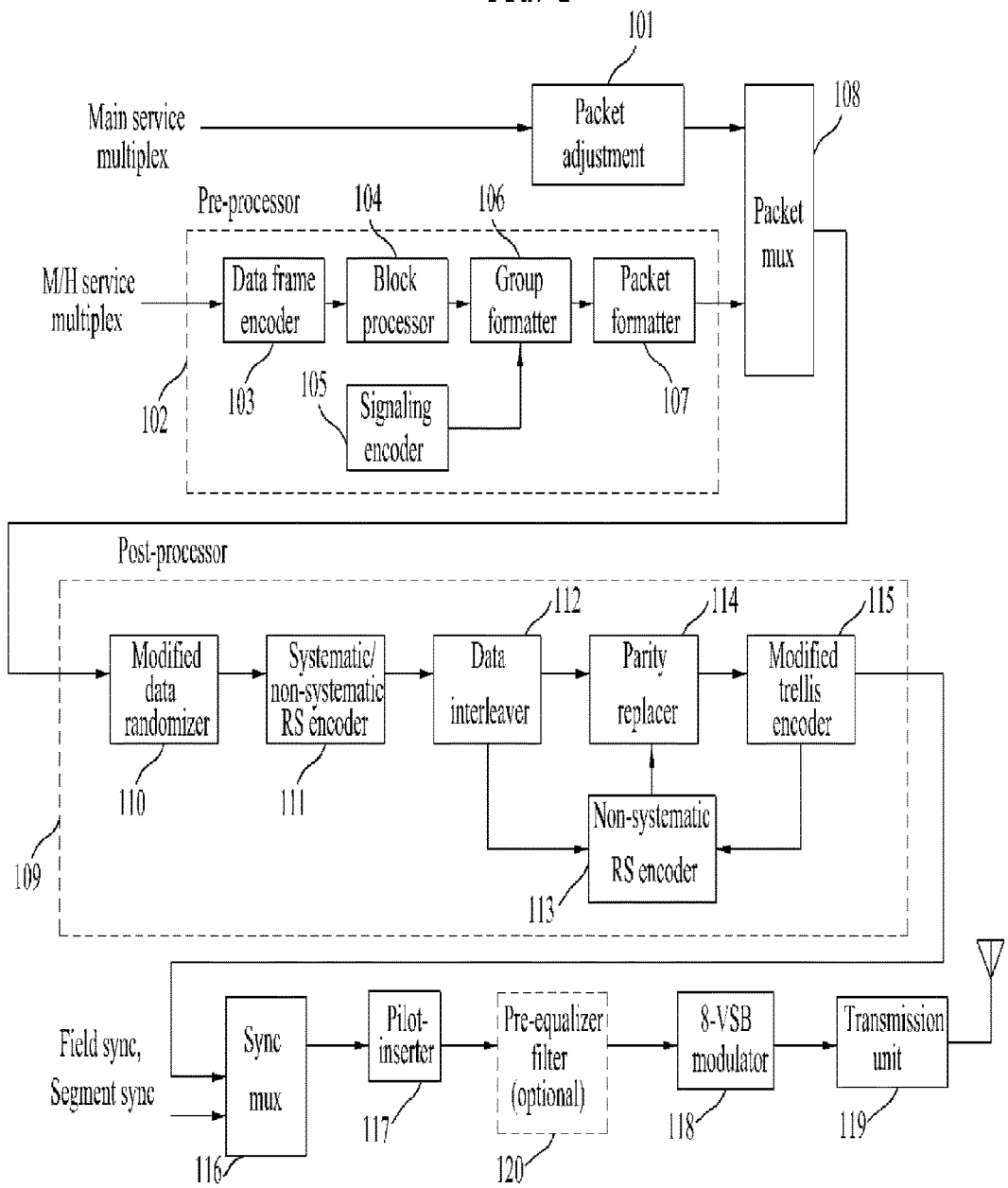
FIG. 1 is a block diagram illustrating a transmission system according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts.

In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

For convenience of description and better understanding of the present invention, abbreviations and terms to be use in the present invention are defined as follows.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "M/H (or MH)" corresponds to the initials of "mobile" and "handheld" and represents the opposite concept of a fixed-type system. Furthermore, the M/H service data may include at least one of mobile service data and handheld service data, and will also be referred to as "mobile service data" for simplicity. Herein, the mobile service data not only correspond to M/H service data but may also include any type of service data with mobile or portable characteristics. Therefore, the mobile service data according to the present invention are not limited only to the M/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

Known data—Known data is pre-recognized by an agreement between a transmission system and a reception system, and may be used for channel equalization, etc.

FEC—FEC is an abbreviation of a Forward Error Correction, and is a generic name of technologies wherein a reception end can spontaneously correct an error of a digital signal transmitted from the transmission end to the reception end without retransmission of a corresponding signal by the transmission end.

TPC—TPC is an abbreviation of a Transmission Parameter Channel. TPC is contained in each data group, and then transmitted. The TPC provides information about a data frame and a data group to the reception end, and performs signaling of the provided information.

TS—TS is an abbreviation of a Transport Stream.

RS—RS is an abbreviation of Reed-Solomon.

CRC—CRC is an abbreviation of a Cyclic Redundancy Check.

SCCC—SCCC is an abbreviation of a Serial Concatenated Convolutional Code.

PCCC—PCCC is an abbreviation of a Parallel Concatenated Convolutional Code.

FIC—FIC is an abbreviation of a Fast information channel. FIC carries cross-layer information. This information primarily includes channel binding information between ensembles and services.

Embodiments of the present invention will hereinafter be described with reference to the annexed drawings.

FIG. 1 is a block diagram illustrating a transmission system according to an embodiment of the present invention.

Referring to FIG. 1, the transmission system includes a packet adjustment unit 101, a pre-processor 102, a data frame encoder 103, a block processor 104, a signaling encoder 105, a group formatter 106, a packet formatter 107, a Packet multiplexer (Packet MUX) 108, a post-processor 109, a modified data randomizer 110, a systematic/non-systematic RS encoder 111, a data interleaver 112, a non-systematic RS encoder 113, a parity replacer 114, a modified trellis encoder 115, a synchronization multiplexer (Sync MUX) 116, a pilot inserter 117, a VSB modulator 118, and a Radio Frequency (RF) up-converter 119. In addition, the transmission system of FIG. 1 may further include a pre-equalizer filter 120.

When a mobile service data packet and a main service data packet are multiplexed, there may occur a displacement between a service stream packet including a mobile service stream and another service stream packet including no mobile service stream. In order to compensate for the displacement, the packet adjustment unit 101 may be used.

The pre-processor 102 configures mobile service data in a form of a mobile service structure for transmitting the mobile service data. In addition, the pre-processor 102 performs additional FEC coding of mobile service data. Also, the pre-processor 102 inserts known data. That is, the pre-processor 102 increases the stability of transmission and reception of mobile service data under a mobile environment.

The pre-processor 102 may include a data frame encoder 103, a block processor 103, a block processor 104, a signaling encoder 105, a group formatter 106, a packet formatter 107, and a packet multiplexer (packet MUX) 108. In other words, the above-mentioned constituent components may be contained in the pre-processor 102, and may be configured separately from the pre-processor 102.

The data frame encoder 103 randomizes mobile service data, and performs RS encoding and CRC encoding of the mobile service data.

The block processor 104 converts an RS frame portion into an SCCC block. The block processor 104 converts a mobile service data byte contained in the SCCC block into bit-based mobile service data. The block processor 104 performs convolution encoding of ½, ⅓, or ¼ rate on the bit-based mobile service data. In this case, the ½ rate means an encoding process in which two bits are output in response to an input of one bit, the ⅓ rate means an encoding process in which three bits are output in response to an input of two bits, and the ¼ rate means an encoding process in which four bits are output in response to an input of four bits. Output bits are contained in a symbol. The block processor 104 performs interleaving of the convolution-encoded output symbol. The block processor 104 converts an interleaved symbol into byte-based data, and converts an SCCC block into a data block. A detailed description of the data block will hereinafter be described in detail.

The signaling encoder 105 generates signaling information for signaling at a reception end, performs FEC encoding and PCCC encoding of the generated signaling information, and inserts the signaling information into some regions of the data group. For example, examples of the signaling information may be a transmission parameter channel (TPC) data, fast information channel (FIC) data, and the like.

The group formatter 106 forms a data group using the output data of the block processor 104. The group formatter 106 maps FEC-encoded mobile service data to an interleaved form of a data group format. At this time, the above-mentioned mapping is characterized in that FEC-encoded mobile service data is inserted into either a data block of a corresponding group or a group region according to a coding rate of each FEC-encoded mobile service data received from the block processor 104. In addition, the group formatter 106 inserts signaling data, a data byte used for initializing the trellis encoder, and a known data sequence. Further, the group formatter 106 inserts main service data, and a place-holder for an MPEG-2 header and a non-systematic RS parity. The group formatter 106 may insert dummy data to generate a data group of a desired format. After inserting various data, the group formatter 106 performs deinterleaving of data of the interleaved data group. After performing the deinterleaving operation, the data group returns to an original group formed before the interleaving operation.

The packet formatter 107 converts output data of the group formatter 106 into a Transport Stream (TS) packet. In this case, the TS packet is a mobile service data packet. In addition, the output of the packet formatter 107 according to an embodiment of the present invention is characterized in that it includes (118+M) mobile service data packets in a single data group. In this case, M is 38 or less.

The packet multiplexer (Packet MUX) 108 multiplexes a packet including mobile service data processed by the pre-processor 102 and a packet including main service data output from the packet adjustment unit 101. In this case, the multiplexed packet may include (118+M) mobile service data packets and L main service data packets. For example, according to an embodiment of the present invention, M is any one of integers from 0 to 38, and the sum of M and L is set to 38. In other words, although the packet multiplexer (packet MUX) 108 may multiplex the mobile service data packet and the main service data packet, in the case where the number of input main service data packets is set to '0' (i.e., L=0), only the mobile service data packet is processed by the packet multiplexer (packet MUX) 108, such that the packet multiplexer (packet MUX) 108 outputs the processed mobile service data packet only.

The post-processor 109 processes mobile service data in such a manner that the mobile service data generated by the present invention can be backward compatible with a conventional broadcast system. In accordance with one embodiment of the present invention, the post-processor 109 may include a modified data randomizer 110, a systematic/non-systematic RS encoder 111, a data interleaver 112, a non-systematic RS encoder 113, a parity replacer 114 and a modified trellis encoder 115. In other words, each of the above-mentioned constituent components may be located outside of the post-processor 109 according to the intention of a designer as necessary.

The modified data randomizer 110 does not perform randomizing of a mobile service TS packet, and bypasses a mobile service TS packet. The modified data randomizer 110 performs randomizing of the main service data TS packet. Therefore, according to one embodiment of the present invention, the randomizing operation is not performed when a data group generated by the pre-processor 102 has no main service data.

In the case where input data is a main service data packet, the systematic/non-systematic RS encoder 111 performs systematic RS encoding of the main service data packet acting as the input data, such that it generates RS FEC data. In the case where input data is a mobile service data packet, the systematic/non-systematic RS encoder 111 performs non-systematic RS encoding, such that it generates RS FEC data. In accordance with one embodiment of the present invention, the systematic/non-systematic RS encoder 111 generates RS FEC data having the size of 20 bytes during the systematic/non-systematic RS encoding process. The RS FEC data generated in the systematic RS encoding process is added to the end of a packet having the size of 187 bytes. RS FEC data generated in the non-systematic RS encoding process is inserted into the position of an RS parity byte predetermined in each mobile service data packet. Therefore, according to one embodiment of the present invention, in the case where the data group generated by the pre-processor has no main service data, the systematic RS encoder 111 for main service data performs no RS encoding. In this case, the non-systematic RS encoder 111 does not generate a non-systematic RS parity for backward compatibility.

The data interleaver 112 performs byte-based interleaving of data that includes main service data and mobile service data.

In the case where it is necessary to initialize the modified trellis encoder 115, the non-systematic RS encoder 113 receives an internal memory value of the modified trellis encoder 115 as an input, and receives mobile service data from the data interleaver 112 as an input, such that it changes initialization data of mobile service data to a memory value. The non-systematic RS encoder 113 performs non-systematic RS encoding of the changed mobile service data, and outputs the generated RS parity to the parity replacer 114.

In the case where it is necessary to initialize the modified trellis encoder 115, the parity replacer 114 receives mobile service data output from the data interlever 112, and replaces an RS parity of the mobile service data with an RS parity generated from the non-systematic RS encoder 113.

In the case where the data group generated in the pre-processor does not include main service data at all, the data group need not have an RS parity for backward compatibility. Accordingly, in accordance with one embodiment of the present invention, the non-systematic RS encoder 113 and the parity replacer 114 do not perform each of the above-mentioned operations, and bypass corresponding data.

The modified trellis encoder 115 performs trellis encoding of output data of the data interleaver 112. In this case, in order to allow data formed after the trellis encoding to have known data pre-engaged between a transmission end and a reception end, a memory contained in the modified trellis encoder 115 should be initialized before the beginning of the trellis encoding. The above-mentioned initialization operation begins by trellis initialization data belonging to a data group.

The synchronization multiplexer (Sync MUX) 116 inserts a field synchronization signal and a segment synchronization signal into output data of the modified trellis encoder 115, and multiplexes the resultant data.

The pilot inserter 117 receives the multiplexed data from the synchronization multiplexer (Sync MUX) 116, and inserts a pilot signal, that is used as a carrier phase synchronization signal for demodulating a channel signal at a reception end, into the multiplexed data.

The VSB modulator 118 performs VSB modulation so as to transmit data.

The transmission unit 119 performs frequency up-conversion of the modulated signal, and transmits the resultant signal.

In the present invention, the transmitting system provides backward compatibility in the main service data so as to be received by the conventional receiving system. Herein, the main service data and the mobile service data are multiplexed to the same physical channel and then transmitted.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

Figure 2:
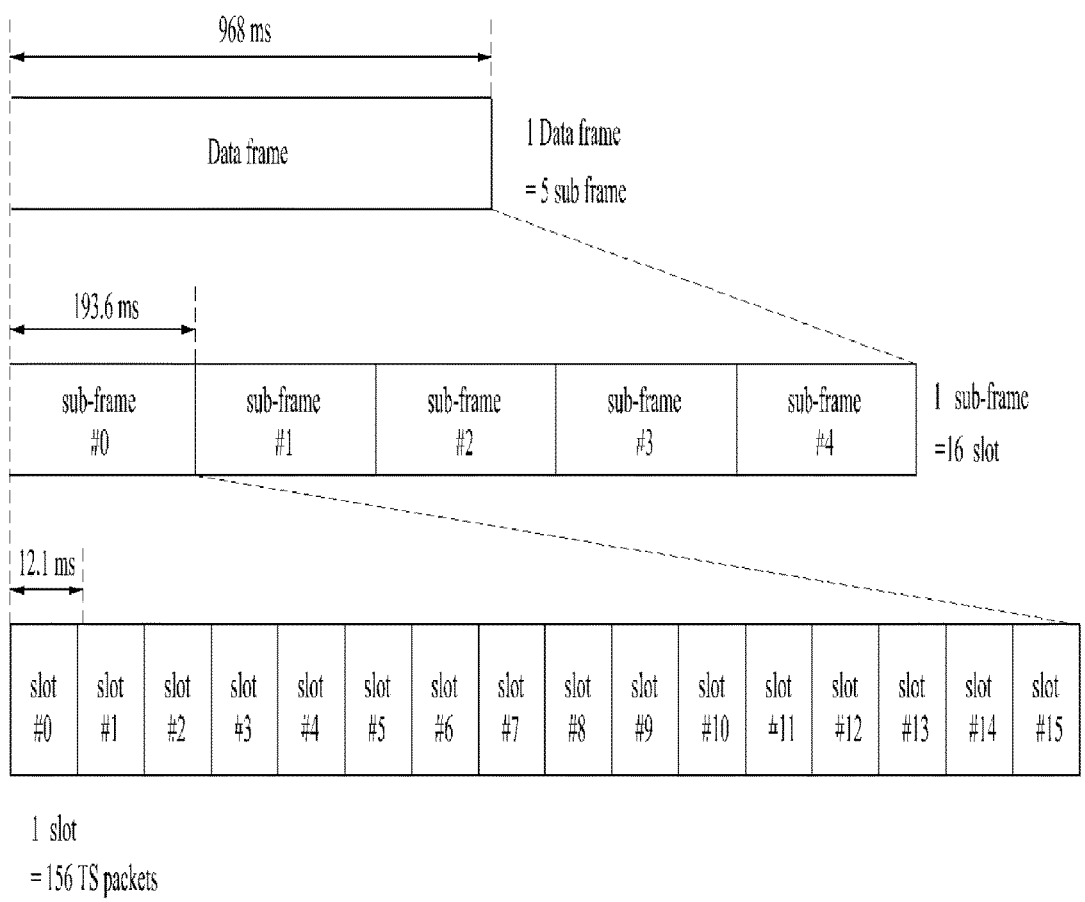
FIG. 2 illustrates a data frame structure for transmitting/receiving mobile data according to an embodiment of the present invention.

FIG. 2 illustrates a data frame structure for transmitting/receiving mobile service data according to one embodiment of the present invention.

In the embodiment of the present invention, the mobile service data are first multiplexed with main service data in DATA frame units and, then, modulated in a VSB mode and transmitted to the receiving system.

The term "data frame" mentioned in the embodiment of the present invention may be defined as the concept of a time during which main service data and mobile service data are transmitted. For example, one data frame may be defined as a time consumed for transmitting 20 VSB data frames.

At this point, one DATA frame consists of K1 number of sub-frames, wherein one sub-frame includes K2 number of slots. Also, each slot may be configured of K3 number of data packets. In the embodiment of the present invention, K1 will be set to 5, K2 will be set to 16, and K3 will be set to 156 (i.e., K1=5, K2=16, and K3=156). The values for K1, K2, and K3 presented in this embodiment either correspond to values according to a preferred embodiment or are merely exemplary. Therefore, the above-mentioned values will not limit the scope of the present invention.

In the example shown in FIG. 2, one DATA frame consists of 5 sub-frames, wherein each sub-frame includes 16 slots. In this case, the DATA frame according to the present invention includes 5 sub-frames and 80 slots.

Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of payload data as payload data of a segment, a data packet prior to being interleaved may also be used as a data segment.

156 data packets contained in a slot may be composed of 156 main service data packets, may be composed of 118 mobile service data packets and 38 main service data packets, or may be composed of (118+M) mobile service data packets and L main service data packets. In this case, the sum of M and L may be set to 38 according to one embodiment of the present invention. In addition, M may be zero '0' or a natural number of 38 or less.

One data group is transmitted during a single slot. In this case, the transmitted data group may include 118 mobile service data packets or (118+M) mobile service data packets.

That is, a data group may be defined as a set of data units including mobile service data present in one slot. In this case, the mobile service data may be defined as pure mobile service data, or may be defined as the concept that includes data for transmitting mobile service data, such as signaling data, known data, etc.

Figure 3:
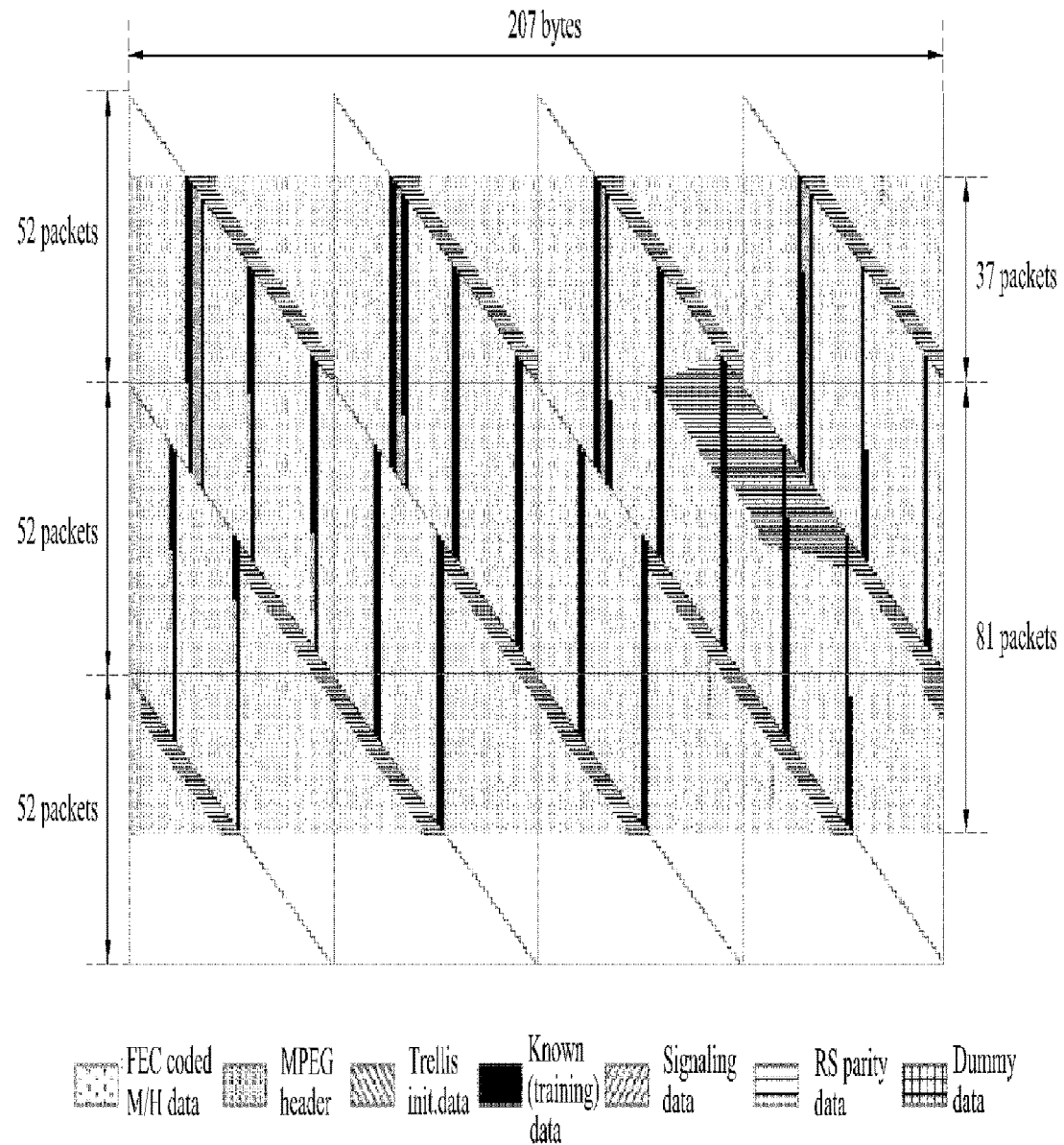
FIG. 3 illustrates a structure provided before a data group is interleaved, when the data group includes 118 mobile service data packets, according to an embodiment of the present invention.

FIG. 3 illustrates a structure acquired before a data group is interleaved, when the data group includes 118 mobile service data packets, according to an embodiment of the present invention.

Referring to FIG. 3, the data group includes 118 TS packets that include at least one of FEC-encoded mobile service data, MPEG header, trellis initialization data, known data, signaling data, RS parity data and dummy data. For convenience of description and better understanding of the present invention, a TS packet contained in the data group is defined as a mobile service data packet according to the present invention.

The data group shown in FIG. 3 includes 118 mobile service data packets, such that it can be recognized that the slot via which the above-mentioned data group is transmitted is used for transmitting 38 main service data packets.

Figure 4:
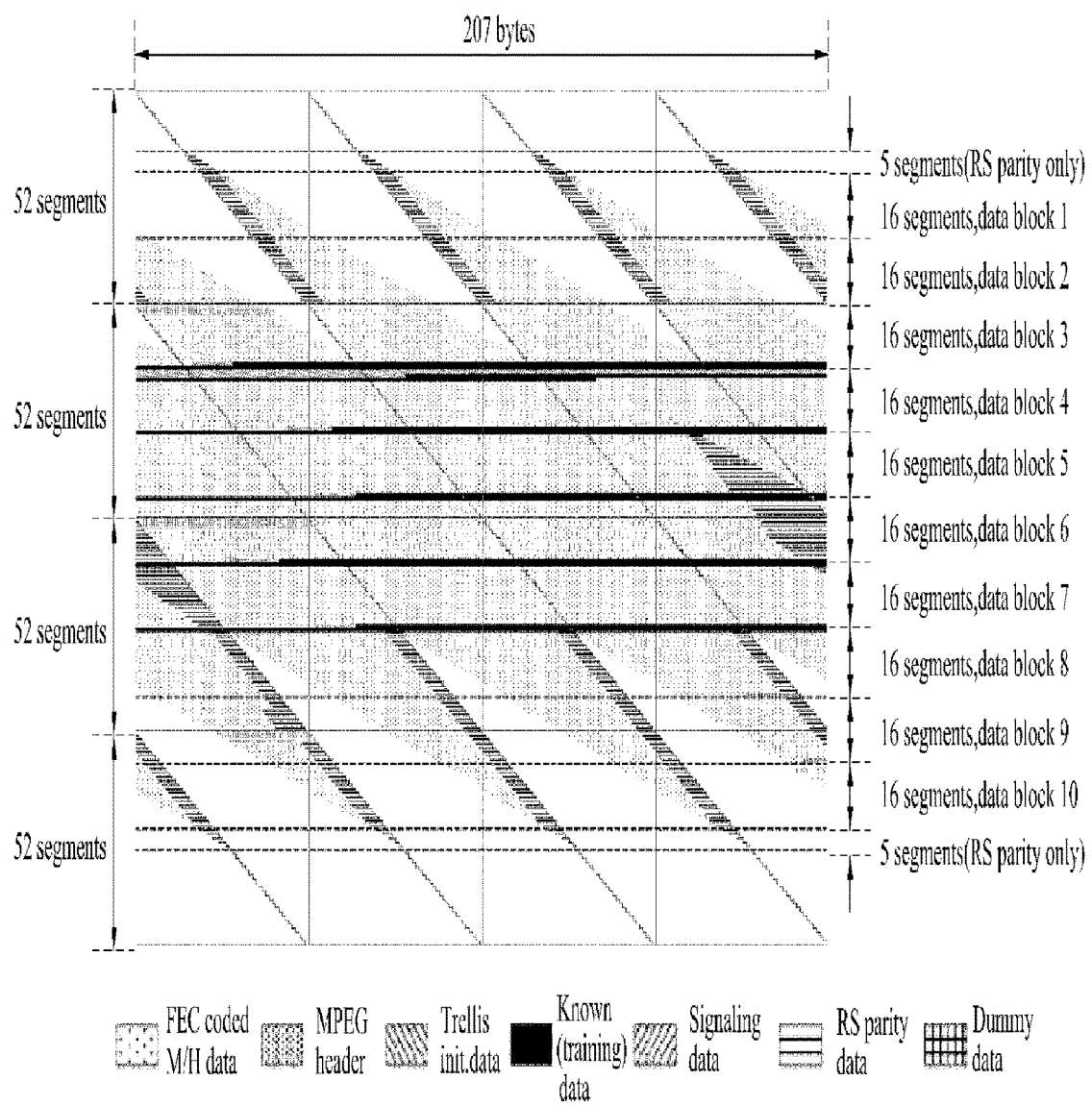
FIG. 4 illustrates a structure provided after a data group is interleaved, when the data group includes 118 mobile service data packets, according to an embodiment of the present invention.

FIG. 4 illustrates a structure acquired after a data group is interleaved, when the data group includes 118 mobile service data packets, according to an embodiment of the present invention.

Referring to FIG. 4, the data group including 118 mobile service data packets is interleaved such that a data group including 170 segments is formed.

In this case, the above-mentioned example in which 118 mobile service data packets are distributed to 170 segments has been disclosed only for illustrative purposes and better understanding of the present invention. The number of data segments formed after the data group is interleaved may be changed to another according to the degree of interleaving.

FIG. 4 shows an example of dividing a data group prior to being data-interleaved into 10 DATA blocks (i.e., DATA block 1 (B1) to DATA block 10 (B10)). In other word, DATA Block can be defined as a transmission block containing mobile service data or main and mobile service data in segment level. In this example, each DATA block has the length of 16 segments. Referring to FIG. 4, only the RS parity data are allocated to a portion of 5 segments before the DATA block 1 (B1) and 5 segments behind the DATA block 10 (B10). The RS parity data are excluded in regions A to D of the data group.

More specifically, when it is assumed that one data group is divided into regions A, B, C, and D, each DATA block may be included in any one of region A to region D depending upon the characteristic of each DATA block within the data group. At this point, according to an embodiment of the present invention, each DATA block may be included in any one of region A to region D based upon an interference level of main service data.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 4, DATA block 4 (B4) to DATA block 7 (B7) correspond to regions without interference of the main service data. DATA block 4 (B4) to DATA block 7 (B7) within the data group shown in FIG. 4 correspond to a region where no interference from the main service data occurs. In this example, a long known data sequence is inserted at both the beginning and end of each DATA block. In the description of the present invention, the region including DATA block 4 (B4) to DATA block 7 (B7) will be referred to as "region A (=B4+B5+B6+B7)". As described above, when the data group includes region A having a long known data sequence inserted at both the beginning and end of each DATA block, the receiving system is capable of performing equalization by using the channel information that can be obtained from the known data. Therefore, the strongest equalizing performance may be yielded (or obtained) from one of region A to region D.

In the example of the data group shown in FIG. 4, DATA block 3 (B3) and DATA block 8 (B8) correspond to a region having little interference from the main service data. Herein, a long known data sequence is inserted in only one side of each DATA block B3 and B8. More specifically, due to the interference from the main service data, a long known data sequence is inserted at the end of DATA block 3 (B3), and another long known data sequence is inserted at the beginning of DATA block 8 (B8). In the present invention, the region including DATA block 3 (B3) and DATA block 8 (B8) will be referred to as "region B (=B3+B8)". As described above, when the data group includes region B having a long known data sequence inserted at only one side (beginning or end) of each DATA block, the receiving system is capable of performing equalization by using the channel information that can be obtained from the known data. Therefore, a stronger equalizing performance as compared to region C/D may be yielded (or obtained).

Referring to FIG. 4, DATA block 2 (B2) and DATA block 9 (B9) correspond to a region having more interference from the main service data as compared to region B. A long known data sequence cannot be inserted in any side of DATA block 2 (B2) and DATA block 9 (B9). Herein, the region including DATA block 2 (B2) and DATA block 9 (B9) will be referred to as "region C (=B2+B9)".

Finally, in the example shown in FIG. 4, DATA block 1 (B1) and DATA block 10 (B10) correspond to a region having more interference from the main service data as compared to region C. Similarly, a long known data sequence cannot be inserted in any side of DATA block 1 (B1) and DATA block 10 (B10).

Referring to FIG. 4, it can be readily recognized that the regions A and B of the data group includes signaling data used for signaling at a reception end.

Figure 5:
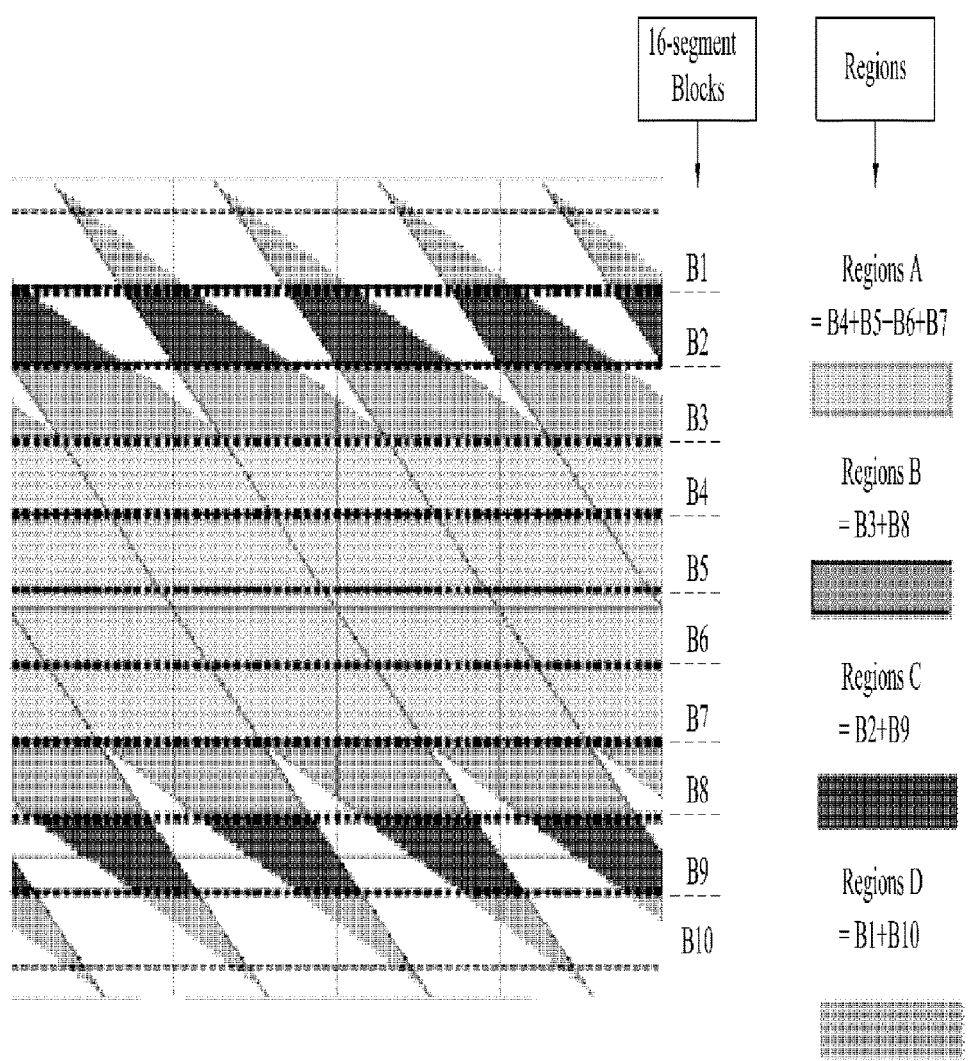
FIG. 5 illustrates regions of a data group including 118 mobile service data packets according to an embodiment of the present invention.

FIG. 5 illustrates regions of a data group including 118 mobile service data packets according to an embodiment of the present invention.

FIG. 5 is shown for better understanding of individual regions of the data group shown in FIG. 4.

As can be seen from FIG. 5, the data group including 118 mobile service data packets can be divided into four regions A, B, C and D. The A region is located at the center of the data group, and the B region is located at the exterior of the A region using the A region as a reference line. The C region is located at the exterior of the B region on the basis of the A and B regions. The D region is located at the exterior of the C area on the basis of the A, B, and C regions.

Figure 6:
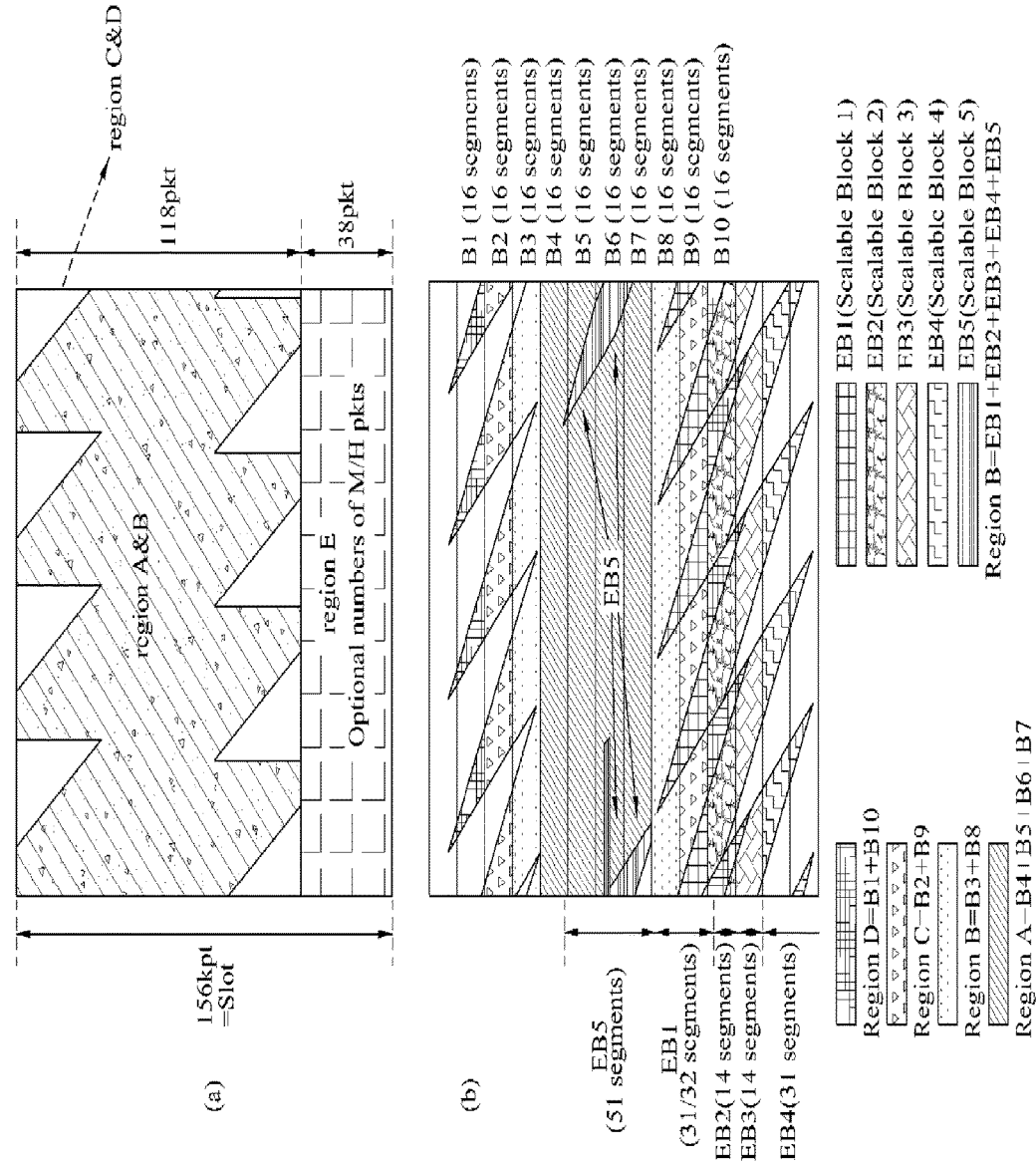
FIG. 6 illustrates a data group including (118+M) mobile service data packets according to an embodiment of the present invention.

FIG. 6 illustrates a data group including (118+M) mobile service data packets according to an embodiment of the present invention.

Referring to FIG. 6(a), the data group includes A, B, C, D and E regions. The data group is contained in a slot including 156 packets. That is, a predetermined number of packets contained in one slot form the data group, and such packets include mobile service data.

After 118 mobile service data packets fixed in the data group are interleaved, the data group is divided into A, B, C and D regions as shown in FIG. 4.

Meanwhile, a variable number (M) of mobile service data packets capable of being contained in the data group are contained in an additional region E. In the case where the data group in one slot is composed of 118 mobile service data packets, the E region can be defined as a specific region acquired when mobile service data packets are added to the region composed of only main service data packets. In other words, the E region may include a scalable number of mobile service data packets in one slot.

The mapping format of the mobile service data packets in the E region may be changed according to the intention of a designer. In other words, according to one embodiment of the present invention, when the number of mobile service data packets is 38 or less (i.e., M<38) as shown in FIG. 6(a), a specific packet region in one slot remains empty in such a manner that the empty specific packet region can be used as a main service data packet region, and therefore mobile service data packets can be mapped to the remaining parts. According to another embodiment of the present invention, mobile service data packets can be mapped to the data group in such a manner that M scalable mobile service data packets contained in the E region are spaced apart from one another at intervals of a predetermined distance.

FIG. 6(b) illustrates a structure acquired after the data group including the E region as shown in FIG. 6(a) is interleaved.

Referring to FIG. 6(b), 10 blocks (B1~B10) contained in the data group form A, B, C and D regions using the same pattern as in the data group shown in FIG. 5. However, the E region including M scalable mobile service data packets is formed as an additional block.

As can be seen from FIG. 6(b), the E region belonging to the data group may be contained in a plurality of blocks, and respective blocks may correspond to a scalable number of VSB segments. Mobile service data additionally transmitted through the E region is distributed to 4 or 5 blocks.

Meanwhile, in the case where the data group does not include main service data, the E region includes a block which includes an area of a place-holder that includes not only an RS parity but also an MPEG header for backward compatibility with a conventional digital broadcast system. In other words, in the case where the data group does not include main service data, the RS parity and the MPEG header for backward compatibility need not be used, such that an area reserved for the RS parity and the MPEG header is allocated to an area for mobile service data and forms a block contained in the E region.

Although 5 blocks are contained in the E region as shown in FIG. 6(b), the scope or spirit of the present invention is not limited only thereto. That is, the number of segments contained in each block of the E region may be scalable, such that the number of blocks contained in the E regions may also be scalable.

In the meantime, according to the present invention, the E region contained in the data group is determined by M scalable mobile service data packets, such that an appropriate number of mobile service data packets can be transmitted according to an amount of mobile service data to be transmitted, resulting in an increased transmission efficiency.

In addition, additional mobile service data packets are transmitted through the E regain of the data group, such that the demand of a user who desires to use a high-quality mobile service that requires a large amount of data can be satisfied.

FIG. 7 illustrates a table that includes classification of regions contained in a data group depending on a parade type, transmission regions of respective ensembles, compatibility, the number of mobile service data contained in one slot, etc. according to an embodiment of the present invention.

For convenience of description and better understanding of the present invention, specific information indicating the number of mobile service data packets contained in one slot is defined as a scalable mode. Since a data group including mobile service data is transmitted during one slot, the scalable mode may represent information indicating the number of mobile service data packets belonging to the data group. In other words, in the case where the data group contained in one slot includes (118+M) mobile service data packets and L main service data packets (where L is the number of remaining packets), it may be considered that the scalable mode includes M or L number of information. In other words, the scalable mode may represent specific information indicating at least one of M number of information and '156−(118+M)' number of information (hereinafter '156−(118+M)' is referred to as 'L').

In accordance with one embodiment of the present invention, M may be equal to or higher than '0', or may be an integer of 38 or less. For example, M may be set to 11, 20, 29 or 38.

Meanwhile, in this embodiment, a collection of services is defined by concept of ensemble. One ensemble has the same QoS, and is coded with the same FEC code. Also, the ensemble has unique identifier (i.e., ensemble id), and is a collection of consecutive RS frames having the same FEC code. In other words, a set of RS frames logically forms an Ensemble.

Meanwhile, according to one embodiment of the present invention, an RS frame is defined as a two-dimensional data frame. Mobile service data is transmitted through the RS frame.

Referring to FIG. 7, in the processing and transmitting scheme for transmitting a digital broadcast signal according to one embodiment of the present invention, a scalable mode for use in the first type represents that M is set to '0'. In other words, the scalable mode represents that the number of mobile service data packets contained in the data group is 118. One ensemble can be transmitted through A, B, C and D regions. In this case, a single ensemble is defined as a primary ensemble.

In the case of a second type, a scalable mode represents that M is set to '0' in the same manner as in the first type. However, two ensembles are transmitted through the A, B, C and D regions. At this time, the ensemble transmitted through the A and B regions is referred to as a primary ensemble, and the ensemble transmitted through the C and D regions is referred to as a secondary ensemble. The primary ensemble and the secondary ensemble have different quality of services (QoSs) and different FEC codes, such that the embodiment of the present invention assumes that the primary ensemble and the secondary ensemble transmit different usages of mobile service data.

In the case of a third type, a scalable mode represents that M is not set to '0'. That is, the third type represents that not only 118 mobile service data packets but also additional mobile service data packets are contained in the data group. Although the embodiment of the present invention assumes that M is set to 30, the scope or spirit of the present invention is not limited only thereto because M is a scalable number of 38 or less. In accordance with the embodiment of the present invention, the primary ensemble is transmitted through the A, B, C and D regions, and the secondary ensemble is transmitted through the E region added to the data group in response to a value of M.

In the case of a fourth type, a scalable mode is identical to that of the third type. However, the primary ensemble is transmitted through the A and B regions, and the secondary ensemble is transmitted through the C, D and E regions. At this time, while the A and B regions maintain the compatibility with a current digital mobile broadcast system, the C, D and E regions support additional payload for mobile service data.

In the case of a fifth type, a scalable mode is identical to those of third and fourth types. However, the primary ensemble is transmitted through all of the A, B, C, D and E regions.

In the case of a sixth type, a scalable mode represents that M is set to 38. That is, the data group including 156 mobile service data packets in one slot is transmitted. The primary ensemble is transmitted through the A, B, C and D regions, and the secondary ensemble is transmitted through the E region.

In the case of a seventh type, a scalable mode is identical to that of the sixth type. However, the primary ensemble is transmitted through the A and B regions, and the secondary ensembles are transmitted through the C, D and E regions. Therefore, while the A and B regions maintain the compatibility with a current digital mobile broadcast system, the C, D and E regions support additional payload for mobile service data.

In the case of an eighth type, a scalable mode is identical to those of the sixth and seventh types. However, the primary ensemble is transmitted through all of the A, B, C, D and E regions.

In accordance with one embodiment of the present invention, the region via which the primary ensemble and the secondary ensemble are transmitted is defined as an RS frame mode, can be identified at the reception end. That is, the RS frame mode may be defined as specific information that indicates either a first case in which the primary ensemble is transmitted through the A and B regions and the secondary ensemble is transmitted through the C, D and E regions, or a second case in which the primary ensemble is transmitted through the A, B, C, D and E regions.

In accordance with one embodiment of the present invention, in the case where the scalable mode represents that M is set to 38, or in the case where the number of mobile service data packets contained in the data group is 156, no main service data packets are contained in the slot. Therefore, the RS parity and the MPEG header for backward compatibility need not be inserted into the data group. In this case, mobile service data can be inserted into a reserved data area for both the RS parity and the MPEG header for backward compatibility. At this time, the digital broadcast transmitter can transmit much more mobile service data.

In accordance with still another embodiment of the present invention, the data groups respectively transmitted through 16 slots contained in one sub-frame may have different scalable modes. Hence, even when the scalable mode of the data group wherein a specific slot is contained in one sub-frame represents that M is set to 38, some scalable modes from among the data groups of the remaining slots represent that M is set to another value not '38'. In this case, the corresponding sub-frame includes main service data, such that each data group contained in the corresponding sub-frame should include the RS parity and the MPEG header. That is, in this case, it is impossible to insert mobile service data into a data area reserved for both the RS parity and the MPEG header for backward compatibility. However, it is possible to maintain the compatibility with a conventional digital broadcast system.

FIG. 8 illustrates a structure provided before a data group is interleaved, when the data group includes (118+M) mobile service data packets, according to an embodiment of the present invention.

Referring to FIG. 8, the data group includes mobile service data of the A and B regions, mobile service data of the C and D regions, mobile service data of the E region, an MPEG header, trellis initialization data, known data, signaling data, RS parity data, and dummy data.

Referring to the data group of FIG. 8, M is denoted by an integer of '0<M<38'. In other words, the number of mobile service data packets contained in the data group is higher than 118 and is lower than 156. Although FIG. 8 illustrates that M is set to 30 as an example, M is not limited only thereto and may also be set to another value as necessary.

Referring to FIG. 8, a TS packet region not allocated to a mobile service data packet from among 156 TS packets belonging to one slot is reserved for main service data.

Figure 9:
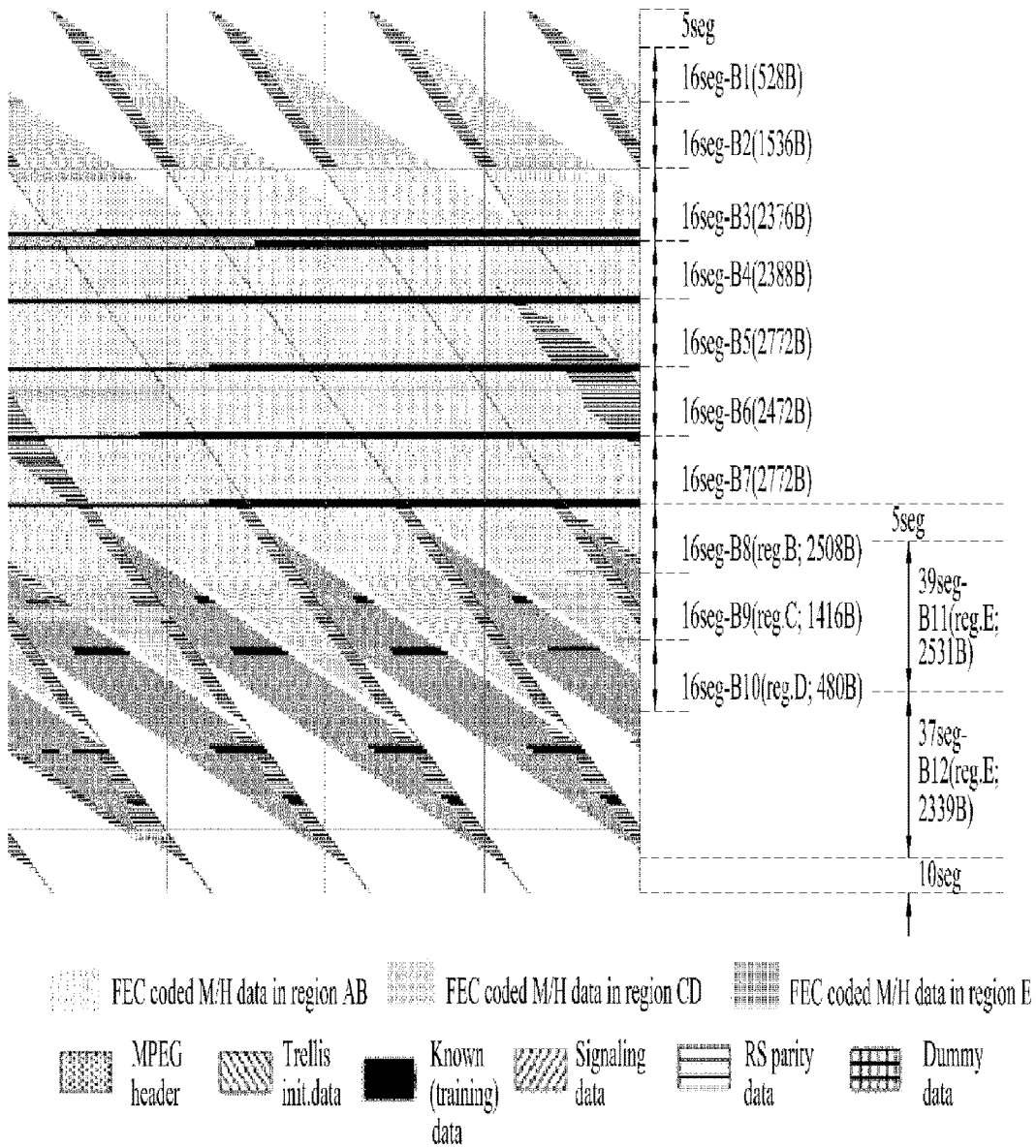
FIG. 9 illustrates a structure provided after a data group is interleaved, when the data group includes (118+M) mobile service data packets, according to an embodiment of the present invention.

FIG. 9 illustrates a structure provided after a data group is interleaved, when the data group includes (118+M) mobile service data packets, according to an embodiment of the present invention.

The structure shown in FIG. 9 is identical to a structure formed after the data group of FIG. 8 is interleaved.

As can be seen from the data group shown in FIG. 9, the primary ensemble is transmitted through the A, B, C and D regions of the data group, and the secondary ensemble is transmitted through the E region of the data group. The mobile service data of the A, B, C and D regions maintain the compatibility with a conventional digital mobile broadcast system.

Although the data group of FIG. 9 is divided into 10 blocks belonging to the A, B, C and D regions and two additional blocks belonging to the E region, the number of blocks belonging to the E block is not limited only to '2' and may be changed to another number not '2' according to the intention of a designer.

As shown in FIG. 9, known data is inserted into the E region, such that the reception performance of the reception end is increased in the E region.

In this case, the term "known data" means specific data pre-engaged between the transmission end and the reception end. The transmission end transmits the pre-engaged data as known data to the reception end. Signal distortion may occur in data transmission. In this case, the reception end may perform channel equalization and the like by referring to the degree of distortion of known data transmitted from the transmission end. In other words, the known data is adapted to increase the reception performance of a broadcast signal at the reception end.

FIG. 10 illustrates a structure provided before a data group is interleaved, when the data group includes (118+M) mobile service data packets, according to an embodiment of the present invention.

Referring to FIG. 10, the data group includes mobile service data of the A and B regions, mobile service data of the C and D regions, mobile service data of the E region, an MPEG header, trellis initialization data, known data, signaling data, RS parity data, and dummy data.

Referring to the data group of FIG. 10, M is denoted by an integer of '0<M<38'. In other words, the number of mobile service data packets contained in the data group is higher than 118 and is lower than 156. Although FIG. 10 illustrates that M is set to 30 as an example, M is not limited only thereto and may also be set to another value as necessary.

Figure 11:
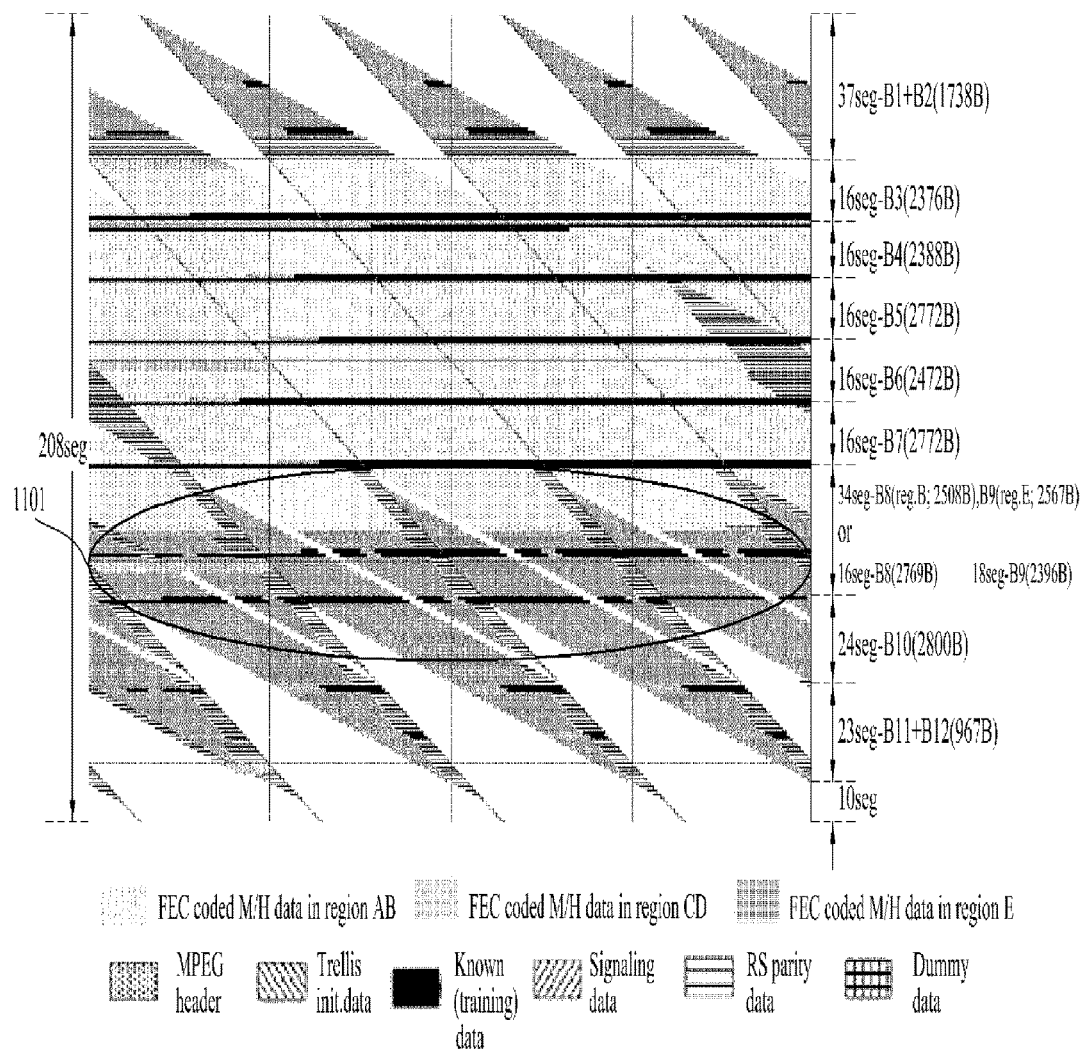
FIG. 11 illustrates a structure provided after a data group is interleaved, when the data group includes (118+M) mobile service data packets, according to an embodiment of the present invention.

FIG. 11 illustrates a structure provided after a data group is interleaved, when the data group includes (118+K) mobile service data packets, according to an embodiment of the present invention.

The structure shown in FIG. 11 is identical to a structure formed after the data group of FIG. 10 is interleaved.

As can be seen from the data group shown in FIG. 11, the primary ensemble is transmitted through the A and B regions of the data group, and the secondary ensemble is transmitted through the C, D and E regions of the data group. The mobile service data of the A and B regions maintain the compatibility with a conventional digital mobile broadcast system.

In addition, the primary ensemble may also be transmitted through all of the A, B, C, D and E regions.

Although the data group of FIG. 11 is divided into 10 blocks belonging to the A, B, C and D regions and two additional blocks belonging to the E region, the number of blocks belonging to the E block is not limited only to '2' and may be changed to another number not '2' according to the intention of a designer.

Referring to FIG. 11, known data 1101 is additionally inserted into the C and D regions in addition to the A and B regions. Differently from the data group shown in FIG. 4 or FIG. 9, additional known data is inserted into the C and D regions, such that the reception performance of mobile service data transmitted through the C and D regions can be increased.

Figure 12:
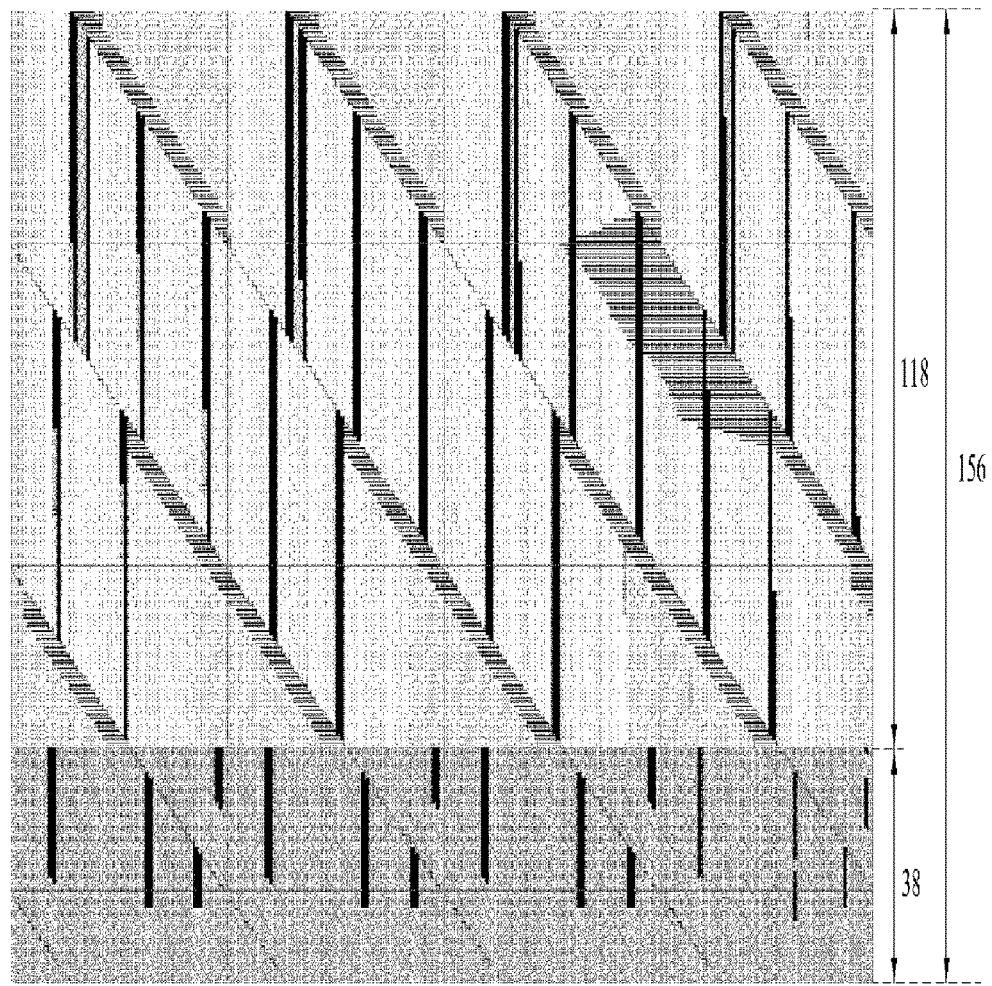
FIG. 12 illustrates a structure provided before a data group is interleaved, when the data group includes (118+38) mobile service data packets, according to an embodiment of the present invention.

FIG. 12 illustrates a structure provided before a data group is interleaved, when the data group includes (118+38) mobile service data packets, according to an embodiment of the present invention.

Referring to FIG. 12, the data group includes mobile service data of the A and B regions, mobile service data of the C and D regions, mobile service data of the E region, an MPEG header, trellis initialization data, known data, signaling data, RS parity data, and dummy data.

As shown in FIG. 12, the E region has no main service data packets, such that the region for the RS parity and the MPEG header is not present in the E region. Therefore, the above-mentioned regions may be adapted to transmit mobile service data, such that much more mobile service data can be transmitted.

Figure 13:
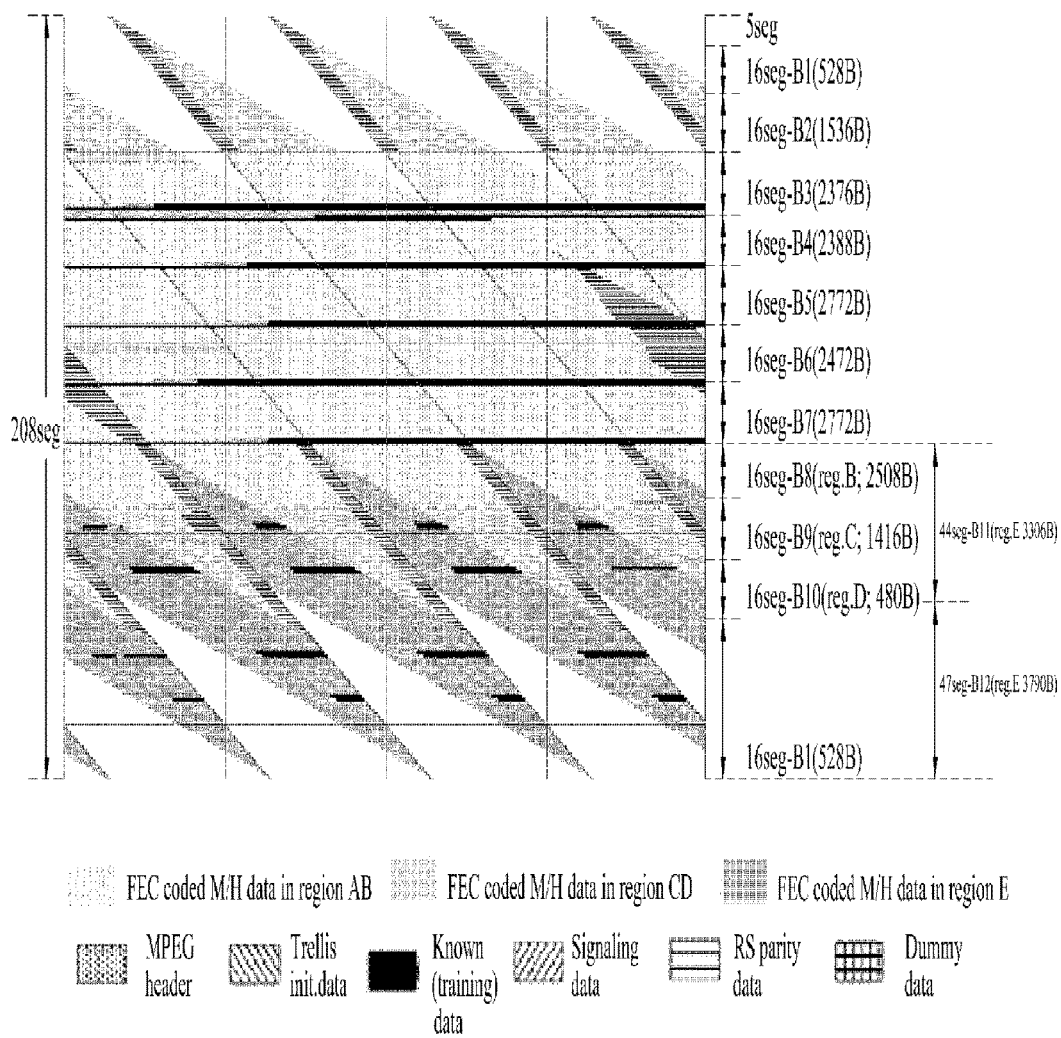
FIG. 13 illustrates a structure provided after a data group is interleaved when the data group includes (118+38) mobile service data packets according to an embodiment of the present invention.

FIG. 13 illustrates a structure provided after a data group is interleaved when the data group includes (118+38) mobile service data packets according to an embodiment of the present invention.

The structure shown in FIG. 13 is identical to a structure formed after the data group of FIG. 12 is interleaved.

As can be seen from the data group shown in FIG. 13, the primary ensemble is transmitted through the A, B, C and D regions of the data group, and the secondary ensemble is transmitted through the E region of the data group. Since the A, B, C and D regions are identical to those of a conventional data group, they can maintain the compatibility with a conventional digital mobile broadcast system. In addition, additional mobile service data can be transmitted through the E region.

Although the data group of FIG. 13 is divided into 10 blocks belonging to the A, B, C and D regions and two additional blocks belonging to the E region, the number of blocks belonging to the E block is not limited only to '2' and may be changed to another number not '2' according to the intention of a designer.

Referring to FIG. 13, known data is inserted into the E region. Therefore, the reception performance of the reception end is increased in the E region. As described above, mobile service data is inserted into the reserved area for both the RS parity and the MPEG header present in the E region, such that much more mobile service data can be transmitted.

Figure 14:
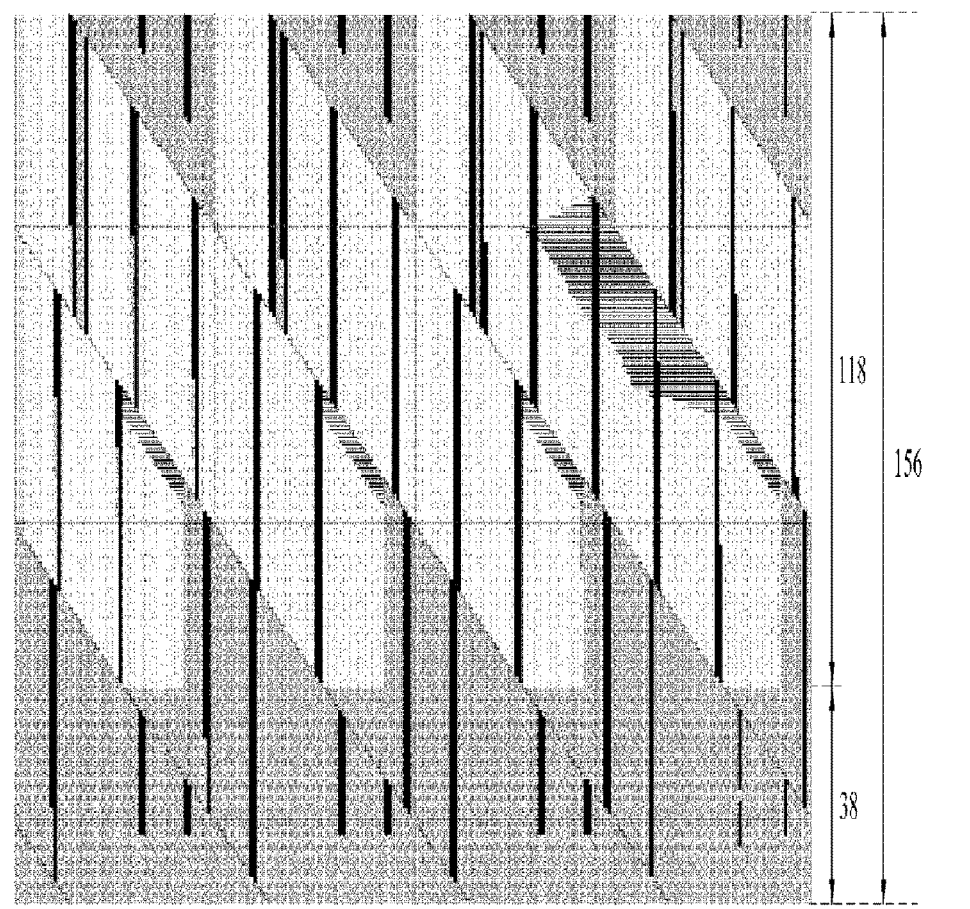
FIG. 14 illustrates a structure provided before a data group is interleaved, when the data group includes (118+38) mobile service data packets, according to an embodiment of the present invention.

FIG. 14 illustrates a structure provided before a data group is interleaved, when the data group includes (118+38) mobile service data packets, according to an embodiment of the present invention.

Referring to FIG. 14, the data group includes mobile service data of the A and B regions, mobile service data of the C and D regions, mobile service data of the E region, an MPEG header, trellis initialization data, known data, signaling data, RS parity data, and dummy data.

As shown in FIG. 14, the C, D and E regions do not include main service data packets and the region for an RS parity and an MPEG header. Therefore, the above-mentioned regions may be adapted to transmit mobile service data, such that much more mobile service data can be transmitted.

Figure 15:
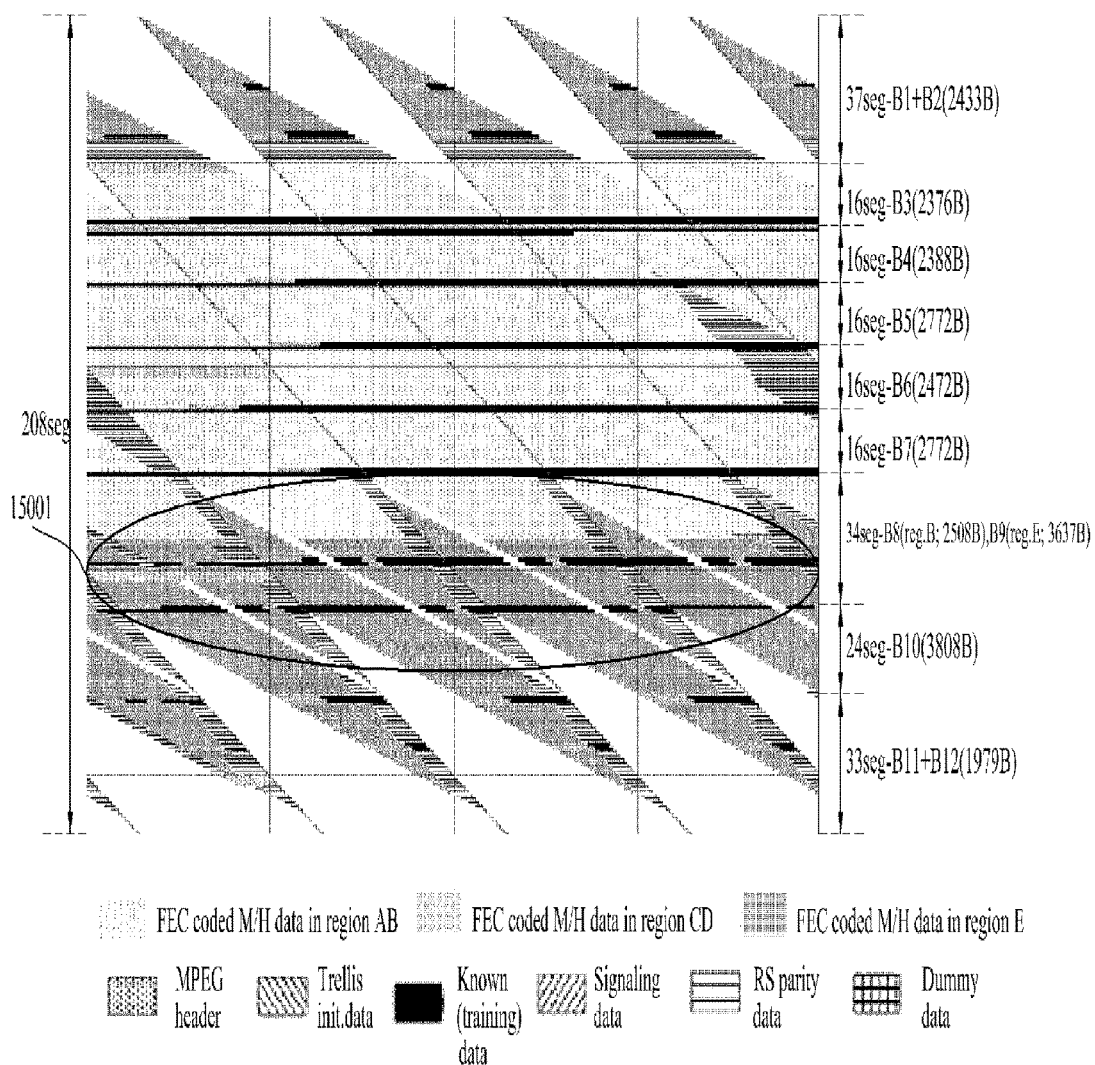
FIG. 15 illustrates a structure provided after a data group is interleaved, when the data group includes (118+38) mobile service data packets, according to an embodiment of the present invention.

FIG. 15 illustrates a structure provided after a data group is interleaved, when the data group includes (118+38) mobile service data packets, according to an embodiment of the present invention.

The structure shown in FIG. 15 is identical to a structure formed after the data group of FIG. 14 is interleaved.

As can be seen from the data group shown in FIG. 15, the primary ensemble is transmitted through the A and B regions of the data group, and the secondary ensemble is transmitted through the C, D and E region of the data group. Since the A and B regions include the RS parity and the MPEG header, they can maintain the compatibility with a conventional digital mobile broadcast system.

Although the data group of FIG. 15 is divided into 10 blocks belonging to the A, B, C and D regions and two additional blocks belonging to the E region, the number of blocks belonging to the E block is not limited only to '2' and may be changed to another number not '2' according to the intention of a designer.

Referring to FIG. 15, additional known data 15001 is inserted into the C and D regions in addition to the A and B regions. The data group shown in FIG. 15 is not affected by main service data, such that successive known data sequences can be contained in the C and D regions differently from the data group shown in FIG. 11. Therefore, the reception performance of mobile service data transmitted through the C and D regions at the reception end can be greatly increased.

In accordance with the present invention, the number of known data sequences inserted into the C and D regions is not limited only to a specific number. Therefore, according to the intention of a designer, a proper number of known data sequences required for enhancing the reception performance of the reception end can be inserted. In accordance with one embodiment of the present invention, 3 known data sequences are inserted into the C region, and 2 known data sequences are inserted into the D region.

In addition, as described above, mobile service data is inserted into an area reserved for the RS parity and the MPEG header in the C, D and E regions, such that much more mobile service data can be transmitted.

Figure 16:
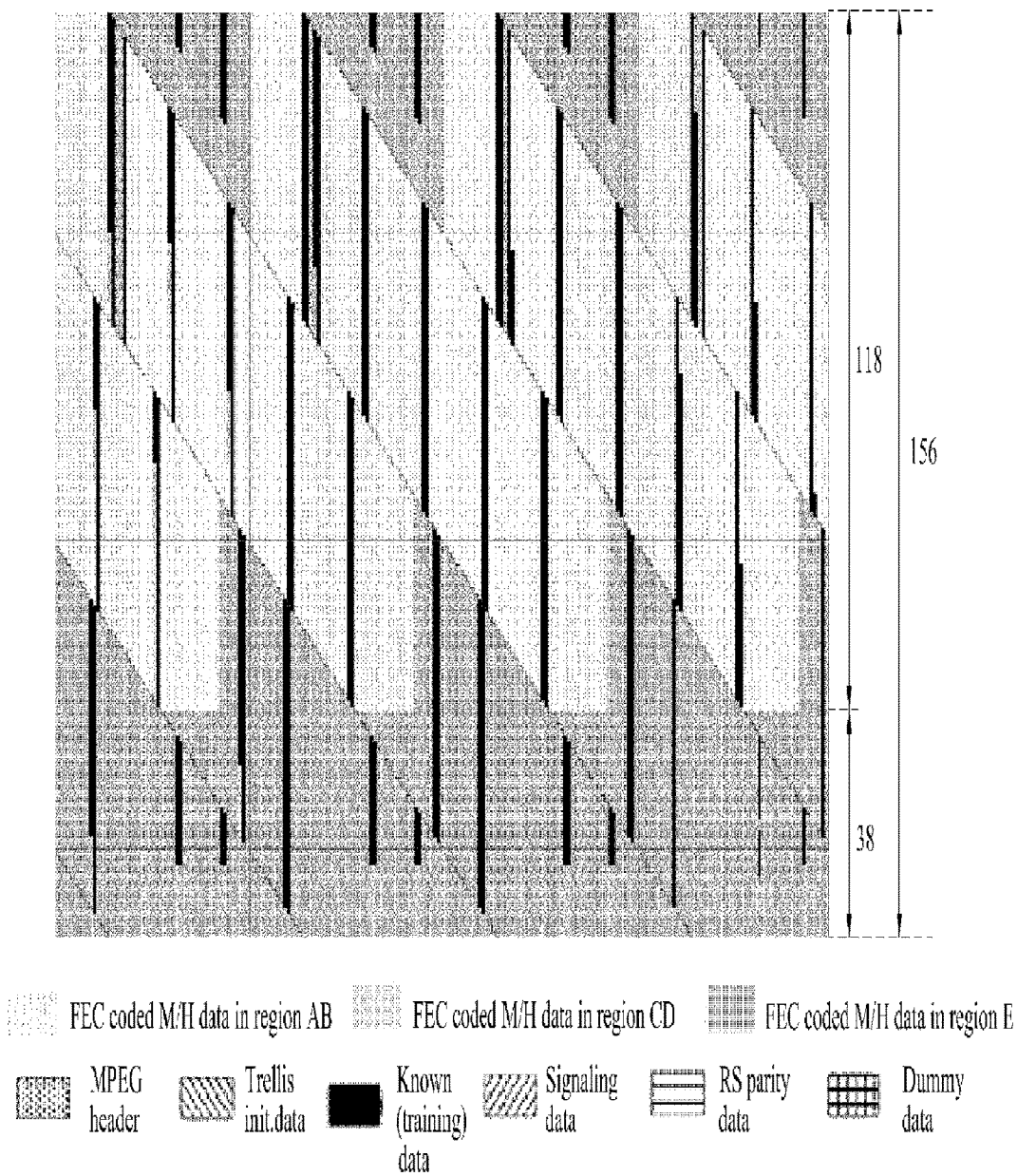
FIG. 16 illustrates a structure provided before a data group is interleaved, when the data group includes (118+38) mobile service data packets, according to an embodiment of the present invention.

FIG. 16 illustrates a structure provided before a data group is interleaved, when the data group includes (118+38) mobile service data packets, according to an embodiment of the present invention.

As for the data group shown in FIG. 16, on the condition that 16 slots contained in one sub-frame transmit a data group including 156 mobile service data packets, the data group of FIG. 16 may represent any one of data group types.

The data group shown in FIG. 16 includes mobile service data of the A and B regions, mobile service data of the C and D regions, mobile service data of the E region, trellis initialization data, known data, signaling data, and dummy data. That is, the data group of FIG. 16 does not include the RS parity and the MPEG header for backward compatibility.

As shown in FIG. 16, the A, B, C, D and E regions do not include the region for the RS parity and the MPEG header. Therefore, the above-mentioned regions can be used to transmit mobile service data, such that much more mobile service data can be transmitted.

Figure 17:
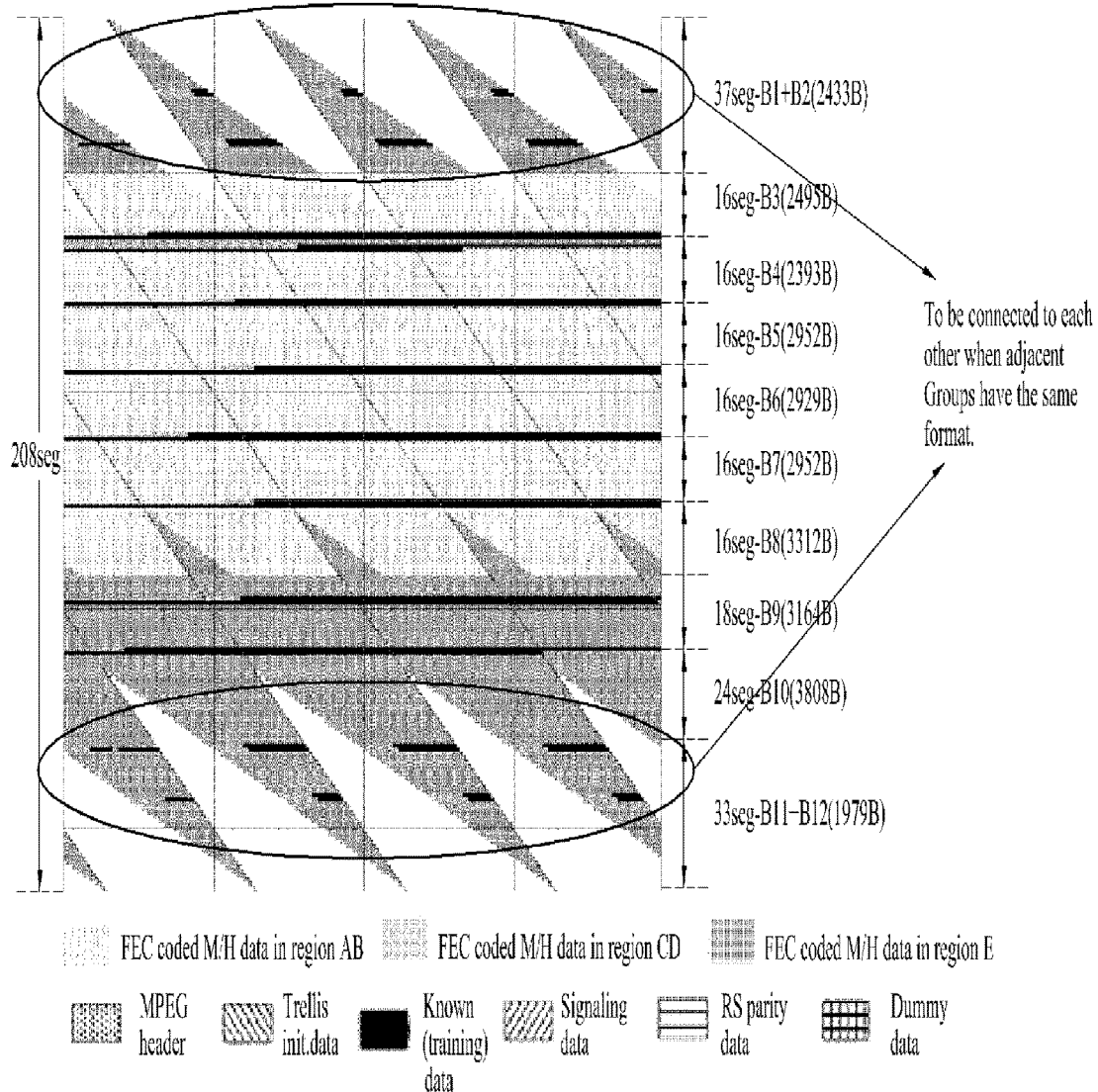
FIG. 17 illustrates a structure provided after a data group is interleaved, when the data group includes (118+38) mobile service data packets, according to an embodiment of the present invention.

FIG. 17 illustrates a structure provided after a data group is interleaved, when the data group includes (118+38) mobile service data packets, according to an embodiment of the present invention.

The structure shown in FIG. 17 is identical to a structure formed after the data group of FIG. 16 is interleaved.

Although the data group of FIG. 17 is divided into 10 blocks belonging to the A, B, C and D regions and two additional blocks belonging to the E region, the number of blocks belonging to the E block is not limited only to '2' and may be changed to another number not '2' according to the intention of a designer.

Referring to FIG. 17, additional known data is inserted into the C and D regions in addition to the A and B regions. The data group shown in FIG. 17 is not affected by main service data, such that successive known data sequences can be contained in the C and D regions differently from the data group shown in FIG. 11. Therefore, the reception performance of mobile service data transmitted through the C and D regions at the reception end can be greatly increased.

In addition, first known data present in the E region of the first data group may be connected to second known data present in the upper C and D regions of the second data group that is adjacent to the first data group. In this case, a known data sequence may be assigned to an overall area of the data group. As a result, the reception performance of mobile service data in the case of using the overall area of the group is higher than the reception performance of mobile service data in another case of using a conventional data group.

In accordance with another embodiment of the present invention, when known data of the first data group is connected to known data of the second group that is adjacent to the first data group, known data instead of trellis initialization data inserted in the front end of each known data may be additionally inserted. In this case, the trellis initialization data to be located at the front end of the connected known data sequence should be contained in the data group.

In addition, as shown in FIG. 17, in the A, B, C, D and E regions, mobile service data is inserted into the reserved area for the RS parity and the MPEG header, such that much more mobile service data can be transmitted within one data group.

FIG. 18 illustrates a syntax structure of a data field for signaling digital broadcast data according to an embodiment of the present invention.

For convenience of description and better understanding of the present invention, the above-mentioned data field will hereinafter be referred to as a Transmission Parameter Channel (TPC).

The TPC data may include a sub-frame_number field, a slot_number field, a parade_id field, a starting_group_number (SGN) field, a number_of_groups (NoG) field, a parade_repetition_cycle (PRC) field, an RS_frame_mode field, an RS_code_mode_primary field, an RS_code_mode_secondary field, an SCCC_block_mode field, an SCCC_outer_code_mode_A field, an SCCC_outer_code_mode_B field, an SCCC_outer_code_mode_C field, an SCCC_outer_code_ mode_D field, an FIC_version field, a parade_continuity_counter field, a TNoG field and a TPC_protocol_version field.

The Sub-Frame_number field shall be the current Sub-Frame number within the DATA Frame, which is transmitted for DATA Frame synchronization. Its value shall range from 0 to 4

The Slot_number field is the current Slot number within the Sub-Frame, which is transmitted for DATA Frame synchronization. Its value shall range from 0 to 15

The Parade_id field identifies the Parade to which this Group belongs. The value of this field may be any 7-bit value. Each Parade in a DATA transmission shall have a unique Parade_id. Communication of the Parade_id between the physical layer and the management layer shall be by means of an Ensemble_id formed by adding one bit to the left of the Parade_id. If the Ensemble_id is for the primary Ensemble delivered through this Parade, the added MSB shall be '0'. Otherwise, if it is for the secondary Ensemble, the added MSB shall be '1'.

The starting_Group_number (SGN) field shall be the first Slot_number for a Parade to which this Group belongs.

The number_of_Groups (NoG) field shall be the number of Groups in a Sub-Frame assigned to the Parade to which this Group belongs, minus 1, e.g., NoG=0 implies that one Group is allocated to this Parade in a Sub-Frame The Parade_repetition_cycle (PRC) field shall be the cycle time over which the Parade is transmitted, minus 1, specified in units of DATA Frames.

The RS_Frame_mode field represents that one parade transmits one RS frame or two RS frames.

The RS_code_mode_primary field shall be the RS code mode for the primary RS frame.

The RS_code_mode_secondary field shall be the RS code mode for the secondary RS frame.

The SCCC_Block_mode field represents how DATA blocks within a data group are assigned to SCCC block.

The SCCC_outer_code_mode_A field corresponds to the SCCC outer code mode for Region A within a data group.

The SCCC_outer_code_mode_B field corresponds to the SCCC outer code mode for Region B within the data group.

The SCCC_outer_code_mode_C field corresponds be the SCCC outer code mode for Region C within the data group.

The SCCC_outer_code_mode_D field corresponds to the SCCC outer code mode for Region D within the data group.

The FIC_version field represents a version of FIC data.

The Parade_continuity_counter field counter may increase from 0 to 15 and then repeat its cycle. This counter shall increment by 1 every (PRC+1) DATA frames. For example, as shown in Table 12, PRC=011 (decimal 3) implies that Parade_continuity_counter increases every fourth DATA frame.

The TNoG field may be identical for all sub-frames in an DATA Frame.

The tpc_protocol_version field is a 5-bit unsigned integer field that represents the version of the structure of the TPC syntax.

TPC data according to the present invention may be extended such that it includes mobile service data of the E region. In this case, a version of the TPC syntax structure indicated by a 'tpc_protocol_version' field may be changed to another version.

TPC data is information for signaling. In the case where the E region is allocated to a transmission area of mobile service data in the data group, the TPC data may further include associated information indicating the above case. One embodiment of the present invention assumes that scalable mode information is contained in TPC data. That is, scalable information indicating an M value from among information of (118+M) mobile service data packets is contained in the TPC data, such that the reception end can receive information about the data group structure. For example, if the scalable mode is set to '000', M may be '11'. If the scalable mode is set to '001', M may be '20'. If the scalable mode is set to '010', M may be '29'. If the scalable mode is set to '011', M may be '38'. If the scalable mode is set to '111', M may be '38' in all data groups transmitted during 16 slot in a sub frame.

In accordance with still another embodiment of the present invention, scalable mode information contained in TPC data may be classified into scalable mode information of a current frame and scalable mode information of the next frame. That is, TPC data contained in the current frame provides the possibility of estimating data to be received in the reception end through the next frame's scalable mode information, such that the receiver acting as the reception end can stably receive data.

However, the information included in the TPC data presented herein is merely exemplary. And, since the adding or deleting of information included in the TPC may be easily adjusted and modified by one skilled in the art, the present invention will, therefore, not be limited to the examples set forth herein.

Figure 19:
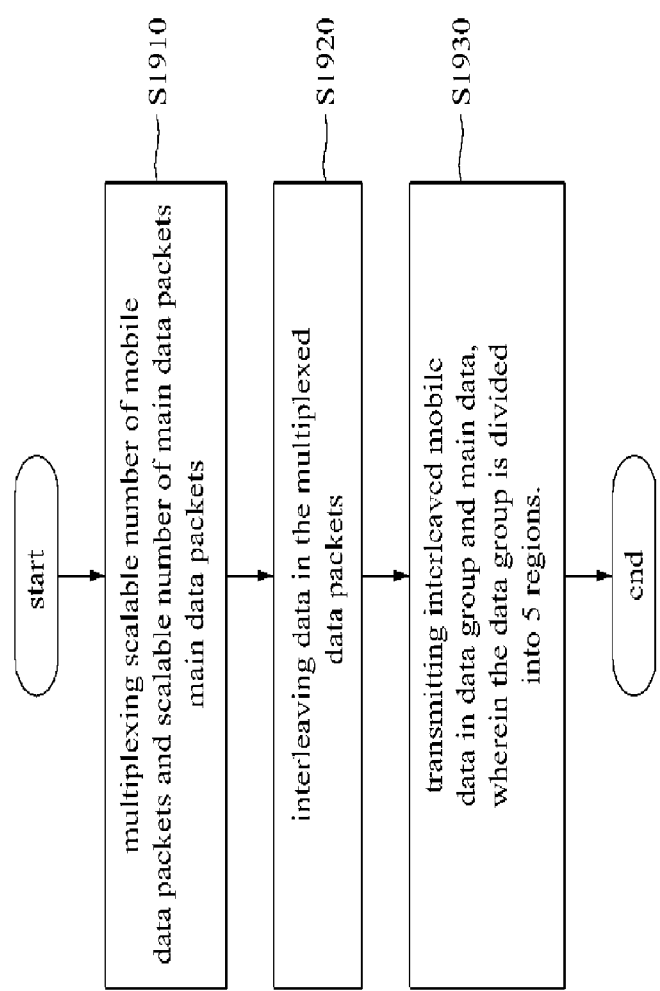
FIG. 19 is a flowchart illustrating a method for processing and transmitting digital broadcast data according to an embodiment of the present invention.

FIG. 19 is a flowchart illustrating a method for processing and transmitting digital broadcast data according to an embodiment of the present invention.

Referring to FIG. 19, a scalable number of mobile service data packets and a scalable number of main service data packets are multiplexed at step S1910. For example, mobile service data is contained in (118+M) number of data packets, and main service data is contained in '156–(118+M)' number of data packets, where M is 38 or less.

Data contained in the multiplexed data packets is interleaved at step S1920.

After the interleaving, a data group of up to 156 packets is dispersed through 208 data segments.

Interleaved main data and mobile service data contained belonging to one data group are transmitted in units of a slot at step S1930. In this case, mobile service data belonging to the transmitted data group is transmitted through each of 5 regions constructing the data group. In one embodiment, one data group may be divided into A, B, C, D and E regions. In this case, the E region may include a scalable number of mobile service data packets.

The transmitted data group may have any one of data groups shown in FIGS. 3, 4, and 8 to 17. In addition, although the transmitted data group is not perfectly identical to each of data groups shown in FIGS. 3, 4, and 8 to 17, it may also have a format of any data group having technical characteristics of the present invention.

In accordance with the transmission scheme, data transmitted through the A and B regions and the other data transmitted through the C, D and E regions may be encoded using different FEC codes, such that the two data may have different Quality of Services (QoSs). In addition, the FEC-coded data may also be transmitted through all of the A, B, C, D and E regions.

In accordance with the present invention, signaling bytes are inserted into the A and B regions.

In accordance with the present invention, a fixed number of known data sequences may be inserted into the A and B regions, and a plurality of known data may be inserted into the C, D, or E region according to a scalable mode.

Figure 20:
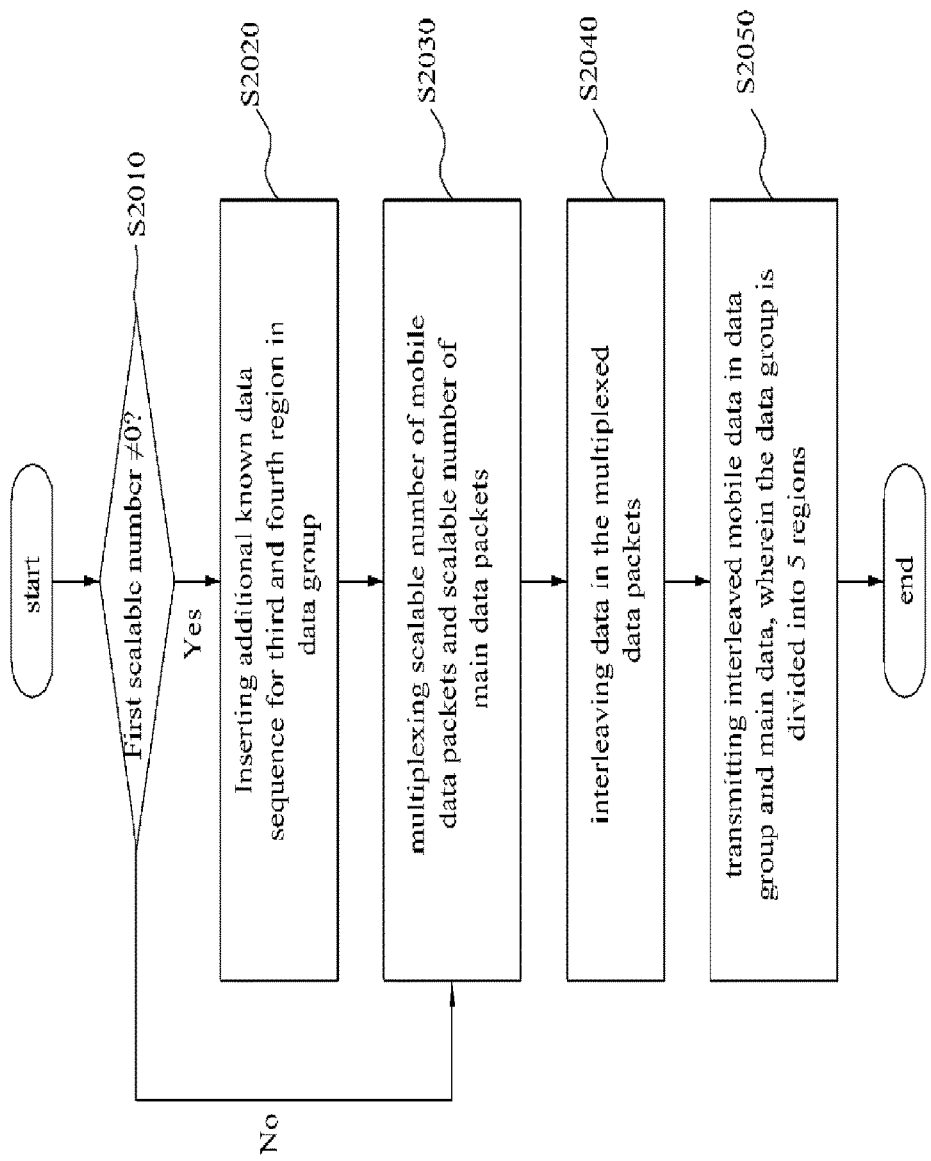
FIG. 20 is a flowchart illustrating a method for processing and transmitting digital broadcast data in such a manner that known data is inserted into regions C and D of a data group, when additional mobile service data is contained in the data group, according to an embodiment of the present invention.

FIG. 20 is a flowchart illustrating a method for processing and transmitting digital broadcast data in such a manner that known data is inserted into regions C and D of a data group, when additional mobile service data is contained in the data group, according to an embodiment of the present invention.

Provided that a fixed number of mobile service data packets (e.g., 118 mobile service data packets) and a scalable number of mobile service data packets (e.g., M mobile service data packets) are contained in a data group, if at least one of the scalable mobile service data packets is contained in the data packet, additional known data may be inserted into the C and D regions at steps S2010 and S2020.

The fixed and scalable number of mobile service data packets, each of which includes known data in the C and D regions, and the scalable number of main service data packets are multiplexed at step S2030.

Data contained in the multiplexed data packet is interleaved at step S2040.

Interleaved main data and mobile service data contained belonging to one data group are transmitted in units of a slot at step S2050. In this case, mobile service data belonging to the transmitted data group is transmitted through each of 5 regions constructing the data group. In one embodiment, one data group may be divided into A, B, C, D and E regions. In this case, the E region may include a scalable number of mobile service data packets. Known data is inserted into the C and D regions, such that the reception performance of mobile service data transmitted through the C and D regions can be increased.

Figure 21:
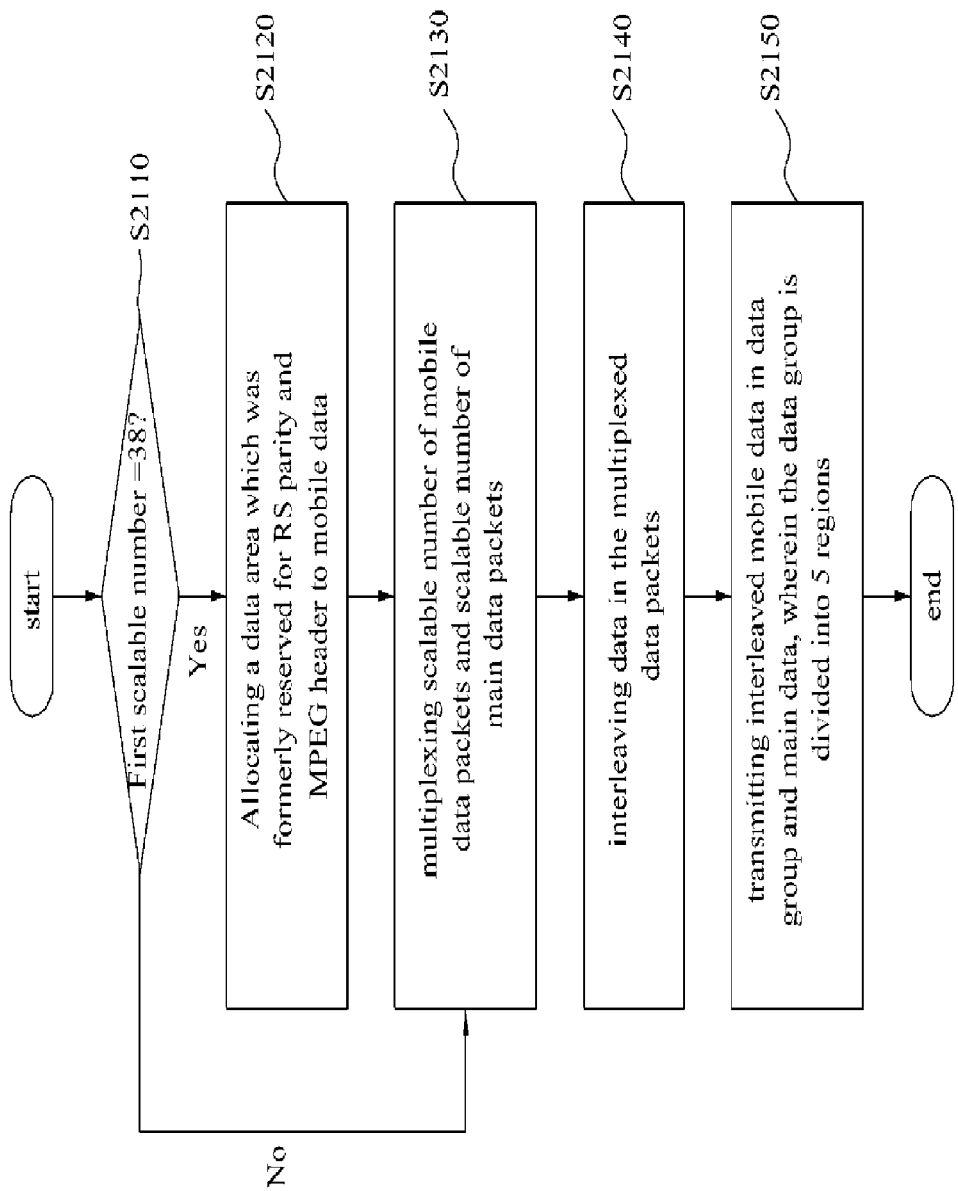
FIG. 21 is a flowchart illustrating a method for processing and transmitting digital broadcast data in such a manner that mobile service data is inserted into a data area for a Reed Solomon (RS) parity and a Moving Picture Experts Group (MPEG) header that are contained in a data group, when the data group includes 156 mobile service data packets, according to an embodiment of the present invention.

FIG. 21 is a flowchart illustrating a method for processing and transmitting digital broadcast data in such a manner that mobile service data is inserted into a data area for an RS parity and an MPEG header that are contained in a data group, when the data group includes 156 mobile service data packets, according to an embodiment of the present invention.

In the case where one slot is used for transmission of only mobile service data, no main service data is contained in this slot, such that the data group need not have an RS parity and an MPEG header for backward compatibility.

Therefore, it is determined whether the number of mobile service data packets contained in the data group is 156 (i.e., M=38) or not at step S2110.

Assuming that (118+38) mobile service data packets (i.e., 156 mobile service data packets) are contained in the data group, mobile service data is allocated to the data region reserved for the RS parity and the MPEG header that belong to the data group at step S2120.

The data area reserved for the RS parity and the MPEG header multiplexes mobile service data packets of the data group allocated for mobile service data at step S2130.

Data contained in the multiplexed data packets is interleaved at step S2140.

Interleaved main data and mobile service data contained belonging to one data group are transmitted in units of a slot at step S2150. In this case, mobile service data belonging to the transmitted data group is transmitted through each of 5 regions constructing the data group. In one embodiment, one data group may be divided into A, B, C, D and E regions. In this case, the E region may include a scalable number of mobile service data packets.

The data area reserved for the RS parity and the MPEG header is allocated to an area for mobile service data, such that much more mobile service data can be transmitted within one data group.

Receiving System

Figure 22:
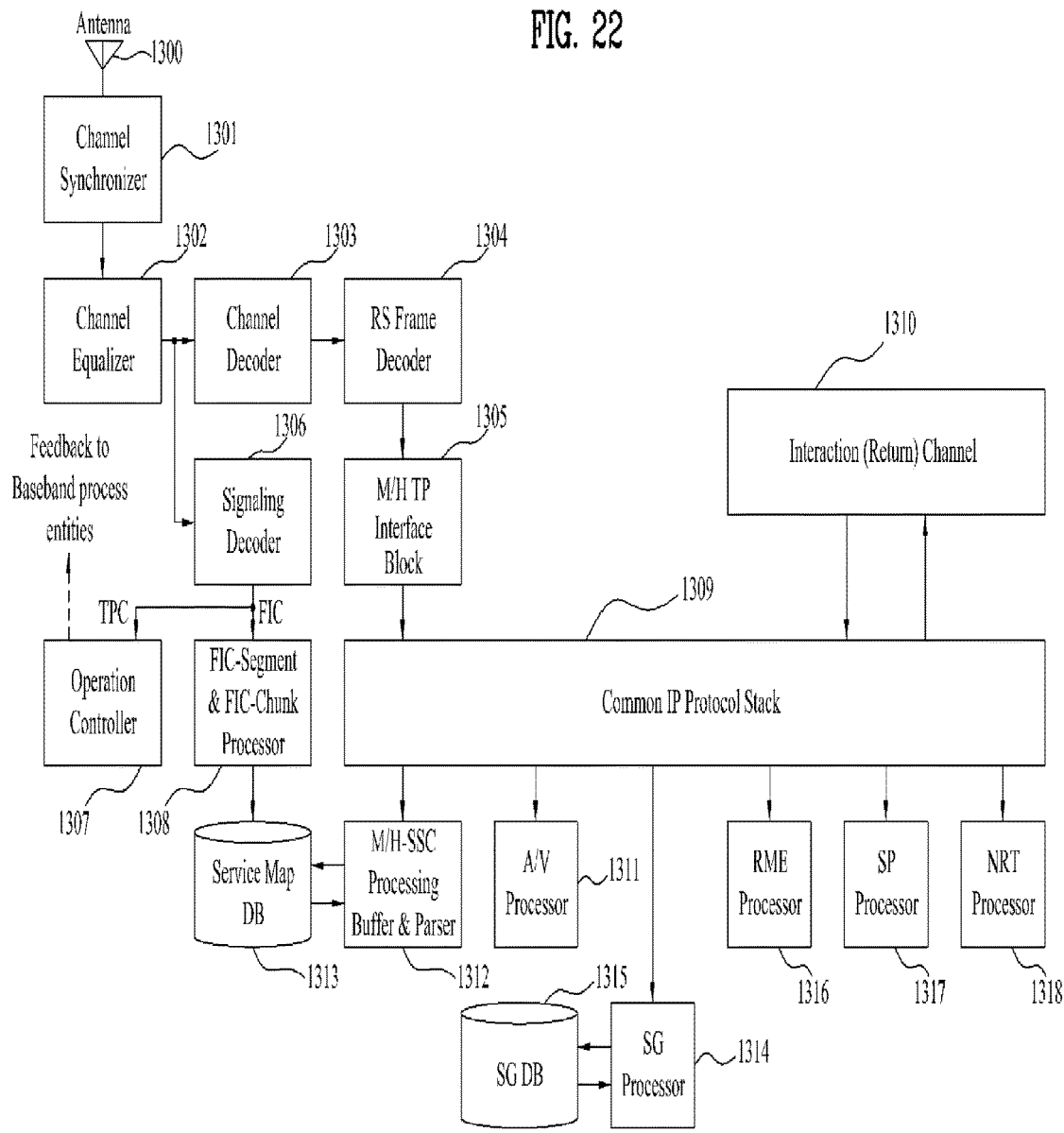
FIG. 22 is a block diagram illustrating a reception system according to an embodiment of the present invention.

FIG. 22 illustrates a block view showing the structure of a receiving system according to an embodiment of the present invention. The receiving system of FIG. 22 includes an antenna 1300, a channel synchronizer 1301, a channel equalizer 1302, a channel decoder 1303, an RS frame decoder 1304, an M/H TP interface block 1305, a signaling decoder 1306, an operation controller 1307, an FIC processor 1308, a common IP protocol stack 1309, an interaction channel unit 1310, an A/V processor 1311, a service signaling channel (SCC) processor 1312, a first storage unit 1313, a service guide (SG) processor 1314, and a second storage unit 1315. The receiving system may further include a rich media environment (RME) processor 1316, a service protection (SP) processor 1317, and a non-real time (NRT) processor 1318. Also, the receiving system may further include a main service data processing unit. Herein, the main service data processing unit may include a data deinterleaver, an RS decoder, and a data derandomizer.

According to an embodiment of the present invention, the first storage unit 1313 corresponds to a service map database (DB), and the second storage unit 1315 corresponds to a service guide database (DB).

The channel synchronizer 1301 includes a tuner and a demodulator. The tuner tunes a frequency of a specific channel through the antenna 1300, so as to down-convert the tuned frequency to an intermediate frequency (IF) signal, thereby outputting the converted IF signal to the demodulator. Herein, the signal being outputted from the tuner corresponds to a passband digital IF signal.

The demodulator included in the channel synchronizer 1301 uses known data sequences included in a data group and transmitted from the transmitting system, so as to perform carrier wave recovery and timing recovery, thereby converting the inputted pass band digital signal to a baseband digital signal.

For example, among the known data sequences, the channel equalizer 1302 uses a 1st known data sequence, and 3rd to 6th known data sequences to compensate the distortion in a received signal caused by multi path or a Doppler effect. At this point, the channel equalizer 1302 may enhance the equalizing performance by being fed-back with the output of the channel decoder 1303.

The signaling decoder 1306 extracts signaling data (e.g., TPC data and FIC data) from the received signal and decodes the extracted signal data. The decoded TPC data are outputted to the operation controller 1307, and the decoded FIC data are outputted to the FIC processor 1308. According to an embodiment of the present invention, the signaling decoder 1306 performs signaling decoding as an inverse process of the signaling encoder, so as to extract the TPC data and the FIC data from the received signal. For example, the signaling decoder 1306 performs a parallel concatenated convolution code (PCCC) type regressive turbo decoding process on the data corresponding to the signaling information region within the inputted data. Then, the signaling decoder 1306 derandomizes the turbo-decoded signaling data, thereby separating the TPC data and the FIC data from the derandomized signaling data. Additionally, the signaling decoder 1306 performs RS-decoding on the separated TPC data as an inverse process of the transmitting system, thereby outputting the RS-decoded TPC data to the operation controller 1307.

Herein, the TPC data may include RS frame information, SCCC information, M/H frame information, and so on. The RS frame information may include RS frame mode information and RS code mode information. The SCCC information may include SCCC block mode information and SCCC outer code mode information. The M/H frame information may include index information. And, the TPC data may include subframe count information, slot count information, parade_id information, SGN information, NOG information, and so on.

Thereafter, the signaling decoder 1306 performs deinterleaving on the separated FIC data in subframe units and performs RS decoding on the deinterleaved data as an inverse process of the transmitting system, thereby outputting the RS-decoded data to the FIC processor 1308. The transmission unit of the FIC data being deinterleaved and RS-decoded by the signaling decoder 1306 and outputted to the FIC processor 1308 corresponds to FIC segments.

The channel decoder 1303, which is also referred to as a block decoder, performs forward error correction in order to recover meaningful data (e.g., mobile service data) from the received signal. According to an embodiment of the present invention, in order to do so, the channel decoder 1303 uses SCCC-related information (e.g., SCCC block information, SCCC outer code mode information, and so on) included in the signaling data. According to the embodiment of the present invention, if the data being channel-equalized and inputted from the channel equalizer 1302 correspond to data processed with both serial concatenated convolution code (SCCC) type block-encoding and trellis-encoding (i.e., data within the RS frame, signaling data) by the transmitting system, the channel decoder 1303 performs trellis-decoding and block-decoding on the corresponding data as an inverse process of the transmitting system. Alternatively, if the data being channel-equalized and inputted from the channel equalizer 1302 correspond to data processed only with trellis-encoding and not with block-encoding (i.e., main service data), the channel decoder 1303 performs only trellis-decoding on the corresponding data.

By performing RS-CRC decoding on the received data, the RS frame decoder 1304 recovers the RS frame. More specifically, the RS frame decoder 1304 performs forward error correction in order to recover the RS frame. In order to do so, according to an embodiment of the present invention, the RS frame decoder 1304 uses RS-associated information (e.g., RS code mode) among the signaling data.

The M/H TP interface block 1305 extracts M/H TP packets from the RS frame, so as to recover the IP datagram, thereby outputting the recovered IP datagram to the common IP protocol stack 1309. Herein, the M/H TP packets encapsulate the IP datagram. More specifically, the header of each M/H TP packet is analyzed so as to recover the IP datagram from the payload of the corresponding M/H TP packet.

The operation controller 1307 uses the decoded TPC data structure so as to control the operations of various baseband processes. More specifically, the operation controller 1307 receives the TPC data and delivers information, such as M/H frame timing information, information on whether or not a data group exists in a selected parade, position information of known data within the data group, and power control information, to block requiring the respective information.

The FIC processor 1308 collects (or gathers) FIC segments to recover an FIC chunk and stores the recovered FIC chunk in the first storage unit 1313. The FIC chunk includes signaling information required in an ensemble selection process and a mobile (or M/H) service scanning process.

The service signaling channel processor 1312 extracts service signaling channel table sections from the designated IP multicast streams and stores the extracted service signaling channel table sections in the first storage unit 1313. The service signaling channel includes IP level signaling information, which is required for M/H service selection and scanning processes. Herein, the service signaling channel according to the present invention transmits at least one of an SMT, a GAT, an RRT, a CIT, and an SLT. At this point, according to embodiment of the present invention, the access information of the IP datagram transmitting the service signaling channel corresponds to a well-known destination IP address and a well-known destination UDP port number. Therefore, the service signaling channel processor 1312 has a well-known destination IP address and a well-known destination UDP port number, thereby being capable of extracting the IP stream transmitting the service signaling channel, i.e., service signaling data. Then, at least one of the SMT, the GAT, the RRT, the CIT, and the SLT extracted from the service signaling data is recovered and stored in the first storage unit 1313. For example, the first storage unit 1313 stores a service map configured from signaling information collected the FIC processor 1308 and the service signaling channel processor 1312.

The A/V processor 1311 receives the IP datagram from the common IP protocol stack 1309. Then, the A/V processor 1311 separates the audio data and the video data from the received IP datagram and decoded each of the audio data and the video data with a respective decoding algorithm, thereby displaying the decoded data to the screen. For example, at least one of an AC-3 decoding algorithm, an MPEG 2 audio decoding algorithm, an MPEG 4 audio decoding algorithm, an AAC decoding algorithm, an AAC+ decoding algorithm, an HE AAC decoding algorithm, an AAC SBR decoding algorithm, an MPEG surround decoding algorithm, and a BSAC decoding algorithm may be applied be used as the audio decoding algorithm, and at least one of an MPEG 2 video decoding algorithm, an MPEG 4 video decoding algorithm, an H.264 decoding algorithm, an SVC decoding algorithm, and a VC-1 decoding algorithm may be applied as the video decoding algorithm.

The SG processor 1314 recovers announcement data and stores the recovered announcement data to the second storage unit 1315, thereby providing a service guide to the viewer.

The interaction (or return) channel unit 1310 provides an uplink from the receiving system through the common IP protocol stack 1309. At this point, the interaction channel should be IP-compatible.

The RME processor 1316 receives an M/H broadcast program or RME data through the common IP protocol stack 1309, the RME data being delivered through the interaction channel. Then, the received M/H broadcast program or RME data are recovered and then processed.

The SP processor 1317 recovers and processes data associated with service protection, which are received through the common IP protocol stack 1309. Then, the SP processor 1317 provides protection to the M/H service depending upon the subscription state of the viewer (or user).

The NRT processor 1318 recovers and processes non-real time data, such as file application.

Channel Synchronizer

Figure 23:
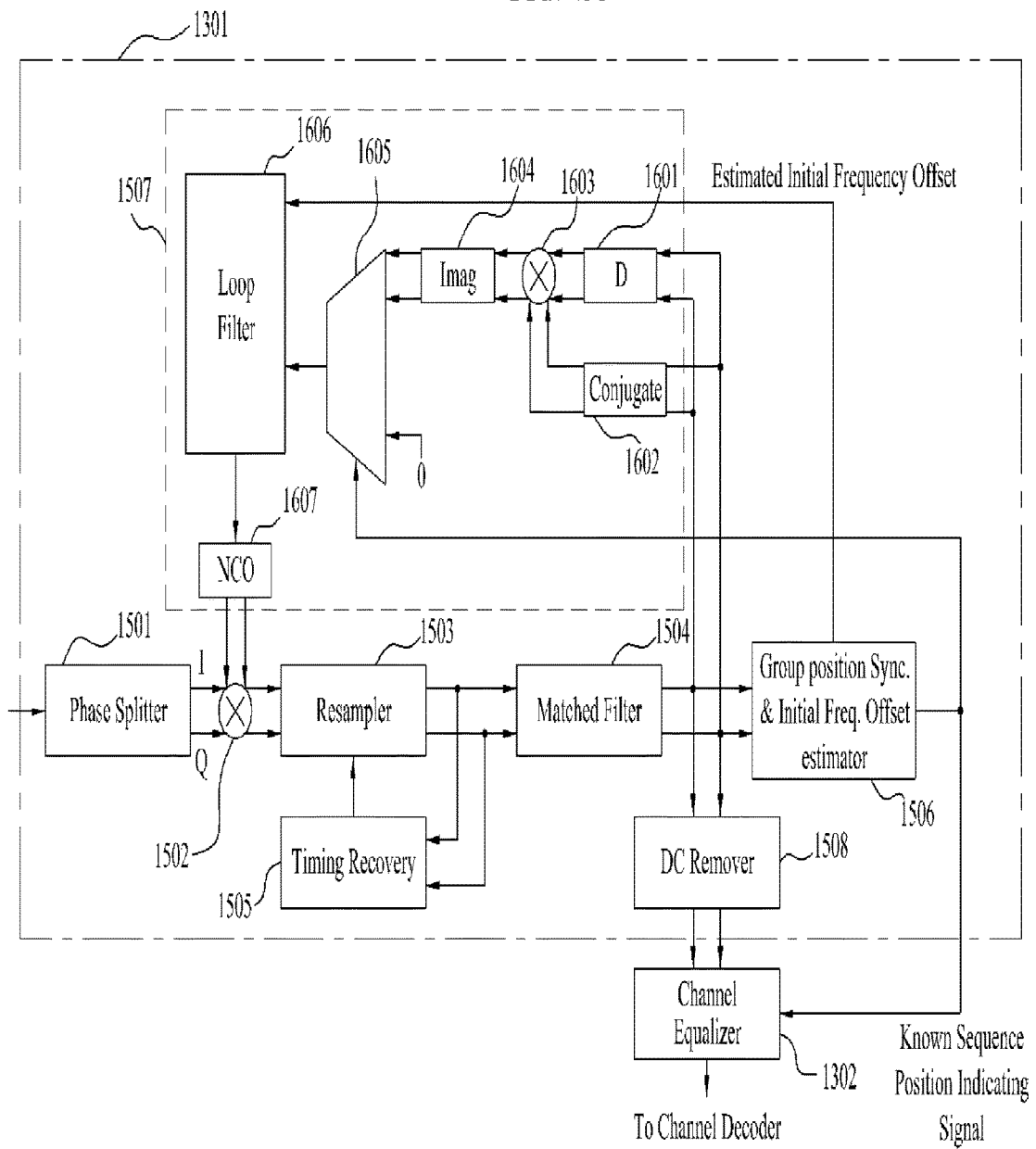
FIG. 23 is a detailed block diagram illustrating a demodulator contained in a channel synchronizer 1301 according to an embodiment of the present invention.

FIG. 23 illustrates a detailed block view of a demodulator included in the channel synchronizer 1301 according to an embodiment of the present invention.

The channel synchronizer 1301 of FIG. 23 may include a phase splitter 1501, a first multiplier 1502, a resampler 1503, a Matched Filter 1504, a Timing Recovery block 1505, a Group Position Synchronization & Initial Frequency offset estimator 1506, a Carrier Recovery block 1507, and a DC remover 1508. According to an embodiment of the present invention, an analog-to-digital converter (not shown) converting a passband analog signal to a passband digital signal may be provided at the front end of the phase splitter 1501. Also, according to an embodiment of the present invention, an automatic gain control (AGC) is performed before carrier recovery and timing recovery.

The carrier recovery block 1507 includes a delay unit 1601, a second multiplier 1603, a carrier frequency offset detector 1604, a multiplexer 1605, a loop filter 1606, and Numerically Controlled Oscillator (NCO) 1607.

Also referring to FIG. 23, the phase splitter 1501 receives a pass band digital signal and splits the received signal into a pass band digital signal of a real number element and a pass band digital signal of an imaginary number element both having a phase of 90 degrees between one another. In other words, the pass band digital signal is split into complex signals. The split portions of the pass band digital signal are then outputted to the first multiplier 1502. Herein, the real number signal outputted from the phase splitter 1501 will be referred to as an 'I' signal, and the imaginary number signal outputted from the phase splitter 1501 will be referred to as a 'Q' signal, for simplicity of the description of the present invention.

It is assumed that the signal being outputted from the tuner of the present invention is an intermediate frequency (IF) of 44 MHz. According to another embodiment of the present invention, the signal being outputted from the tuner may also be a zero IF signal (i.e., complex baseband signal).

In this case, the zero IF signal is inputted to the first multiplier 1502 bypassing the phase splitter 1501.

The first multiplier 1502 multiplies the I and Q pass band digital signals, which are outputted from the phase splitter 1501, by a digital complex signal outputted from the NCO 1607 of the carrier recovery block 1507, thereby down-converting the I and Q passband digital signals to baseband digital complex signals. At this point, by multiplying the carrier frequency offset being outputted from the carrier recovery block 1507 by the output of the phase splitter 1501, the carrier frequency offset included in the output signal of the phase splitter 1501 is compensated. Thereafter, the baseband digital signals of the first multiplier 1502 are inputted to the resampler 1503.

The resampler 1503 multiplies the signals outputted from the first multiplier 1502 by a sampling clock provided by the timing recovery block 1505, so as to compensate symbol timing errors, thereby outputting the compensated signals to the matched filter 1504 and the timing recovery block 1505.

The matched filter 1504 performs matched filtering on the output signals of the resampler 1503, thereby outputting the signals processed with matched filtering to the Group Position Synchronization & Initial Frequency offset estimator 1506, the Carrier Recovery block 1507, and the DC remover 1508.

The Group Position Synchronization & Initial Frequency offset estimator 1506 detects the place (or position) of the known data sequences that are included in the data group and received. Simultaneously, the Group Position Synchronization & Initial Frequency offset estimator 1506 estimates an initial frequency offset during the known data detection process. In this case, the carrier recovery block 1507 may use the known data sequence position information and initial frequency offset value to estimate the carrier frequency offset with more accuracy, thereby performing compensation. Also, the Group Position Synchronization & Initial Frequency offset estimator 1506 performs group position synchronization. More specifically, the Group Position Synchronization & Initial Frequency offset estimator 1506 extracts the starting position of each data group.

For example, the Group Position Synchronization & Initial Frequency offset estimator 1506 detects the position (or place) of the known data sequence included in the data group. Then, the Group Position Synchronization & Initial Frequency offset estimator 1506 outputs the detected known sequence position indicating signal to the multiplexer 1604 and the channel equalizer 1302 of the carrier recovery block 1507. Furthermore, the Group Position Synchronization & Initial Frequency offset estimator 1506 estimates the initial frequency offset by using the second known data sequence within the data group, which is then outputted to the loop filter 1606 of the carrier recovery block 1507.

The timing recovery block 1505 receives the output of the resampler 1503 so as to detect the timing error. Then, the timing recovery block 1505 outputs a sampling clock being in proportion with the detected timing error to the resampler 1503, thereby controlling the sampling of the resampler 1503.

The DC remover 1508 removes a pilot tone signal (i.e., DC signal), which has been inserted by the transmitting system, from the matched-filtered signal outputted from the matched filter 1504. Thereafter, the DC remover 1508 outputs the processed signal to the channel equalizer 1302.

Known Data Sequence Position and Initial Frequency Offset Estimation

According to an embodiment of the present invention, among the known data sequences included in the data group, a correlation of repeated known data patterns of a second known data sequence is used to detect the position of a known data sequence within the data group and to estimate an initial frequency offset. Particularly, according to an embodiment of the present invention, a partial correlation is used to detect the position of a known data sequence and to estimate an initial frequency offset.

The initial frequency offset includes a rough frequency offset and a finer frequency offset. More specifically, when acquiring carrier frequency acquisition, at first a rough frequency offset is used to reduce a frequency pull-in range, and, then, a finer frequency offset is used to reduce the frequency pull-in range once again.

In the present invention, the second known data sequence within the data group is configured of a first 528 symbol sequence and a second 528 symbol sequence each having the same pattern. More specifically, the 528 pattern is repeated after a data segment synchronization signal of 4 symbols.

In the description of the present invention, the second known data sequence will be referred to as an acquisition training sequence.

The Group Position Synchronization & Initial Frequency offset estimator (or known sequence detector) 1506 uses the repeated known data pattern of the second known data sequence, so as to perform group position synchronization and initial frequency offset estimation. For example, a correlation between the received signal and a second known data sequence, which is pre-known based upon an agreement between the transmitting system and the receiving system, and by finding a maximum correlation value, the group position synchronization may be performed. However, if a frequency offset exists in the received signal, the reliability of a general correlation method, wherein an entire second known data sequence is used to obtain one correlation value, may be degraded. More specifically, as the length of a known data pattern for correlation becomes longer, the possibility of the reliability of a correlation peak value being degraded may increase.

Therefore, according to an embodiment of the present invention, a partial correlation method is used to detect a highly reliable correlation peak value, even when a large frequency offset exists. More specifically, by using the partial correlation method, noise may be reduced.

AS described above, in the present invention, by obtaining a partial correlation by dividing (or segmenting) the second known data sequence into two or more parts, a peak value among the correlation value for each part may be obtained. Then, all of the peak correlation values for each part are added so as to calculate the average (or mean) value. Accordingly, the noise included in the received signal is cancelled, thereby reducing the noise.

In order to do so, the second known data sequence is segmented (or divided) into multiple parts, and a correlation between the known data sequence of each part (i.e., reference known data sequence of a corresponding part generated from the receiving system) and the receiving signal is calculated (or obtained) for each part. Thereafter, the partial correlation values obtained for each part are all added. At this point, each of the correlation values obtained for each part corresponds to a squared value (i.e., a magnitude square) having no phase information.

Figure 24:
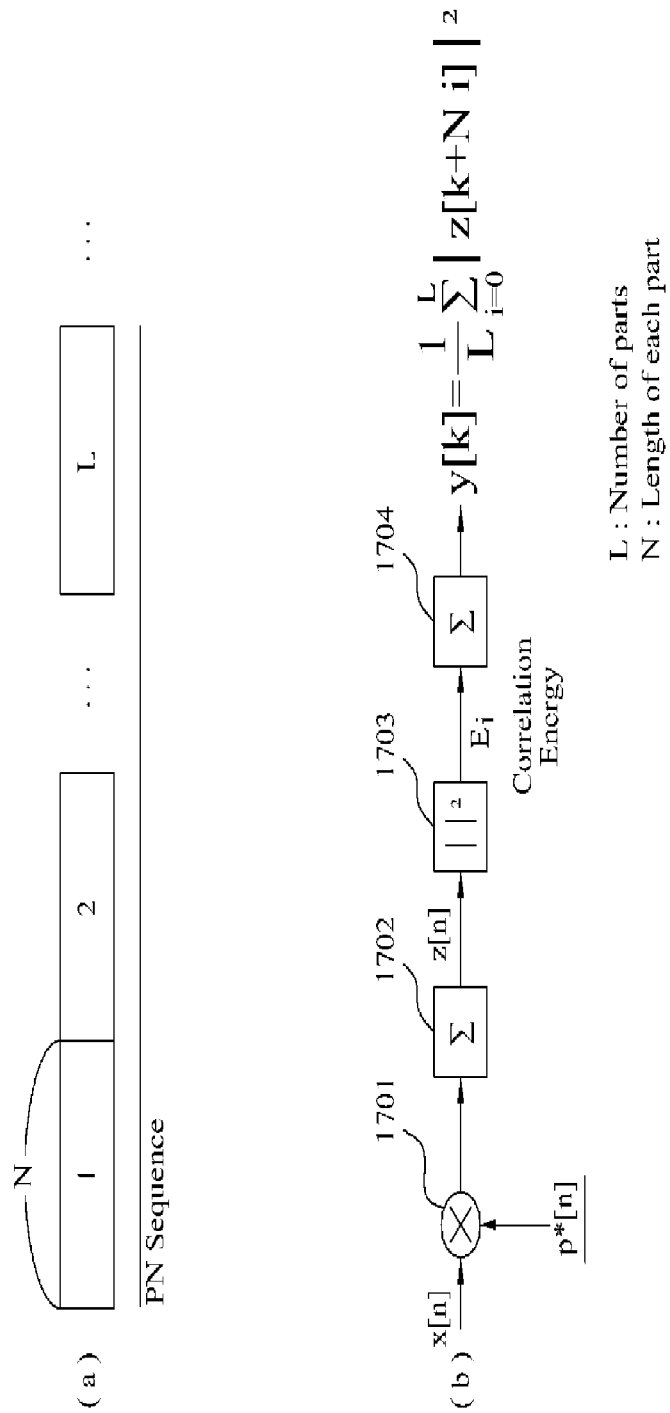
FIG. 24 illustrates a known data symbol sequence and a partial correlation unit according to an embodiment of the present invention.

(a) of FIG. 24 shows an example of each part being configured of N number of symbols, when the second known data symbol sequence is divided (or segmented) into L number of parts. More specifically, in (a) of FIG. 24, L represents a number of parts being segmented from the second known data symbol sequence, and N represents the length of each part. Also, * signifies a complex conjugate. In other words, a second known data sequence is divided into L number of parts each having the length of N symbols. Thereafter, the correlation with the received signal is obtained for each part.

(b) of FIG. 24 illustrates a conceptual view of a partial correlator according to an embodiment of the present invention. Herein, the partial correlator consists of a multiplier 1701 shifting known data sequences of each corresponding part to the received signal so as to perform complex conjugate multiplication, a first accumulator 1702 accumulating the output of the multiplier 1701 for a period of N symbols, a squarer 1703 calculating a squared value of the output of the first accumulator 1702, and a second accumulator 1704 accumulating the output of the squarer 1703 for a predetermined period of time, thereby calculating an average (or mean) correlation value.

More specifically, the multiplier 1701 shifts the known data sequence of a corresponding part in accordance with the received signal so as to perform complex conjugate multiplication, thereby outputting the multiplied values to the first accumulator 1702. The first accumulator 1702 accumulates the output of the multiplier 1701 for a period of N symbols, thereby outputting the accumulated value to the squarer 1703. The output of the first accumulator 1702 corresponds to correlation values each having a phase and size. The squarer 1703 calculates the squared value of the output of the first accumulator 1702, thereby obtaining the size of the correlation value. The second accumulator 1704 accumulates the outputs of the squarer 1703 during L sections. Then, the second accumulator 1704 divides the accumulated value by L, so as to output the average correlation value of the corresponding part. Equation 1 shown below corresponds to (b) of FIG. 24 recapitulated in the form of an equation.

$$y[k] = 1/L \sum_{i=0}^{L} |z[k+Ni]|^2 \qquad \text{Equation 1}$$

More specifically, by finding a maximum correlation value during a data group period, the Group Position Synchronization & Initial Frequency offset estimator 1506 decides a group synchronization position and a known data sequence position. Also, by suing the partial correlation method, the known sequence detector estimates the initial frequency offset.

Figure 25:
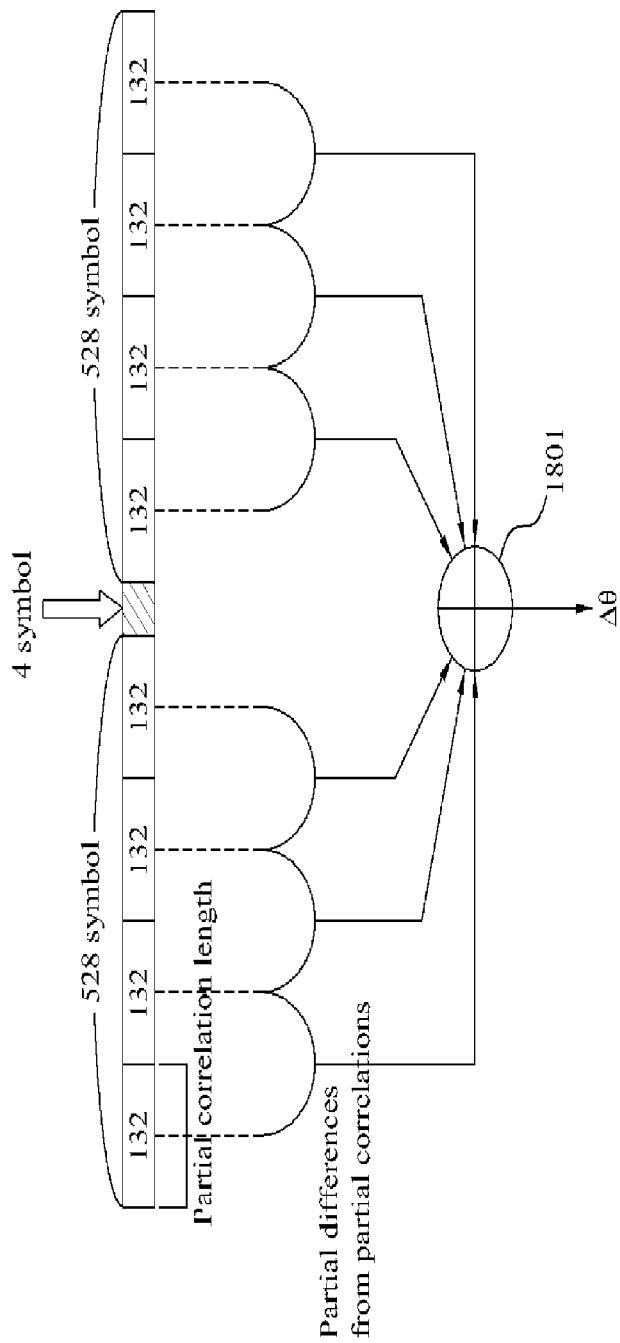
FIG. 25 is a conceptual diagram illustrating a method for roughly estimating an initial frequency offset by dividing a second known data sequence into 8 parts and calculating partial correlation of the 8 parts according to an embodiment of the present invention.

FIG. 25 illustrates an example of estimating a rough initial frequency offset by obtaining partial correlation by dividing (or segmenting) a second known data sequence into 8 parts. When applying this example to FIG. 24, L is equal to 8, and N is equal to 132 symbols. In case of FIG. 25, 8 partial correlators are required to be provided, and 8 peak correlation values may be obtained accordingly.

In this case, at a maximum correlation position, the Group Position Synchronization & Initial Frequency offset estimator 1506 calculates a phase difference between the correlation values of each of the successive parts. Then, the Group Position Synchronization & Initial Frequency offset estimator 1506 uses an adder 1801 to add all of the phase differences for each part, thereby outputting an average phase difference Δθ. Subsequently, by using the average phase difference Δθ and the length (N) of each part, the known sequence detector may calculate ω0 as shown in Equation 2 below.

$$\omega_0 = \frac{\Delta\theta}{N} \qquad \text{Equation 2}$$

Herein,
$\omega_0 = 2\pi f0$
f0: Normalized frequency offset
Δθ: Average phase difference)
N: Length of each part According to an embodiment of the present invention, in Equation 2, N is equal to 132.

At this point, the rough (or coarse) frequency offset f0 obtained from ω0 by applying Equation 2 provides a frequency pull-in range of ±80 kHz. A trade-off exists between the frequency pull-in range and a variance of an estimated error associated to a length of the part. More specifically, if the length of a known data pattern for the correlation is short, the frequency pull-in range increases, and the jitter also increases accordingly. On the other hand, if the length of a known data pattern for the correlation is long, the frequency pull-in range decreases, and the jitter also decreases accordingly.

Meanwhile, according to an embodiment of the present invention, a finer frequency offset is estimated by using repeated patterns of the second known data sequence. The second known data sequence is configured of two parts. More specifically, the second known data sequence is configured of a part including a first 528 symbol sequence and another part including a second 528 symbol sequence. Herein, a data segment synchronization signal of 4 symbols exists between the first 528 symbol sequence and the second 528 symbol sequence. This structure allows the finer frequency offset to be estimated by using a Maximum-likelihood algorithm.

Figure 26:
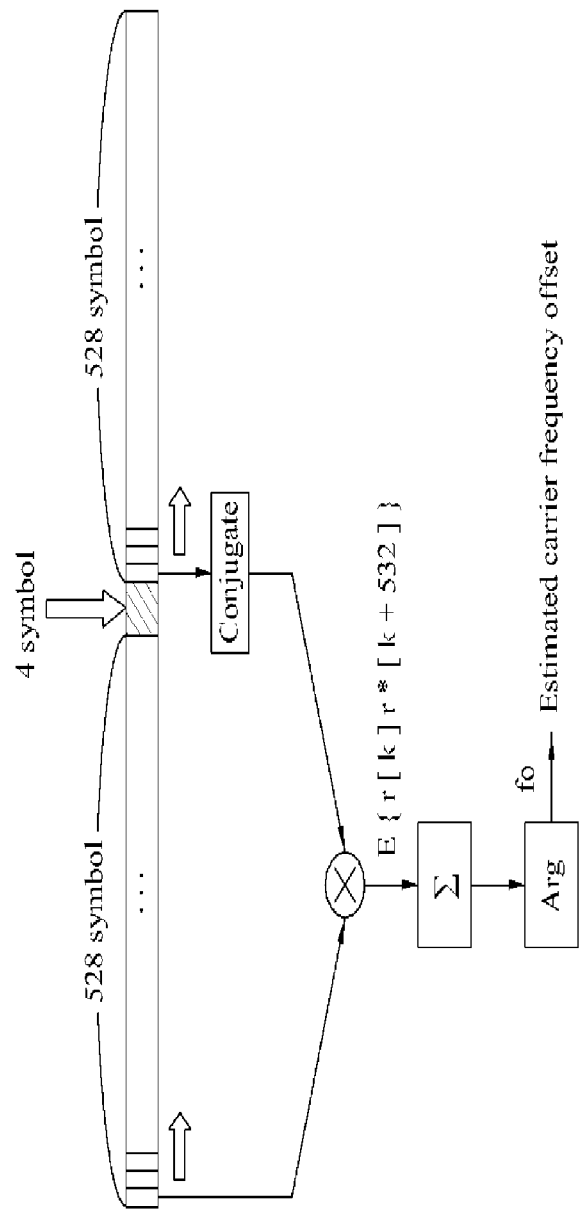
FIG. 26 is a conceptual diagram illustrating a method for precisely estimating a frequency offset using a maximum-likelihood algorithm according to an embodiment of the present invention.

FIG. 26 illustrates an example of estimating a finer frequency offset by using the Maximum-likelihood algorithm according to the present invention.

At this point, the received signal r[k] may be indicated as shown in Equation 3 below.

$$r[k] = x[k]e^{-j2\pi f_0 T_s k} + n[k] \qquad \text{Equation 3}$$

Herein,
x[k]: transmitted signal
f0: frequency offset
Ts: symbol duration
n[k]: noise In Equation 3, f0 corresponds to the finer frequency offset.

Also, the correlation between the received signals separated by 532 (=528+4) symbols may be obtained (or calculated) by using Equation 4 below.

$$E\{r[k]r^*[k+532]\} = E\{(x[k]e^{-j2\pi f_0 T_s k} + \\ n[k])(x^*[k+532]e^{j2\pi f_0 T_s(k+532)} + \\ n^*[k+532])\} \\ = \sigma_s^2 e^{j2\pi f_0 T_s \cdot 532} \qquad \text{Equation 4}$$

Where, $\sigma_s^2$: $E\{|x[k]|^2\}$

More specifically, the partial correlation of the two parts spaced apart by 532 symbols (i.e., each part having the length of 532 symbols) is calculated and then the average value is calculated. Thereafter, after applying an argument, the finer frequency offset can be obtained. The finer frequency offset obtained by applying the Equation 4 provides a frequency pull-in range of ±10 kHz.

In the description of the present invention, the rough frequency offset and the finer frequency offset will be collectively referred to as an initial frequency offset. The initial frequency offset is outputted to the loop filter 1606 of the carrier recovery block 1507.

Meanwhile, according to an embodiment of the present invention, the carrier recovery block 1507 uses a carrier frequency tracking loop, as shown in FIG. 23.

The carrier recovery block 1507 loads an initial frequency offset estimated from the Group Position Synchronization & Initial Frequency offset estimator 1506. Then, the carrier recovery block 1507 tracks the remaining carrier frequency offset.

More specifically, the carrier recovery block 107 uses a Maximum-likelihood to calculate the correlation of the received successive known data sequences, thereby estimating a carrier frequency offset (or error) using the same method that is used for the initial frequency offset estimation.

In order to do so, the delay unit 1601 of the carrier recovery block 1507 receives the data outputted from the matched filter 1504 in symbol units so as to perform a K symbol delay. Thereafter, the delay unit 1601 outputs the delayed data to the second multiplier 1603.

Also, the output data of the matched filter 1504 is conjugated by the conjugator 1602. Then, the conjugated data are inputted to the second multiplier 1603.

The second multiplier 1603 calculates the correlation value between the known data sequence delayed by K symbols by the delay unit 1601 and the known data sequence conjugated by the conjugator 1602. Thereafter, the second multiplier 1603 outputs the calculated correlation value to the carrier frequency offset detector 1604.

Herein, according to an embodiment of the present invention, K symbols is equal to 13312 symbols (=832*16 symbols). This is because the first known data sequence, and the third to sixth known data sequences are inserted and received at intervals of 16 segments, and also because one segment is configured of 832 symbols.

According to the embodiment of the present invention, the correlation value between the known data sequences spaced apart at an interval of 13312 symbols may be calculated by applying Equation 5 shown below.

$$E\{r[k]r^*[k+13312]\} = E\{(x[k]e^{-j2\pi f_0 T_s k} + n[k])(x^*[k+13312]e^{j2\pi f_0 T_s (k+13312)} + n^*[k+13312])\}$$

$$= \sigma_s^2 e^{j2\pi f_0 T_s \cdot 13312}$$

Equation 5

Where, $\sigma_s^2$: $E\{|x[k]|^2\}$
Herein,
x[k]: transmitted signal
i. f0: carrier frequency offset
ii. Ts: symbol duration
iii. n[k]: noise In Equation 5, f0 corresponds to a carrier frequency offset for tracking.

The carrier frequency offset detector 1604 extracts a carrier frequency offset from the correlation value outputted from the second multiplier 1603, as shown in Equation 11. Then, the extracted carrier frequency offset is outputted to the multiplexer 1605.

In accordance with the Known Sequence Position Indicating Signal from the Group Position Synchronization & Initial Frequency offset estimator 1506, the multiplexer 1605 selects an output of the carrier frequency offset detector 1604 or '0', which is then outputted as the final carrier frequency offset value.

More specifically, by using Known Sequence Position Indicating Signal, the validity of the carrier frequency offset value being outputted from the carrier frequency offset detector 1604 can be known. If the carrier frequency offset value is valid, the multiplexer 1605 selects the output of the carrier frequency offset detector 1604. And, if the carrier frequency offset value is not valid, the multiplexer 1605 selects '0'. Then, the multiplexer 1605 outputs the selection to the loop filter 1606.

The loop filter 1606 adds the output of the multiplexer 1605 to the estimated initial frequency offset, so as to perform baseband pass-filtering. Thereafter, the filtered data are outputted to the NCO 1607.

The NCO 1607 generates a complex signal corresponding to a baseband pass-filtered carrier frequency offset, thereby outputting the generated complex signal to the first multiplier 1502.

Meanwhile, according to an embodiment of the present invention, by turning the power on only in particular slots, i.e., slots having the data groups of a parade allocated thereto, wherein the parade includes a mobile service requested to be received, the channel synchronizer 1301 may reduce power consumption in the receiving system. For this, the receiving system may further include a power controller (not shown), which controls the power supply of the demodulator.

Channel Equalizer

The data demodulated by the channel synchronizer 1301 using the known data are inputted to the channel equalizer 1302. Also, the demodulated data may be inputted to the known sequence detector 1506.

At this point, a data group that is inputted for the equalization process may be divided into region A to region D, as shown in FIG. 4. More specifically, according to the embodiment of the present invention, region A includes M/H block B4 to M/H block B7, region B includes M/H block B3 and M/H block B8, region C includes M/H block B2 and M/H block B9, and region D includes M/H block B1 and M/H block B10. In other words, one data group is divided into M/H blocks from B1 to B10, each M/H block having the length of 16 segments. Also, a long training sequence (i.e., known data sequence) is inserted at the starting portion of the M/H blocks B4 to B8. Furthermore, two data groups may be allocated (or assigned) to one VSB field. In this case, field synchronization data are positioned in the 37$^{th}$ segment of one of the two data groups.

The present invention may use known data, which have position and content information based upon an agreement between the transmitting system and the receiving system, and/or field synchronization data for the channel equalization process.

The channel equalizer 1302 may perform channel equalization using a plurality of methods. According to the present invention, the channel equalizer 2003 uses known data and/or field synchronization data, so as to estimate a channel impulse response (CIR), thereby performing channel equalization.

Most particularly, an example of estimating the CIR in accordance with each region within the data group, which is hierarchically divided and transmitted from the transmitting system, and applying each CIR differently will also be described herein.

At this point, a data group can be assigned and transmitted a maximum the number of 4 in a VSB frame in the transmitting system. In this case, all data group do not include field synchronization data. In the present invention, the data group including the field synchronization data performs channel-equalization using the field synchronization data and known data. And the data group not including the field synchronization data performs channel-equalization using the known data.

For example, the data of the M/H block B3 including the field synchronization data performs channel-equalization using the CIR calculated from the field synchronization data area and the CIR calculated from the first known data area. Also, the data of the M/H blocks B1 and B2 performs channel-equalization using the CIR calculated from the field synchronization data area and the CIR calculated from the first known data area. Meanwhile, the data of the M/H blocks B1 to B3 not including the field synchronization data performs channel-equalization using CIRS calculated from the first known data area and the third known data area.

As described above, the present invention uses the CIR estimated from the known data region in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Figure 27:
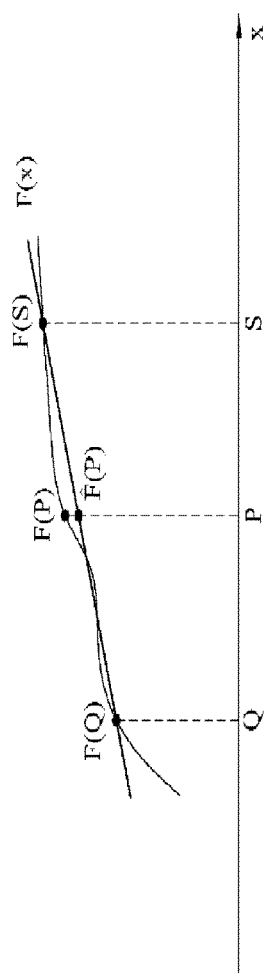
FIG. 27 illustrates an example of linear interpolation.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. FIG. 27 illustrates an example of linear interpolation.

More specifically, in a random function F(x), when given the values F(Q) and F(S) each from points x=Q and x=S, respectively, the approximate value $\hat{F}(P)$ of the F(x) function at point x=P may be estimated by using Equation 7 below. In other words, since the values of F(Q) and F(S) respective to each point x=Q and x=S are known (or given), a straight line passing through the two points may be calculated so as to obtain the approximate value $\hat{F}(P)$ of the corresponding function value at point P. At this point, the straight line passing through points (Q,F(Q)) and (S,F(S)) may be obtained by using Equation 6 below.

$$\hat{F}(x) = \frac{F(S) - F(Q)}{S - Q}(x - Q) + F(Q) \qquad \text{Equation 6}$$

Accordingly, Equation 7 below shows the process of substituting p for x in Equation 6, so as to calculate the approximate value $\hat{F}(P)$ of the function value at point P.

$$\hat{F}(P) = \frac{F(S) - F(Q)}{S - Q}(P - Q) + F(Q) \qquad \text{Equation 7}$$

-continued
$$\hat{F}(P) = \frac{S - P}{S - Q}F(Q) + \frac{P - Q}{S - Q}F(S)$$

The linear interpolation method of Equation 7 is merely the simplest example of many other linear interpolation methods. Therefore, since any other linear interpolation method may be used, the present invention will not be limited only to the examples given herein.

Alternatively, when a value F(Q) of a function F(x) at a particular point Q and a value F(S) of the function F(x) at another particular point S are known (or given), extrapolation refers to estimating a function value of a point outside of the section between points Q and S. Herein, the simplest form of extrapolation corresponds to linear extrapolation.

Figure 28:
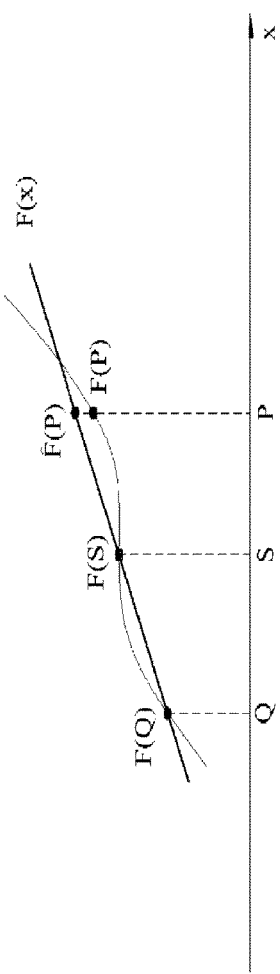
FIG. 28 illustrates an example of linear extrapolation.

FIG. 28 illustrates an example of linear extrapolation. As described above, for linear extrapolation as well as linear interpolation, in a random function F(x), when given the values F(Q) and F(S) each from points x=Q and x=S, respectively, the approximate value $\hat{F}(P)$ of the corresponding function value at point P may be obtained by calculating a straight line passing through the two points.

Herein, linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein FIG. 29 illustrates a block diagram of a channel equalizer according to an embodiment of the present invention.

Figure 29:
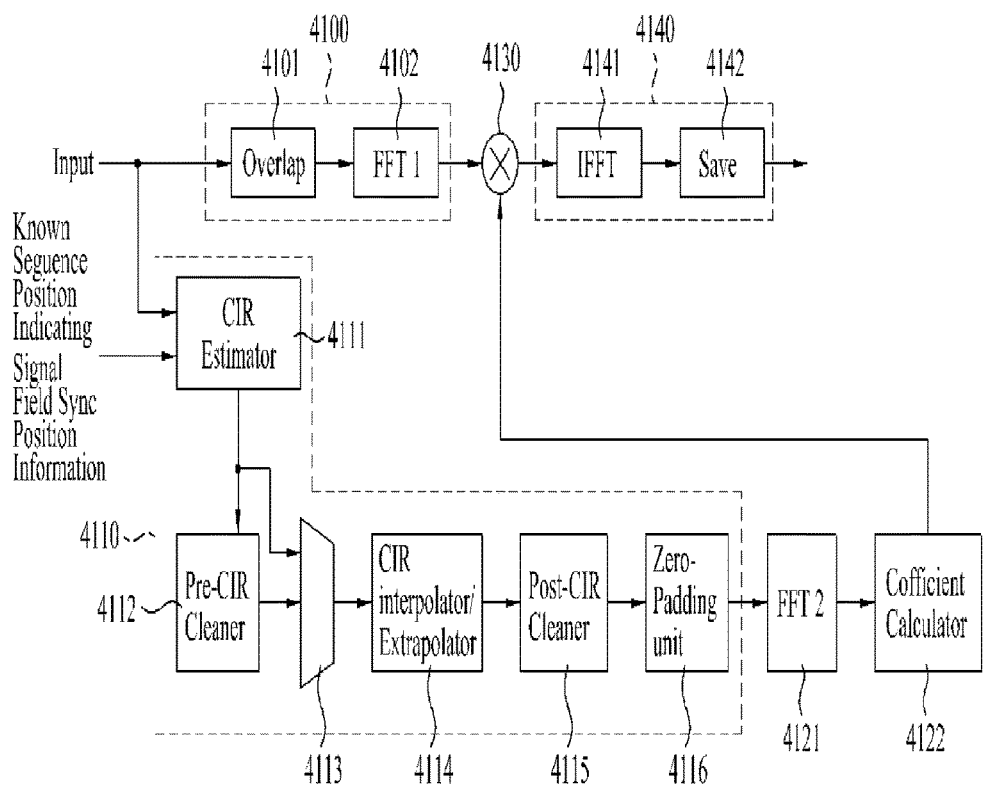
FIG. 29 illustrates an example of a channel equalizer according to an embodiment of the present invention.

Referring to FIG. 29, the channel equalizer includes a first frequency domain converter 4100, a channel estimator 4110, a second frequency domain converter 4121, a coefficient calculator 4122, a distortion compensator 4130, and a time domain converter 4140.

Herein, the channel equalizer may further include a remaining carrier phase error remover, a noise canceller (NC), and a decision unit.

The first frequency domain converter 4100 includes an overlap unit 4101 overlapping inputted data, and a fast fourier transform (FFT) unit 4102 converting the data outputted from the overlap unit 4101 to frequency domain data.

The channel estimator 4110 includes a CIR estimator 4111, a first cleaner 4112, a multiflexer 4113, a CIR calculator 4114, a second cleaner 4115 and a zero-padding unit 4116.

Herein, the channel estimator 4110 may further include phase compensator compensating a phase of the CIR which estimated in the CIR estimator 4111.

The second frequency domain converter 4121 includes a fast fourier transform (FFT) unit converting the CIR being outputted from the channel estimator 4110 to frequency domain CIR.

The time domain converter 4140 includes an IFFT unit 4141 converting the data having the distortion compensated by the distortion compensator 4130 to time domain data, and a save unit 4142 extracting only valid data from the data outputted from the IFFT unit 4141. The output data from the save unit 4142 corresponds to the channel-equalized data.

If the remaining carrier phase error remover is connected to an output terminal of the time domain converter 4140, the remaining carrier phase error remover estimates the remaining carrier phase error included in the channel-equalized data, thereby removing the estimated error.

If the noise remover is connected to an output terminal of the time domain converter 4140, the noise remover estimates noise included in the channel-equalized data, thereby removing the estimated noise.

More specifically, the receiving data demodulated in FIG. 29 are overlapped by the overlap unit 4101 of the first frequency domain converter 4100 at a pre-determined overlapping ratio, which are then outputted to the FFT unit 4102. The FFT unit 4102 converts the overlapped time domain data to overlapped frequency domain data through by processing the data with FFT. Then, the converted data are outputted to the distortion compensator 4130.

The distortion compensator 4130 performs a complex number multiplication on the overlapped frequency domain data outputted from the FFT unit 4102 included in the first frequency domain converter 4100 and the equalization coefficient calculated from the coefficient calculator 4122, thereby compensating the channel distortion of the overlapped data outputted from the FFT unit 4102. Thereafter, the compensated data are outputted to the IFFT unit 4141 of the time domain converter 4140. The IFFT unit 4141 performs IFFT on the overlapped data having the channel distortion compensated, thereby converting the overlapped data to time domain data, which are then outputted to the save unit 4142. The save unit 4142 extracts valid data from the data of the channel-equalized and overlapped in the time domain, and outputs the extracted valid data.

Meanwhile, the received data are inputted to the overlap unit 4101 of the first frequency domain converter 4100 included in the channel equalizer and, at the same time, inputted to the CIR estimator 4111 of the channel estimator 4110.

The CIR estimator 4111 uses a training sequence, for example, data being inputted during the known data section and the known data in order to estimate the CIR. If the data to be channel-equalizing is the data within the data group including field synchronization data, the training sequence using in the CIR estimator 4111 may become the field synchronization data and known data. Meanwhile, if the data to be channel-equalizing is the data within the data group not including field synchronization data, the training sequence using in the CIR estimator 4111 may become only the known data.

For example, the CIR estimator 4111 uses the data received during a known data section and reference known data generated from the receiving system based upon an agreement between the receiving system and the transmitting system, so as to estimate a channel impulse response (CIR). In order to do so, the CIR estimator 4111 is provided with a Known Sequence Position Indicating Signal from the Group Position Synchronization & Initial Frequency offset estimator 1506.

Also, in case of the data group including field synchronization, the CIR estimator 4111 may use the data being received during one field synchronization section and the reference field synchronization data, which generated from the receiving system in accordance with an agreement between the transmitting system and the receiving system, so as to estimate a channel impulse response (CIR_FS). In order to do so, the CIR estimator 4111 may be provided with Field Sync Position Information from the Group Position Synchronization & Initial Frequency offset estimator 1506. The CIR estimator 4111 may estimate a channel impulse response (CIR) by using a well-known least square (LS) method.

In the LS method, a cross correlation value p between known data that have passed through a channel during a known data section and known data already known by a receiving end (or receiver) is calculated, and an auto-correlation matrix R of the known data is also calculated. Thereafter, a matrix operation (or calculation) of $R^{-1} \cdot p$ is performed so that the auto-correlation portion existing in the cross correlation value p between the received data and the initial (or original) known data can be removed, thereby estimating the CIR of the transmission channel.

Also, according to another embodiment of the present invention, the CIR estimator may also perform CIR estimation by using a least mean square (LMS) method. For example, in regions A and B within the data group, the Channel Impulse Response (CIR) is estimated by using the Least Square (LS) method, and, then, channel equalization may be performed. Thereafter, in regions C and D within the data group, the CIR is estimated by using the Least Mean Square (LMS) method, and, then, channel equalization may be performed.

The CIR estimated as described above is outputted to the first cleaner 4112 and the multiplexer 4113. The multiplexer 4113 may either select the output of the first cleaner 4112 or select the output of the CIR estimator 4111 depending upon whether the CIR operator 4114 performs interpolation on the estimated CIR, or whether the CIR operator 4114 performs extrapolation on the estimated CIR. For example, when the CIR operator 4114 performs interpolation on the estimated CIR, the multiplexer 4113 selects the output of the CIR estimator 4111. And, when the CIR operator 4114 performs extrapolation on the estimated CIR, the multiplexer 4113 selects the output of the first cleaner 4112.

The CIR operator 4114 performs interpolation or extrapolation on the estimated CIR and then outputs the interpolated or extrapolated CIR to the second cleaner 4115.

More specifically, the CIR estimated from the known data includes a channel element that is to be obtained as well as a jitter element caused by noise. Since such jitter element deteriorates the performance of the equalizer, it preferable that a coefficient calculator 4122 removes the jitter element before using the estimated CIR. Therefore, according to the embodiment of the present invention, each of the first and second cleaners 4113 and 4115 removes a portion of the estimated CIR having a power level lower than the predetermined threshold value (i.e., so that the estimated CIR becomes equal to '0'). Herein, this removal process will be referred to as a "CIR cleaning" process.

The CIR calculator 4114 performs CIR interpolation by multiplying CIRs estimated from the CIR estimator 4111 by each of coefficients, thereby adding the multiplied values. At this point, some of the noise elements of the CIR may be added to one another, thereby being cancelled. Therefore, when the CIR calculator 4114 performs CIR interpolation, the original (or initial) CIR having noise elements remaining therein. In other words, when the CIR calculator 4114 performs CIR interpolation, the estimated CIR bypasses the first cleaner 4113 and is inputted to the CIR calculator 4114. Subsequently, the second cleaner 4115 cleans the CIR interpolated by the CIR interpolator-extrapolator 4114.

Conversely, the CIR calculator 4114 performs CIR extrapolation by using a difference value between two CIRs, so as to estimate a CIR positioned outside of the two CIRs. Therefore, in this case, the noise element is rather amplified. Accordingly, when the CIR calculator 4114 performs CIR extrapolation, the CIR cleaned by the first cleaner 4113 is used. More specifically, when the CIR calculator 4114 performs CIR extrapolation, the extrapolated CIR passes through the second cleaner 4115, thereby being inputted to the zero-padding unit 4116.

Meanwhile, when a second frequency domain converter (or fast fourier transform (FFT2)) 4121 converts the CIR, which has been cleaned and outputted from the second cleaner 4115, to a frequency domain, the length and of the inputted CIR and the FFT size may not match (or be identical to one another). In other words, the CIR length may be smaller than the FFT size. In this case, the zero-padding unit 4116 adds a number of zeros '0's corresponding to the difference between the FFT size and the CIR length to the inputted CIR, thereby outputting the processed CIR to the second frequency domain converter (FFT2) 4121. Herein, the zero-padded CIR may correspond to one of the interpolated CIR, extrapolated CIR, and the CIR estimated in the known data section.

The second frequency domain converter 4121 outputs the converted CIR to the coefficient calculator 4122.

The coefficient calculator 4122 uses the frequency domain CIR being outputted from the second frequency domain converter 4121 to calculate the equalization coefficient. Then, the coefficient calculator 4122 outputs the calculated coefficient to the distortion compensator 4130. Herein, for example, the coefficient calculator 4122 calculates a channel equalization coefficient of the frequency domain that can provide minimum mean square error (MMSE) from the CIR of the frequency domain, which is outputted to the distortion compensator 4130.

The distortion compensator 4130 performs a complex number multiplication on the overlapped data of the frequency domain being outputted from the FFT unit 4102 of the first frequency domain converter 4100 and the equalization coefficient calculated by the coefficient calculator 4122, thereby compensating the channel distortion of the overlapped data being outputted from the FFT unit 4102.

Block Decoder

Meanwhile, if the data being inputted to the block decoder 1303, after being channel-equalized by the equalizer 1302, correspond to the data having both block encoding and trellis encoding performed thereon (i.e., the data within the RS frame, the signaling information data, etc.) by the transmitting system, trellis decoding and block decoding processes are performed on the inputted data as inverse processes of the transmitting system. Alternatively, if the data being inputted to the block decoder correspond to the data having only trellis encoding performed thereon (i.e., the main service data), and not the block encoding, only the trellis decoding process is performed on the inputted data as the inverse process of the transmitting system.

The trellis decoded and block decoded data by the block decoder 1303 are then outputted to the RS frame decoder 1304. More specifically, the block decoder 1303 removes the known data, data used for trellis initialization, and signaling information data, MPEG header, which have been inserted in the data group, and the RS parity data, which have been added by the RS encoder/non-systematic RS encoder or non-systematic RS encoder of the transmitting system. Then, the block decoder 1303 outputs the processed data to the RS frame decoder 1304. Herein, the removal of the data may be performed before the block decoding process, or may be performed during or after the block decoding process.

Meanwhile, the data trellis-decoded by the block decoder 1303 are outputted to the data deinterleaver of the main service data processor. At this point, the data being trellis-decoded by the block decoder 1303 and outputted to the data deinterleaver may not only include the main service data but may also include the data within the RS frame and the signaling information. Furthermore, the RS parity data that are added by the transmitting system after the pre-processor may also be included in the data being outputted to the data deinterleaver.

According to another embodiment of the present invention, data that are not processed with block decoding and only processed with trellis encoding by the transmitting system may directly bypass the block decoder 1303 so as to be outputted to the data deinterleaver. In this case, a trellis decoder should be provided before the data deinterleaver.

More specifically, if the inputted data correspond to the data having only trellis encoding performed thereon and not block encoding, the block decoder 1303 performs Viterbi (or trellis) decoding on the inputted data so as to output a hard decision value or to perform a hard-decision on a soft decision value, thereby outputting the result.

Meanwhile, if the inputted data correspond to the data having both block encoding process and trellis encoding process performed thereon, the block decoder 1303 outputs a soft decision value with respect to the inputted data.

In other words, if the inputted data correspond to data being processed with block encoding by the block processor and being processed with trellis encoding by the trellis encoding module, in the transmitting system, the block decoder 1303 performs a decoding process and a trellis decoding process on the inputted data as inverse processes of the transmitting system. At this point, the RS frame encoder of the pre-processor included in the transmitting system may be viewed as an outer (or external) encoder. And, the trellis encoder may be viewed as an inner (or internal) encoder. When decoding such concatenated codes, in order to allow the block decoder 1303 to maximize its performance of decoding externally encoded data, the decoder of the internal code should output a soft decision value.

Figure 30:
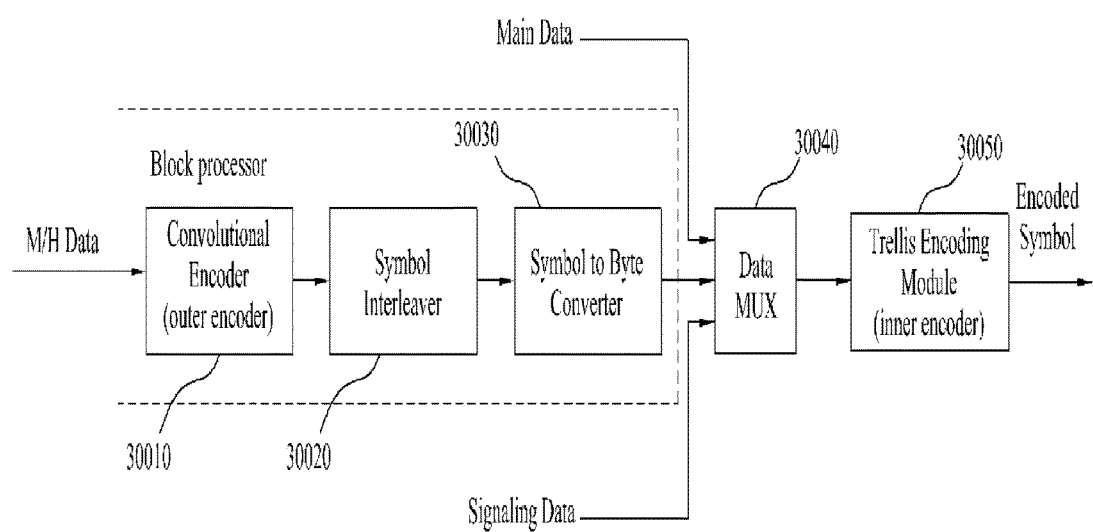
FIG. 30 illustrates a serial concatenated convolution code (SCCC) coding process according to an embodiment of the present invention.

FIG. 30 illustrates SCCC encoding process according to an embodiment of the present invention.

The SCCC encoding process is related with Convolutional Encoder 30010, Symbol Interleaver 30020, Symbol to Byte Converter 30030, Data MUX 30040 and Trellis Encoding Module 30050.

A SCCC Decoder can decode both the main trellis code and the M/H convolutional code, considering that they are effectively concatenated with each other at the transmitter through the symbol interleaver 30020 and the data mux module 30040 as shown in FIG. 30. the data mux module 30040, shown as a single block, actually consists of a number of processors including the Group formatter, the Packet formatter, the Packet mux, the RS encoder, the data interleaver, the byte to symbol converter and the 12-way symbol demultiplexer in the 12-way trellis encoder.

Figure 31:
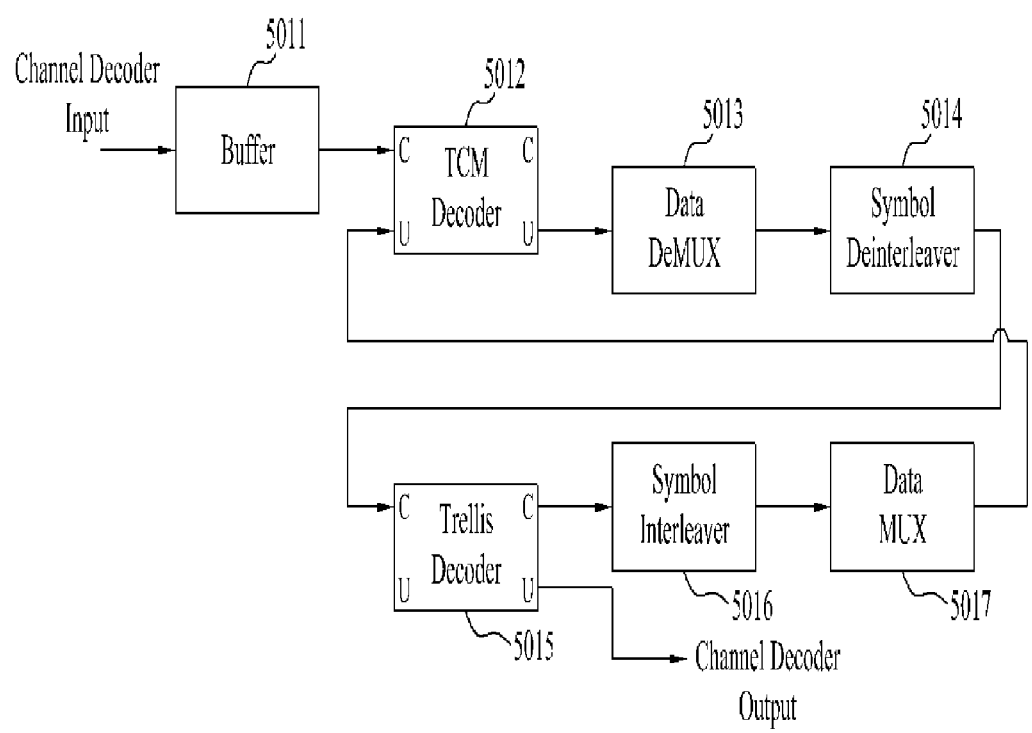
FIG. 31 illustrates a detailed block view showing a block decoder according to an embodiment of the present invention.

FIG. 31 illustrates a detailed block view showing a block decoder 1303 according to an embodiment of the present invention. The block decoder 1303 includes an input buffer 5011, a Trellis Code Modulation (TCM) decoder 5012, a data demultiplexer 5013, a symbol deinterleaver 5014, a symbol decoder 5015, a symbol interleaver 5016, and a data multiplexer 5017. The TCM decoder 5012 is referred to as an inner decoder, and the symbol decoder 5015 is referred to as an outer decoder or a trellis decoder. The block decoder 1303 according to the embodiment of the present invention performs SCCC block decoding in SCCC block units on the inputted data. In FIG. 31, 'U' and 'C' marked on the TCM decoder 5012 and the symbol decoder 5015 respectively indicate 4 ports of soft input soft output (SISO).

The input buffer 5011 temporarily stores values of mobile service data symbols (i.e., including RS parity data symbols that were added during RS frame encoding, and CRC data symbols) being channel-equalized and outputted from the channel equalizer 5011 in SCCC block units. Thereafter, the input buffer 5011 repeatedly outputs the stored values to the TCM decoder 5012.

Also, among the symbol values being outputted from the channel equalizer 1302, input symbol values of section do not include any mobile service data symbol (i.e., including RS parity data symbols that were added during RS frame encoding, and CRC data symbols) values bypass the input buffer 5011 without being stored. More specifically, since only trellis-decoding is performed on the input symbol value of sections that are not processed with SCCC block encoding, the input buffer 5011 directly outputs such input to the TCM decoder 5012 without performing any temporary storing or repeated outputting processes.

The input buffer 5011 refers to information associated to SCCC being outputted from the operation controller 1307 or the signaling decoder 1308, e.g., the SCCC block mode and SCCC outer code mode, so as to control the storage and output of the input data.

In correspondence with the 12-way trellis encoder, the TCM decoder 5012 includes a 12-way Trellis Coded Modulation (TCM) decoder. Herein, 12-way trellis-decoding is performed on the input symbol value as an inverse process of the 12-way trellis-encoder.

More specifically, the TCM decoder 5012 receives as many output symbol values of the input buffer 5011 and soft-decision values being fed-back through the data multiplexer 5017 as each SCCC blocks, so as to perform TCM decoding on each symbol.

At this point, the soft-decision values that are fed-back are matched to be in a one-to-one correspondence with a number of symbol positions corresponding to the number of SCCC blocks being outputted from the input buffer 5011, so that the matched soft-decision values can be inputted to the TCM decoder 5012 based upon the control of the data multiplexer 5017. More specifically, the symbol values being outputted from the input buffer 5011 and the turbo-decoded and inputted data are matched to one another in accordance with the same position within the respective SCCC block, thereby being outputted to the TCM decoder 5012. For example, if the turbo-decoded data correspond to the third symbol value within the SCCC block, the corresponding turbo-decoded data are matched with the third symbol value within the SCCC block being outputted from the input buffer 5011, thereby being outputted to the TCM decoder 5012.

In order to do so, the data multiplexer 5017 controls the system so that the input buffer 5011 can store the corresponding SCCC block data while the iterative turbo decoding is being performed. And, by using a delay method, the data multiplexer 5017 also controls the system so that the soft-decision value (e.g., LLR) of the output symbol of the symbol interleaver 5016 can be matched, so as to be in a one-to-one correspondence, with the symbol value of the input buffer 5011 corresponding to the same position (or location) within the block of the output symbol, thereby being inputted to the TCM decoder of the corresponding way. At this point, in case of a symbol value that is not block decoded, since the corresponding symbol value is not turbo decoded, a null bit is inputted in the matched output position (or location).

After performing this process for a predetermined number of iteration of turbo decoding, the data of the next SCCC block is stored in the input buffer 5011 and then outputted, so as to repeat the turbo-decoding process.

The output of the TCM decoder 5012 signifies the reliability of the symbols being inputted to the trellis encoder of the transmitting system with respect to the transmitted symbols. For example, since the 2-bit input of the trellis encoding module of the transmitting system corresponds to one symbol, a Log Likelihood Ratio (LLR) between the likelihood (or probability) of one bit being '1' and the likelihood (or probability) of another bit being '0' may be respectively outputted (bit-unit output) for the upper bit and the lower bit. The Log Likelihood Ratio (LLR) signifies a log value on a ratio between the likelihood value of the input bit being '1' and the likelihood value of the input bit being '0'. Alternatively, a log likelihood ratio of the likelihood value of 2 bits, i.e., one symbol being "00", "01", "10", and "11" may be outputted (symbol-unit output) for all four combinations (00,01,10,11). This eventually corresponds to the soft-decision value of the received symbol, which indicates the reliability of the bits that were inputted to the trellis encoder. Herein, a Maximum A posteriori Probability (MAP), a Soft-Out Viterbi Algorithm (SOYA) may be used as the decoding algorithm of each TCM decoder included in the TCM decoder 5012.

The data demultiplexer 5013 identifies the soft-decision values corresponding mobile service data symbols (i.e., including RS parity data added when performing RS frame encoding, and CRC data symbols) from the output of the TCM decoder 5012, thereby outputting the identified soft-decision values to the symbol deinterleaver 5014. At this point, the data demultiplexer 5013 oerfirms an inverse process of process reordering of a mobile service data symbol generated from an intermediate step, wherein the output symbols outputted from the block processor of the transmitting system are being inputted to the trellis encoding module (e.g., when the symbols pass through the group formatter, the data deinterleaver, the packet formatter, and the data interleaver). Thereafter, the data demultiplexer 5013 performs reordering of the process order of soft decision values corresponding to the mobile service data symbols and, then, outputs the processed mobile service data symbols to the symbol deinterleaver 5014.

This is because a plurality of blocks exist between the block processor and the trellis encoding module, and because, due to these blocks, the order of the mobile service data symbols being outputted from the block processor and the order of the mobile service data symbols being inputted to the trellis encoding module are not identical to one another. More specifically, the data demultiplexer 5013 reorders (or rearranges) the order of the mobile service data symbols being outputted from the outer TCM decoder 5012, so that the order of the mobile service data symbols being inputted to the symbol deinterleaver 5014 matches the order of the mobile service data symbols outputted from the block processor of the transmitting system. The reordering process may be embodied as one of software, middleware, and hardware.

The symbol deinterleaver 5014 performs symbol deinterleaving on the soft decision values of data symbols being reordered and outputted from the data demultiplexer 5013 as an inverse process of the symbol interleaver included in the transmitting system. The size of the SCCC block being used by the symbol deinterleaver 5014, during the symbol deinterleaving process, is identical to the interleaving size (i.e., B) of an actual symbol of the symbol interleaver included in the transmitting system. This is because turbo decoding is performed between the TCM decoder 5012 and the symbol decoder 5015.

The input and output of the symbol interleaver 5014 all corresponds to soft-decision values, and the deinterleaved soft-decision values are outputted to the symbol decoder 5015.

The symbol decoder 5015 has 4 memory states. If the symbol decoder is in a ½ coding rate mode, the memory states are changed in accordance with an input LLR set respective to a symbol. More specifically, in case of data being ½-rate encoded and outputted, the output LLR of the symbol deinterleaver 5014 is directly outputted to the symbol decoder 5015.

However, if the symbol decoder is in a ¼ coding rate mode, i.e., in case of data being ¼-rate encoded and outputted from the symbol encoder of the transmitting system, the memory states are changed in accordance with 2 input LLR sets respective to 2 successive symbols. Therefore, 2 input LLR sets should be merged into one LLR set during the input stage of the symbol decoder 5015. In the present invention, the merged LLR set may be obtained by adding first input LLRs and second input LLRs. If Li(x) is defined as an input LLR value having a condition of 'x', the merged LLR set may be expressed by using Equation 8 shown below.

$$Li(\text{merged nibble}='0000')=Li(\text{first symbol}='00')+Li(\text{second symbol}='00')$$

$$Li(\text{merged nibble}='0001')=Li(\text{first symbol}='00')+Li(\text{second symbol}='01')$$

$$Li(\text{merged nibble}='0010')=Li(\text{first symbol}='00')+Li(\text{second symbol}='10')$$

$$Li(\text{merged nibble}='0011')=Li(\text{first symbol}='00')+Li(\text{second symbol}='11')$$

$$Li(\text{merged nibble}='0100')=Li(\text{first symbol}='01')+Li(\text{second symbol}='00')$$

$$Li(\text{merged LLR}='1111')=Li(\text{first symbol}='11')+Li(\text{second symbol}='11') \quad \text{Equation 8}$$

Meanwhile, as the opposite of the input LLR processing, the processing of the LLR that is to be outputted from the symbol decoder 5015 is divided into 2 symbol LLRs in the ¼-code rate mode, as shown in Equation 9 below, thereby being outputted.

$$Lo(\text{first symbol}='00')=\text{Maximum Probability whose LLR is from the sets } \{Lo(\text{merged nibble}='00XY')+\text{Delta}\}$$

$$Lo(\text{first symbol}='01')=\text{Maximum Probability whose LLR is from the sets } \{Lo(\text{merged nibble}='01XY')+\text{Delta}\}$$

$$Lo(\text{first symbol}='10')=\text{Maximum Probability whose LLR is from the sets } \{Lo(\text{merged nibble}='10XY')+\text{Delta}\}$$

$$Lo(\text{first symbol}='11')=\text{Maximum Probability whose LLR is from the sets } \{Lo(\text{merged nibble}='00XY')+\text{Delta}\}$$

$$Lo(\text{second symbol}='00')=\text{Maximum Probability whose LLR is from the sets } \{Lo(\text{merged nibble}='XY00')+\text{Delta}\}$$

$$Lo(\text{second symbol}='01')=\text{Maximum Probability whose LLR is from the sets } \{Lo(\text{merged nibble}='XY01')+\text{Delta}\}$$

$$Lo(\text{second symbol}='10')=\text{Maximum Probability whose LLR is from the sets } \{Lo(\text{merged nibble}='XY10')+\text{Delta}\}$$

$$Lo(\text{second symbol}='11')=\text{Maximum Probability whose LLR is from the sets } \{Lo(\text{merged nibble}='XY00')+\text{Delta}\} \quad \text{Equation 9}$$

Herein, X and Y are the arbitrary selected digits from digit 0 or 1. Also, according to an embodiment of the present invention, a correction term 'Delta' value is calculated from an IETF RFC 3926 "FLUTE—File Delivery over Unidirectional Transport".

At this point, the symbol decoder 5015 output 2 types of soft-decison values. One corresponds to a soft-decision value being matched with an output symbol of the symbol decoder (hereinafter referred to as a first soft-decision value). And, the other corresponds to a soft-decision value being matched with an input symbol of the symbol decoder (hereinafter referred to as a second soft-decision value). The first soft-decision value represents a reliability of the output symbol, i.e., two bits, of the symbol encoder. And, a Log Likelihood Ratio (LLR) between the likelihood (or probability) of one bit being '1' and the likelihood (or probability) of another bit being '0' may be respectively outputted (bit-unit output) for the upper bit and the lower bit, which configure a symbol. Alternatively, a log likelihood ratio of the likelihood value of 2 bits, i.e., one symbol being "00", "01", "10", and "11" may be outputted (symbol-unit output) for all combinations. The first soft-decision value is fed-back to the TCM decoder 5012 through the symbol interleaver 5016 and the data multiplexer 5017. The second soft-decision value represents a reliability of the input symbol of the symbol encoder of the transmitting system. Herein, the second soft-decision value is expressed as a Log Likelihood Ratio (LLR) between the likelihood (or probability) of one bit being '1' and the likelihood (or probability) of another bit being '0', thereby being outputted to the RS frame decoder 1304. Herein, a Maximum A posteriori Probability (MAP), a Soft-Out Viterbi Algorithm (SOVA) may be used as the decoding algorithm of the symbol decoder 5015.

At this point, when the first soft-decision value being outputted from the symbol decoder 5015 is in a ¼ coding rate mode, the first soft-decision value is divided into 2 symbol LLRs, as shown in Equation 9, so as to be outputted to the symbol interleaver 5016.

For example, when the input/output unit of the symbol decoder 5015 corresponds to symbol units, 16 ($2^4$=16) different types of soft-decision values (LLRs) are inputted to the symbol decoder 5015. At this point, the 16 ($2^4$=16) different types of soft-decision values (i.e., LLRs) being inputted to the symbol decoder 5015 correspond to results of adding the respective first input LLR and the respective second input LLR.

If ¼-rate coding is performed by the symbol encoder, the symbol decoder 5015 receives the LLR respective to the 16 different symbols and performs symbol decoding. Thereafter, the symbol decoder 5015 may output the LLR respective to the 16 different symbols as the first soft-decision value. Alternatively, the symbol decoder 5015 may receive the LLR respective to 4 bits and performs symbol decoding. Thereafter, the symbol decoder 5015 may output the LLR respective to the 4 bits as the first soft-decision value.

And, if ½-rate coding is performed by the symbol encoder, the symbol decoder 5015 receives the LLR respective to the 4 different symbols and performs symbol decoding. Thereafter, the symbol decoder 5015 may output the LLR respective to the 4 different symbols as the first soft-decision value. Alternatively, the symbol decoder 5015 may receive the LLR respective to 2 bits and performs symbol decoding. Thereafter, the symbol decoder 5015 may output the LLR respective to the 2 bits as the first soft-decision value.

Figure 32:
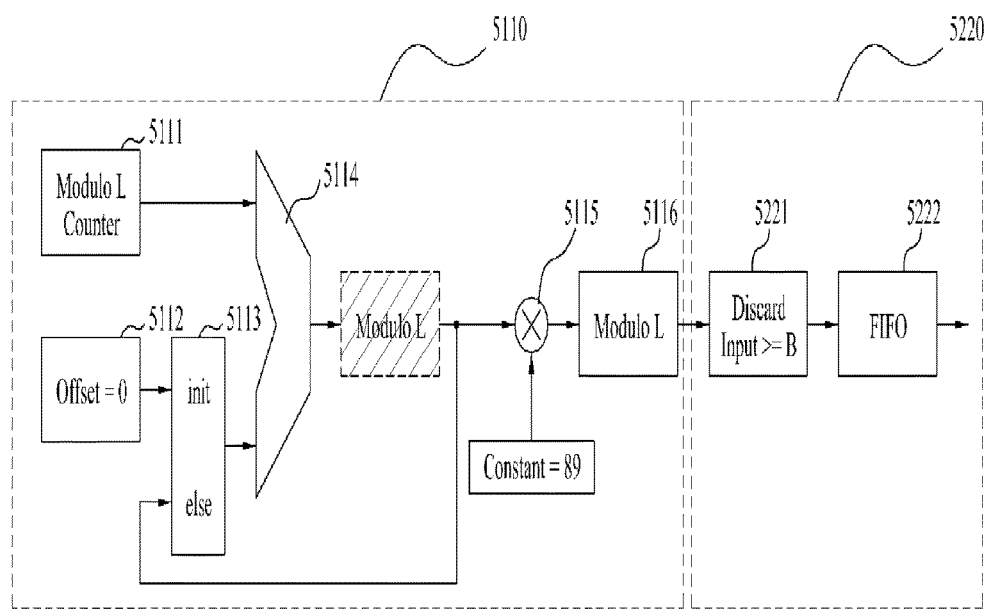
FIG. 32 is a block diagram illustrating a pattern generator of a symbol interleaver according to an embodiment of the present invention.

According to an embodiment of the present invention, the symbol interleaver 5016 performs symbol interleaving on the first soft-decision value being outputted from the symbol decoder 5015, as shown in FIG. 32, thereby outputting the symbol-interleaved first soft-decision value to the data multiplexer 5017. Herein, the output of the symbol interleaver 5020 also becomes a soft-decision value. According to another embodiment of the present invention, the symbol interleaver 5016 performs symbol interleaving on the first soft-decision value being outputted from the symbol decoder 5015, as shown in FIG. 32, thereby outputting the symbol-interleaved first soft-decision value to the data multiplexer 5017.

If the SCCC block mode is '00', a data group is configured of 10 SCCC blocks. And, if the SCCC block mode is '01', a data group is configured of 5 SCCC blocks. At this point, the symbol interleaving pattern of the 15 SCCC blocks are different from one another. Therefore, in order to store all symbol interleaving patterns, a memory having a very large capacity (e.g., ROM) is required. FIG. 32 illustrates a block view showing the structure of a symbol interleaver according to the present invention, wherein the symbol interleaver can perform symbol interleaving without requiring a memory, such as ROM. More specifically, when the SCCC block is inputted, symbol interleaved data may be directly outputted without having to use a memory, such as ROM.

The symbol interleaver 5016 of FIG. 32 includes a pattern generator 5110 and a pattern output unit 5220. The pattern generator 5110 may include a modulo counter 5111, a multiplexer 5113, an accumulator 5114, a multiplier 5115, and a modulo operator 5116. The pattern output unit 5220 may include a data remover 5221 and a buffer 5222. Herein, a modulo operation may be further included between the accumulator 5114 and the multiplier 5115. Also, the multiplier 5115 may be configured of multiple adders (or shifters).

In FIG. 32, B represents a Block length in symbols (e.g., SCCC block length) being inputted for symbol interleaving. And, L corresponds to a symbol unit block length actually being interleaved y the symbol interleaver 5016. At this point, L=2m (wherein m is an integer), wherein L should satisfy the condition of L≥B.

The modulo counter 5111 performs sequential counting starting from 0 to L. The accumulator 5114 receives a count value of the modulo counter 5111 starting from 0. The multiplexer 5113 selects a constant when starting the symbol interleaving process on an SCCC block. Thereafter, the multiplexer 5113 is fed-back with the output of the accumulator 5114, thereby outputting the feedback to the accumulator 5114. In this case, an initial offset value of symbol interleaving is equal to 0.

The accumulator 5114 adds the output of the modulo counter 5111 and the output of the multiplexer 5113 and, then outputs the added value to the multiplier 5113.

The multiplier 5115 multiplies the output of the accumulator 5114 by a constant 89, thereby outputting the multiplied result to the modulo operator 5116. The modulo operator 5116 performs a modulo L operation on the output of the multiplier 5115, thereby outputting the processed data to the pattern output unit 5220. According to an embodiment of the present invention, the modulo operator 5116 uses a bitwise mask function to perform the modulo L operation. For example, when the L value is equal to 210, and when only the lower 10 bits among the output of the multiplier 5115 are outputted from the modulo operator 5116 and inputted to the pattern output unit 5220, the modulo L operation is performed.

When the output value is equal to or greater than B, the data remover 5221 of the pattern output unit 5220 discards the input value and outputs the processed data to the buffer 5222. According to an embodiment of the present invention, the buffer 5222 is configured to have a First Input First Output (FIFO) structure. The buffer 5222 condenses the remaining values that have not been discarded by the data remover 5221 and then stores the condensed values, which are then outputted in accordance with the stored order. Therefore, the first output B outputted from the buffer 5222 corresponds to the symbol interleaving pattern P(i). At this point, the index i value of the symbol interleaving pattern P(i) increases from 0 to B−1. If the modulo counter 5111 continues to be operated, and when the next output B is collected from the buffer 5222, the symbol interleaving pattern at this point becomes the inverse order of the symbol interleaving pattern P(i). More specifically, the index i value of the symbol interleaving pattern P(i) decreases from B−1 to 0.

Therefore, when the initial offset is set to an L/2 value and not to '0', and when symbol interleaving is started, the first B output becomes an inverse order of the interleaving pattern P(i). In this case, the initial offset value of symbol interleaving becomes an L/2 value.

If 0 is used as the initial offset value, the Lth value being fed-back from the accumulator 5114 becomes (L−1)*L/2, and the modulo L of the feedback value is L/2.

For example, when the initial offset value is set to 0, the symbol interleaving pattern P(i) may be obtained. And, when the initial offset value is set to an L/2 value, an inverse order of the interleaving pattern P(i), i.e., a symbol deinterleaving pattern P(i)−1 may be obtained from the beginning. For example, when the symbol deinterleaver 5014 sets an L/2 value as the initial offset value, and when the symbol interleaver 5016 sets '0' as the initial offset value, only one symbol interleaving pattern P(i) is used to performed both the symbol deinterleaving and symbol interleaving processes.

Alternatively, when only one initial offset is set, and when the modulo operator 5111 performs a counting process up to 2 L, a symbol interleaving pattern and a symbol deinterleaving pattern may be generated by using a single initial offset.

FIG. 33 illustrates an example of a symbol interleaving pattern generated when the offset value is equal to 0 according to the present invention. In the example shown in FIG. 33, L is equal to 12000, and the SCCC block length is equal to 16384. Herein, the output pattern in an index starting from 12000 to 23999 corresponds to an inverse order of the output pattern in an index starting from 0 to 11999.

Also, since interleaving and deinterleaving are inverse processes of one another, the interleaving pattern P(i) and the deinterleaving pattern P(i)−1 are not required to be separately generated by the block decoder 1303. More specifically, symbol interleaving and deinterleaving operations may both be performed by using only the symbol interleaving pattern P(i).

Figure 34:
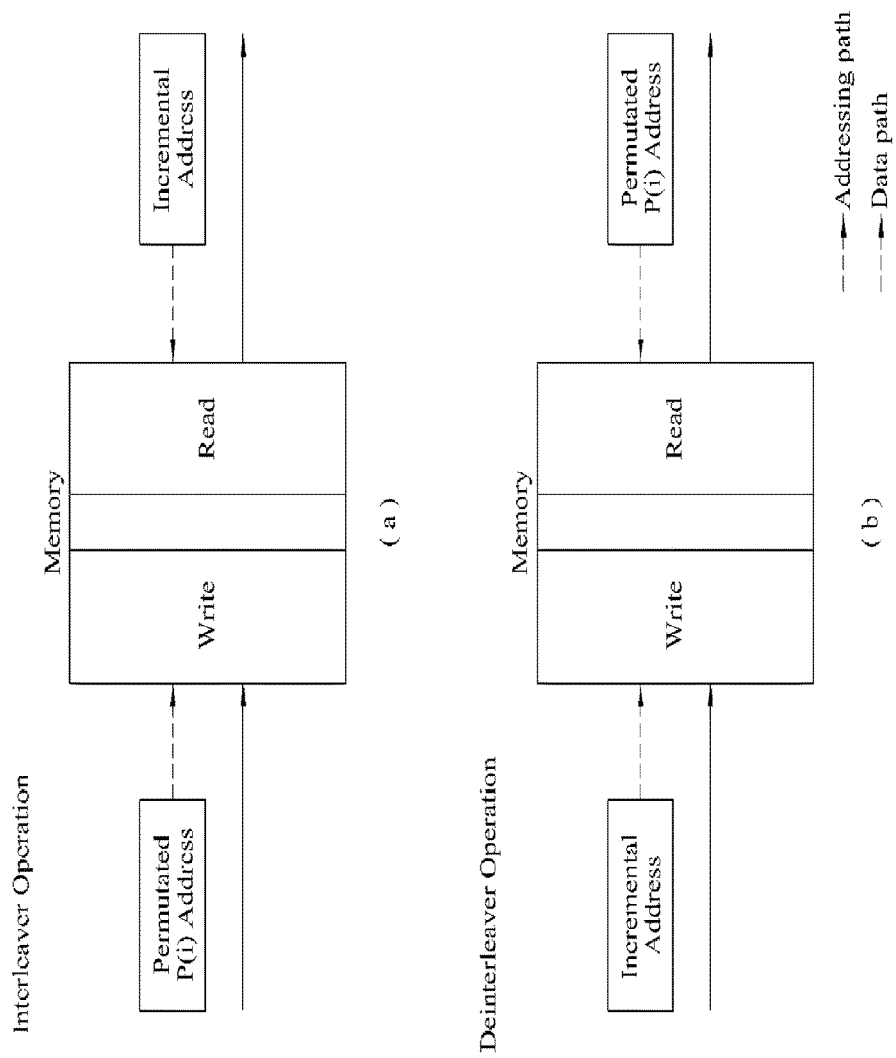
FIG. 34 is a conceptual diagram illustrating a process for performing the symbol interleaving using only a symbol interleaving pattern P(i) according to an embodiment of the present invention.

(a) of FIG. 34 shows an exemplary process of performing symbol interleaving by using only the symbol interleaving pattern P(i). And, (b) of FIG. 34 shows an exemplary process of performing symbol deinterleaving by using only the symbol interleaving pattern P(i).

In (a) of FIG. 34, the symbol interleaving process is as described below.

1a. An interleaving pattern P(i) is generated.

1b. The ith input data symbol is written in location i of the memory.

1c. Starting from location i of the memory, an ith output data symbol is read.

When the processes 1a to 1c are performed from 0 to B−1, the symbol interleaving process for one SCCC block is completed. Herein, the memory may correspond to a buffer 5222.

In (b) of FIG. 34, the symbol deinterleaving process is as described below.

2a. An interleaving pattern P(i) is generated.

2b. The ith input data symbol is written in location i of the memory.

2c. Starting from location P(i) of the memory, an ith output data symbol is read.

When the processes 2a to 2c are performed from 0 to B−1, the symbol deinterleaving process for one SCCC block is completed. Herein, the value of i ranges from 0 to B−1.

More specifically, in (a) and (b) of FIG. 34, step 1b and step 2c access the same address of the memory, and step 1c and step 2b access the same address of the memory.

Therefore, after reading previous data starting from a specific location (or position) of the memory, when current data are written in the corresponding location (or position), the symbol interleaver 5016 and the symbol deinterleaver 5014 may use a single permutation memory so as to perform symbol interleaving and symbol deinterleaving. More specifically, since an address of the memory can be shared during the symbol interleaving and symbol deinterleaving processes, the memory size may be reduced.

As described above, in the present invention, only one symbol interleaving pattern is used to perform symbol interleaving and symbol deinterleaving, thereby having the effect of reducing the memory size.

More specifically, the data multiplexer 5017 of the block decoder 1303 reorders (or rearranges) the output order of the symbol interleaver 5016 in accordance with the processing order of the symbol generated from an intermediate step (e.g., the group data formatter, the packet formatter, the data interleaver). Thereafter, the data multiplexer 5017 outputs the processed symbols to the TCM decoder 5012. Herein, the reordering process of the data multiplexer 5017 may be embodied as at least one of software, middleware, and hardware.

The soft-decision values being outputted from the symbol interleaver 5016 are matched to be in a one-to-one correspondence with mobile service data symbol positions corresponding to the number of SCCC blocks being outputted from the input buffer 5011. Then, the matched soft-decision values are inputted to the TCM decoder 5012. At this point, since a main service data symbol or an RS parity symbol, known data symbol, signaling information data, and so on, of the main service data do not correspond to mobile service data symbols, the data multiplexer 5017 inserts null data in the corresponding location (or position), thereby outputting the processed data to the TCM decoder 5012. Also, each time the symbols of the SCCC blocks are turbo-decoded, since there is no value being fed-back from the symbol interleaver 5016 at the beginning of the first decoding process, the data multiplexer 5017 inserts null data in all symbol positions including a mobile service data symbol, thereby transmitting the processed data to the TCM decoder 5012.

The second soft-decision values being outputted from the symbol decoder 5015 are inputted to the RS frame decoder 1304. For example, the symbol decoder 5015 does not output any second soft-decision value until turbo decoding is performed for a predetermined number of repetition (or iteration) times (e.g., M number of times). Thereafter, when M number of turbo-decoding processes on one SCCC block is all performed, the second soft-decision value of that specific point is outputted to the RS Frame decoder 1304. More specifically, after performing turbo-decoding for a predetermined number of times, the soft decision value of the symbol decoder 5015 is outputted to the RS frame decoder 1304. And, thus, the block decoding process on one SCCC block is completed.

In the present invention, this will be referred to as an iterative turbo decoding process for simplicity.

At this point, the number of iterative turbo decoding performed between the TCM decoder 5012 and the symbol decoder 5015 may be defined by considering hardware complexity and error correction performance. Accordingly, when the number of iterative turbo decoding increases, the error correction can be enhanced. However, this case disadvantageous in that the hardware may also increase.

RS Frame Decoder

Figure 35:
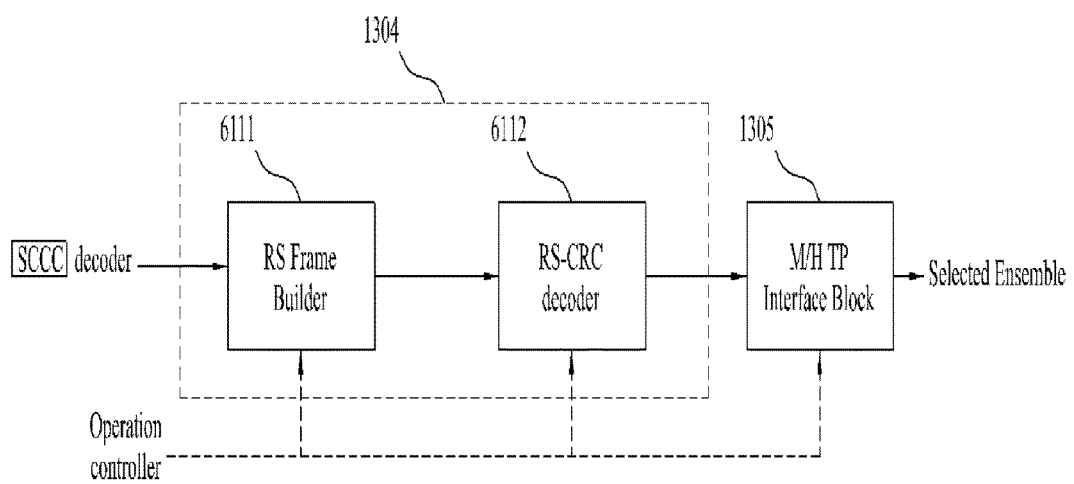
FIG. 35 illustrates a structure of a Reed Solomon (RS) frame decoder according to an embodiment of the present invention.

FIG. 35 illustrates a structure of an RS frame decoder according to an embodiment of the present invention.

RS frame decoder includes RS Frame builder 6111, RS-CRC Decoder 6112 and M/H TP Interface block 1305.

As shown in FIG. 35, an RS Frame decoder processes a particular M/H ensembleEnsemble selected by upper layer request. An RS Frame Builder collects data from the selected Ensemble and builds an RS frame corresponding to the selected Ensemble. An RS-CRC decoder detects and corrects errors in the completed RS frame. An M/H TP interface block derandomizes the data to undo the effects of the M/H randomizer at the transmitter, and finally outputs M/H TPs.

A RS Frame Decoder builds an RS Frame, detects errors on each row of the RS frame by CRC decoding, corrects errors by erasure RS decoding with error location information from CRC decoding and SCCC decoding on each column of the RS frame, and outputs M/H TPs (Transport Packets) with marked error indication fields.

Figure 36:
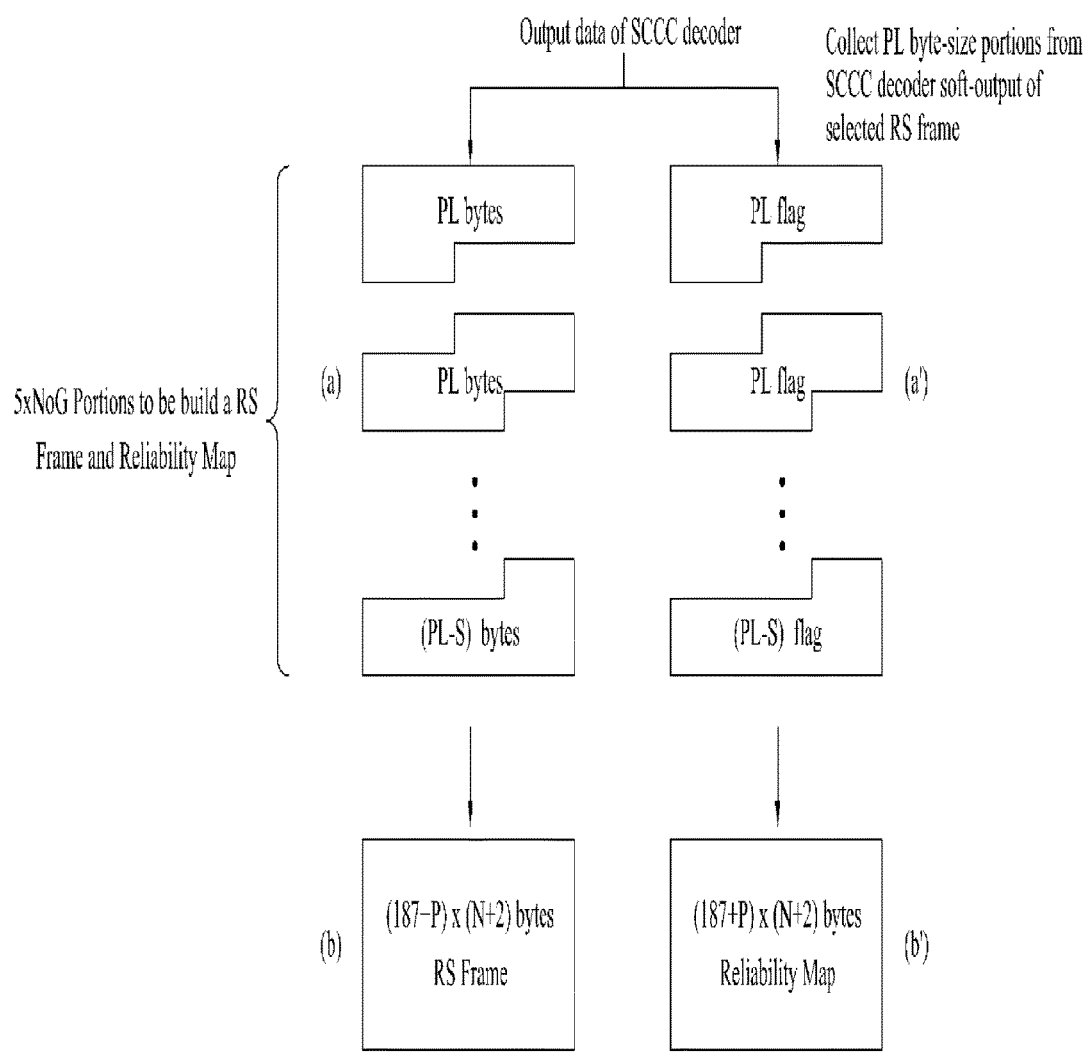
FIG. 36 illustrates, when an RS frame mode value is equal to '00', an exemplary process of grouping several portions being transmitted to a parade, thereby forming an RS frame and an RS frame reliability map.

FIG. 36 illustrates, when the RS frame mode value is equal to '00', an exemplary process of grouping several portion being transmitted to a parade, thereby forming an RS frame and an RS frame reliability map.

More specifically, the RS frame decoder 2006 receives and groups a plurality of mobile service data bytes, so as to form an RS frame. According to the present invention, in transmitting system, the mobile service data correspond to data RS-encoded in RS frame units. At this point, the mobile service data may already be error correction encoded (e.g., CRC-encoded). Alternatively, the error correction encoding process may be omitted.

It is assumed that, in the transmitting system, an RS frame having the size of (N+2)×(187+P) bytes is divided into M number of portions, and that the M number of mobile service data portions are assigned and transmitted to regions A/B/C/D in M number of data groups, respectively. In this case, in the receiving system, each mobile service data portion is grouped, as shown in FIG. 36(a), thereby forming an RS frame having the size of (N+2)×(187+P) bytes. At this point, when stuffing bytes (S) are added to at least one portion included in the corresponding RS frame and then transmitted, the stuffing bytes are removed, thereby configuring an RS frame and an RS frame reliability map. For example, when S number of stuffing bytes are added to the corresponding portion, the S number of stuffing bytes are removed, thereby configuring the RS frame and the RS frame reliability map.

Herein, when it is assumed that the block decoder 1303 outputs a soft decision value for the decoding result, the RS frame decoder 1304 may decide the '0' and '1' of the corresponding bit by using the codes of the soft decision value. 8 bits that are each decided as described above are grouped to create 1 data byte. If the above-described process is performed on all soft decision values of several portions (or data groups) included in a parade, the RS frame having the size of (N+2)×(187+P) bytes may be configured.

Additionally, the present invention uses the soft decision value not only to configure the RS frame but also to configure a reliability map.

Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure one data byte, is determined to be unreliable, the corresponding data byte is marked on the reliability map as an unreliable data byte.

Herein, determining the reliability of one data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the one data byte are determined to be reliable (i.e., when the absolute value of the soft decision values of all 8 bits included in the one data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of (N+2)×(187+P) bytes, the reliability map is also configured to have the size of (N+2)×(187+P) bytes. FIG. 36(*a'*) and FIG. 36(*b'*) respectively illustrate the process steps of configuring the reliability map according to the present invention.

Subsequently, the RS frame reliability map is used on the RS frames so as to perform error correction.

Figure 37:
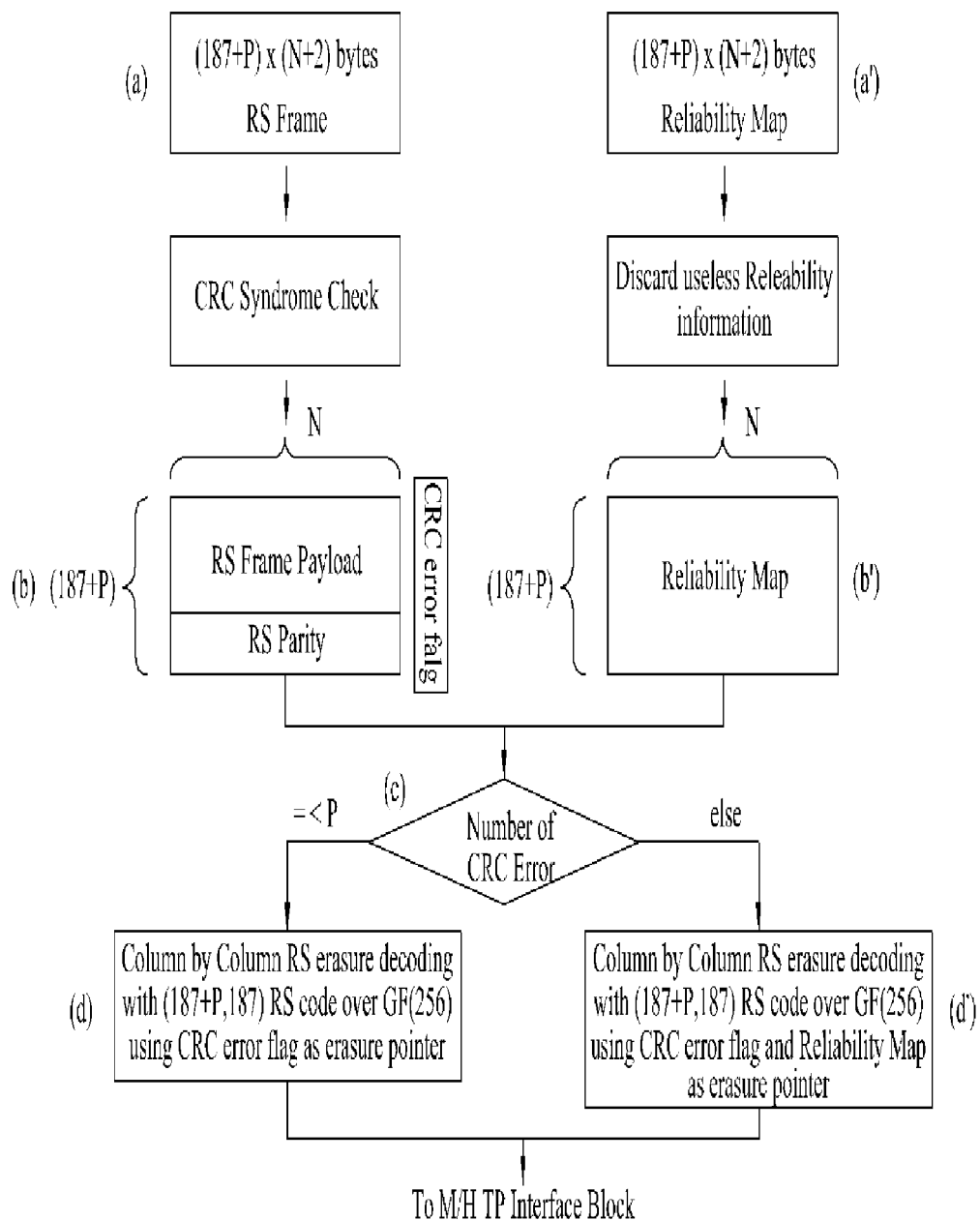
FIG. 37 illustrates an example of an error correction decoding process according to an embodiment of the present invention.
Figure 38:
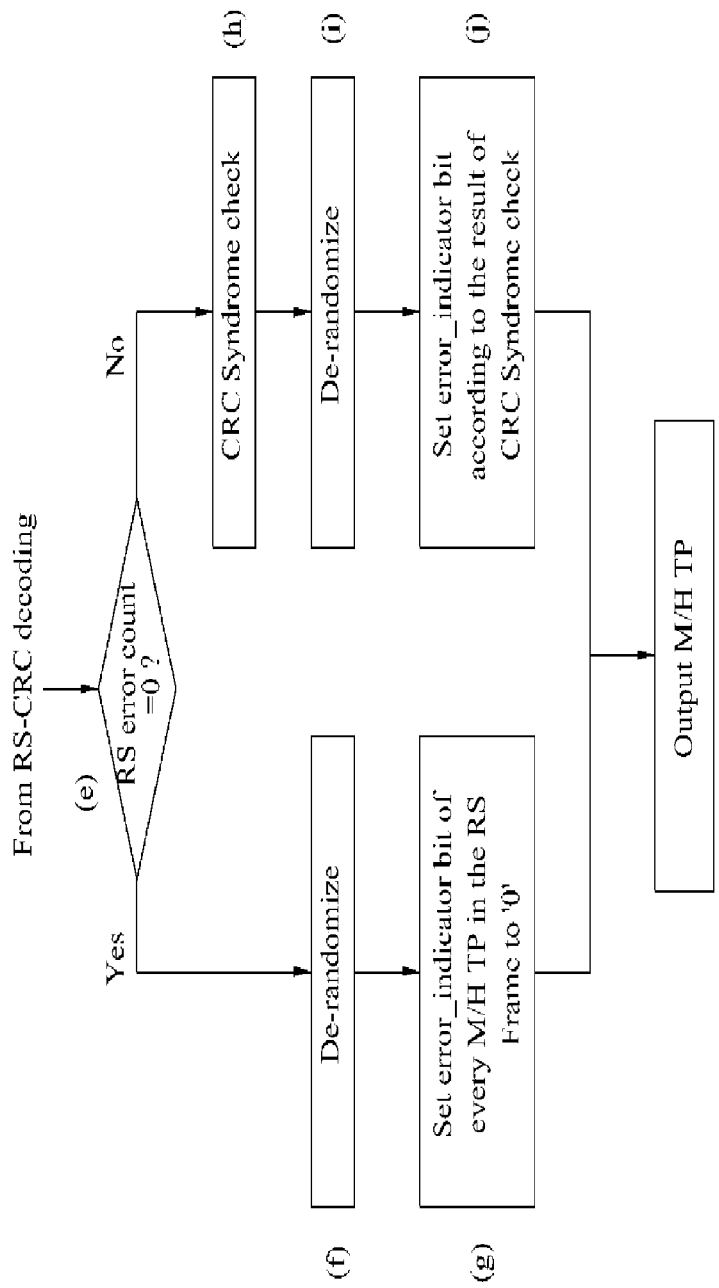
FIG. 38 illustrates an example of an error correction decoding process according to an embodiment of the present invention.

FIG. 37 and FIG. 38 illustrate an error correction decoding process according to an embodiment of the present invention.

According to an embodiment of the present invention, in case of FIG. 37, a CRC syndrome check process is performed once again on the CRC-RS decoded RS frame. And, the result of the CRC syndrome check process is marked in an error_indicator field within each M/H service data packet configuring the payload of the RS frame. Thereafter, the marked result is outputted for A/V decoding. For example, the error_indicator field of the M/H service data packet having an error existing therein is marked as '1', and the error_indicator field of the M/H service data packet having no error existing therein is marked as '0'. According to the embodiment of the present invention, if the error_indicator field value of all M/H service data packets within the RS frame payload is set to '0' and transmitted by the transmitting system, then based upon the CRC syndrome check result, only the error_indicator fields of the M/H service data packet rows are marked as '1'.

Thus, the probability of malfunctioning in blocks receiving and processing M/H service data packets (e.g., M/H TP interface block 1305) in later processes may be reduced. For example, the M/H TP interface block 1305 may discard any M/H service data packet having the error_indicator field marked as '1' without using the corresponding M/H service data packet. Accordingly, since the probability of malfunctioning in the M/H TP interface block 1305 can be reduced, the overall performance of the receiving system may be enhanced.

More specifically, when a (N+2)×(187+P)-byte size RS frame and a (N+2)×(187+P)-bit size RF frame reliability map are configured, as shown in (a) and (a') of FIG. 37, a CRC syndrome check is performed on the RS frame, so as to check whether or not an error has occurred in each row. Subsequently, the presence or absence of an error is marked on a CRC error flag corresponding to each row, as shown in (b) of FIG. 37. At this point, since the portion of the reliability map corresponding to the CRC checksum as no applicability, the corresponding portion is removed (or deleted or discarded), so that only N×(187+P) number of reliability information remains, as shown in (b') of FIG. 37.

As described above, after performing the CRC syndrome check, (187+P, 187)-RS decoding is performed on N number of columns. At this point, RS-decoding is performed on only N number of columns excluding the last 2 columns from the overall (N+2) number of columns because the last 2 columns are configured only of CRC checksum and also because the transmitting system did not perform RS-encoding on the last 2 columns At this point, depending upon the number of errors marked on the CRC error flag, either an erasure decoding process is performed or a general RS-decoding process is performed.

For example, when the number of rows including CRC error is less than or equal to a maximum number of errors correctable by RS erasure decoding (according to the embodiment of the present invention, the maximum number is '48'), (235,187)-RS erasure decoding is performed on the RS frame having (18+P) number of N-byte rows, i.e., the RS frame having 235 N-byte rows in a column direction, as shown in (d) of FIG. 37. However, when the number of rows including CRC error is greater than the maximum number of errors (i.e., 48 errors) correctable by RS erasure decoding, RS erasure decoding cannot be performed. In this case, error correction may be performed through a general RS-decoding process. Herein, the present invention may further enhance the error correcting ability by using the reliability map, which was generated when configuring the RS frame, from a soft decision value.

More specifically, the RS frame decoder compares the absolute value of the soft decision value of the block decoder 1303 with the pre-determined threshold value, so as to determine the reliability of the bit value decided by the code of the corresponding soft decision value. Also, 8 bits, each being determined by the code of the soft decision value, are grouped to form one data byte.

Accordingly, the reliability information on this one data byte is indicated on the reliability map. Therefore, as shown in FIG. 37(c), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points.

Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column.

For example, it is assumed that the number of rows having CRC errors included therein within the RS frame is greater than 48. And, it is also assumed that the number of erasure points decided based upon the reliability information of the reliability map is indicated as 40 erasure points in the first column and as 50 erasure points in the second column. In this case, a (235,187)-RS erasure decoding process is performed on the first column. Alternatively, a (235,187)-RS decoding process is performed on the second column.

As described above, the present invention may apply the process (d) of FIG. 37 or the process (d') of FIG. 37, so as to perform error correction decoding on N number of columns excluding the last 2 columns within the RS frame.

After performing error correction decoding on the N number of columns, the number of RS errors is counted as shown in (e) of FIG. 38

At this point, if an error did not occur in any of the columns, or if all errors have been corrected in process (d) of FIG. 37 or process (d') of FIG. 37, i.e., if the number of RS errors is equal to '0', this indicates that there is no error in the (N+187)-byte RS frame payload configuring the M/H service data packet within the corresponding RS frame. Herein, as shown in (f) of FIG. 38, derandomizing is performed on the (N+187)-byte RS frame payload as an inverse process of the transmitting system. Thereafter, when outputting each M/H service data packet (i.e., M/H TP packet) of the derandomized RS frame payload to the M/H TP interface block 1305, the output is performed by setting the value of the error_indicator field within the M/H service data packet to '0' (i.e., indicating that there is no error), as shown in (g) of FIG. 38. More specifically, the value of the error_indicator field within each of the M/H service data packets configuring the RS frame payload is equally set to '0'.

Meanwhile, even though RS-decoding is performed, errors in N number of columns may all remain without being corrected. In this case, the number of RS errors is not equal to '0'.

In this case, as shown in (h) of FIG. 37, a CRC syndrome check is performed once again on the RS-decoded RS frame, thereby checking once again whether or not an error exists in 187 rows.

The CRC syndrome check is repeated in (h) of FIG. 38 because, although RS-decoding has not been performed on the last 2 columns (i.e., CRC checksum data) of the RS frame, RS-decoding has been performed on the N number of columns including M/H service data packet. Accordingly, the effects (or influence) of the error corrected by RS-decoding may be verified and reflected (or applied).

More specifically, after performing CRC-RS decoding, when the present invention repeats the CRC syndrome check process once again on each row, as shown in (h) of FIG. 38, and derandomizes the RS frame payload processed with CRC syndrome checking, as shown in (i) of FIG. 38, and when the present invention outputs the derandomized RS frame payload, the present invention marks the CRC syndrome check result in the error_indicator field of the M/H service data packet configuring the corresponding row, as shown in (j) of FIG. 38.

For example, when performing the CRC syndrome check once again, if it is determined that there is not CRC error in the RS frame, the value of the error_indicator field within each M/H service data packet of the derandomized RS frame payload is equally set to '0'.

When performing the CRC syndrome check once again, if it is determined that a CRC error exists in a specific row of the RS frame, for example, the second and third rows of the RS frame, the values of the error_indicator field within the second and third M/H service data packets of the derandomized RS frame payload are marked to be equal to '1', and the value of the error_indicator field within the remaining M/H service data packets is equally marked to be equal to '0'.

The present invention is provided with a number (=M) of RS frame decoders aligned in parallel, wherein the number corresponds to the number of parades included in one M/H frame. Herein, the RS frame decoder may be configured by being provided with a multiplexer connected to the input end of each of the M number of RS frame decoders, so as to multiplex a plurality of portions, and a demultiplexer connected to the output end of each of the M number of RS frame decoders.

Signaling Decoding

The signaling decoder 1306 extracts and decodes signaling information (e.g., TPC and FIC information), which was inserted and transmitted by the transmitting system, from the received (or inputted) data. Thereafter, the signaling decoder 1306 provides the decoded signaling information to the block(s) requiring such information.

More specifically, the signaling decoder 1306 extracts and decodes TPC data and FIC data, which were inserted and transmitted by the transmitting system, from the equalized data. Then, the signaling decoder 1306 outputs the TPC data to the operation controller 1307, and the signaling decoder 1306 outputs the FIC data to the FIC processor 1308. For example, the TPC data and the FIC data are inserted in the signaling information region of each data group, thereby being received.

At this point, the signaling information area within the data group may be known by using the known data position information that is outputted from the known sequence detector 1506. The signaling information area corresponds to the area starting from the first segment to a portion of the second segment of M/H block B4 within the data group, as shown in FIG. 4. More specifically, in the present invention, 276 (=207+69) bytes of the M/H block B4 within each data group are allocated to an area for inserting the signaling information. In other words, the signaling information area is configured of 207 bytes corresponding to the first segment of M/H block B4 and of the first 69 bytes of the second segment of M/H block B4. Additionally, the first known data sequence (i.e., first training sequence) is inserted in the last 2 segments of M/H block B3, and the second known data sequence (i.e., second training sequence) is inserted in the second and third segments of M/H block B4. At this point, since the second known data sequence is inserted after the signaling information area and then received, the signaling decoder 1306 may extract and decode signaling information of the signaling information area from the data being outputted from the channel synchronizer 1301 or the channel equalizer 1302.

Figure 39:
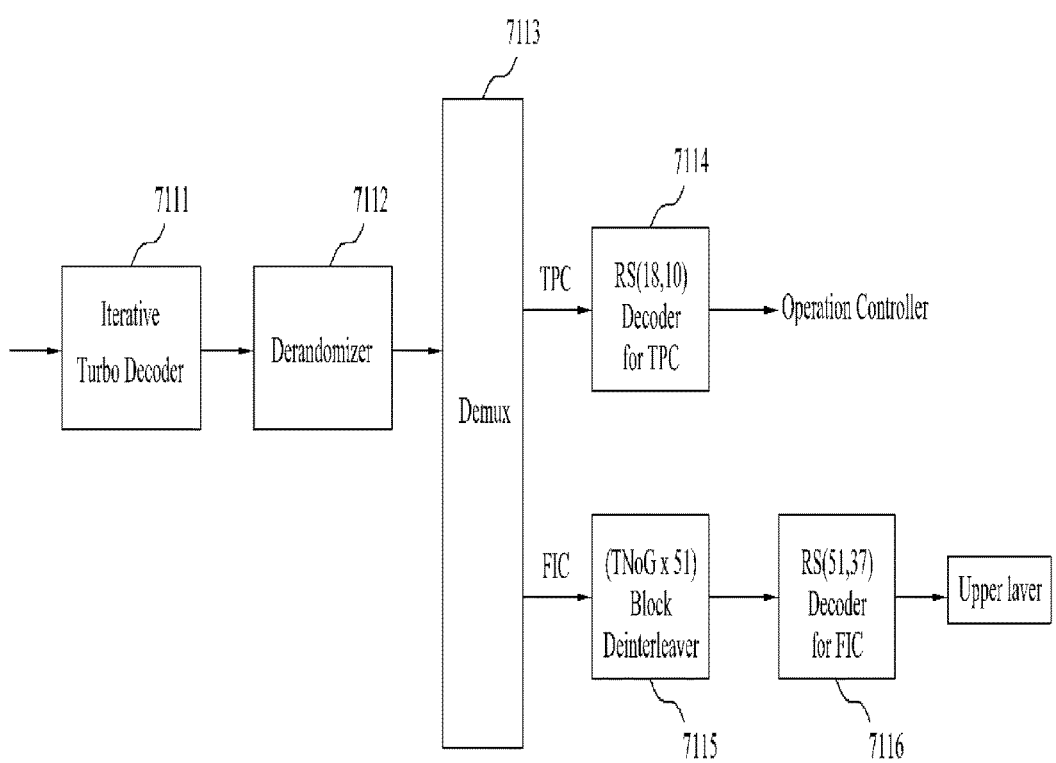
FIG. 39 illustrates a block view of the signaling decoder according to an embodiment of the present invention.

FIG. 39 illustrates a block view of the signaling decoder 1306 according to an embodiment of the present invention. The signaling decoder 1306 performs iterative turbo decoding and RS-decoding on the data of the signaling information region among the equalized data. Thereafter, the transmission parameter (i.e., TPC data) obtained as a result of the above-described process is outputted to the operation controller 1307, and the FIC data are outputted to an upper layer.

For this operation, the signaling decoder 1036 may include an iterative turbo decoder 7111, a derandomizer 7112, a demultiplexer 7113, an RS decoder 7114, a block deinterleaver 7115, and an RS decoder 7116.

Figure 40:
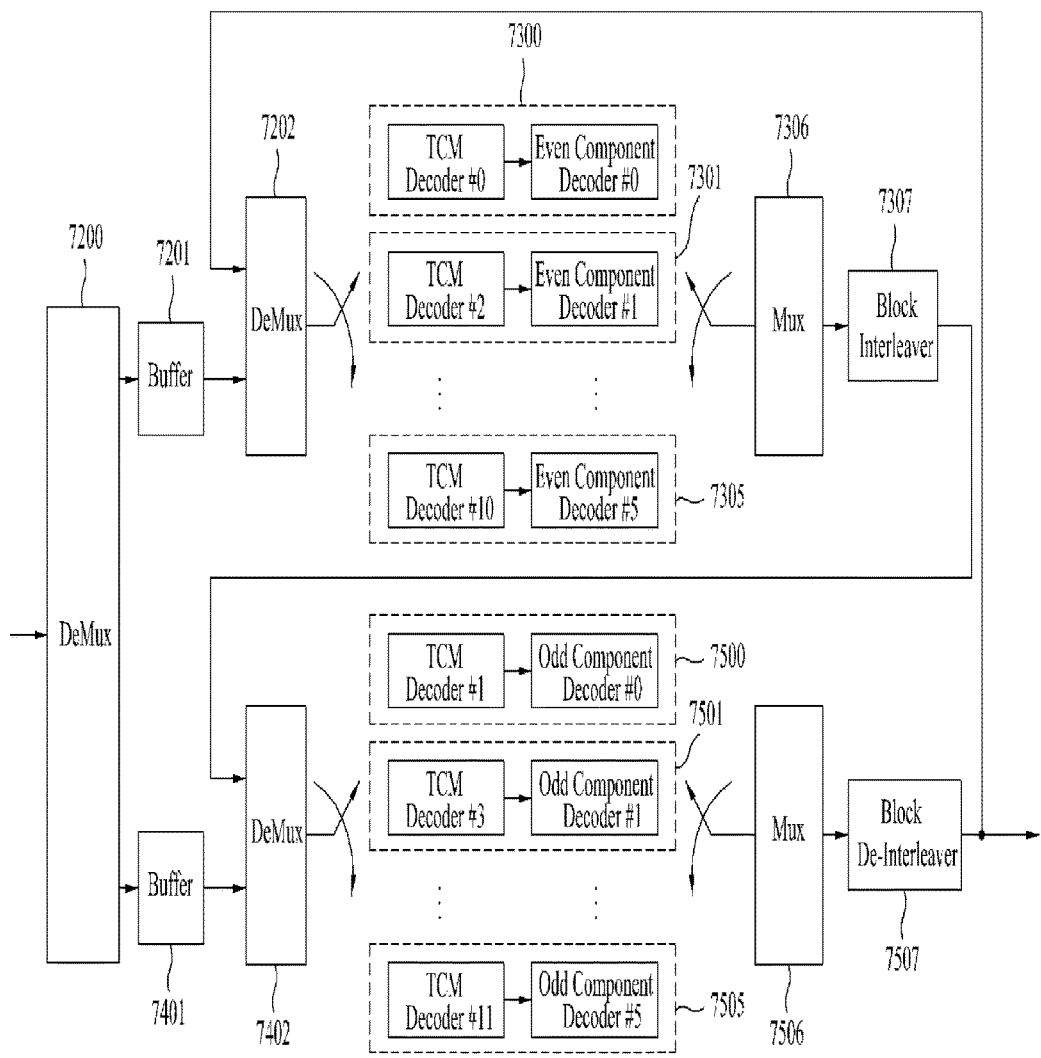
FIG. 40 is a detailed block diagram illustrating an iterative turbo decoder according to an embodiment of the present invention.

FIG. 40 is a detailed block diagram illustrating the iterative turbo decoder 7111. Referring to FIG. 40, upon receiving the signaling information area's data from among the equalized data, a demultiplexer (DeMux) 7200 discriminates symbols corresponding to respective branches of the signaling encoder of the transmission system, and outputs the discriminated symbols to buffers 7201 and 7401, respectively.

The buffers 7201 and 7401 store input data corresponding to the signaling information area, and respectively repeatedly output the stored input data to the demultiplexers 7202 and 7402 during the turbo decoding process.

In accordance with one embodiment of the present invention, it is assumed that output data of the even encoder in the signaling encoder of the transmission system is processed to be input to $0^{th}$, $2^{nd}$, . . . , $10^{th}$ trellis encoders (i.e., even number trellis encoders), and output data of the odd encoder 575 is processed to be input to $1^{st}$, $3^{rd}$, . . . , $11^{th}$ trellis encoders. In this case, the demultiplexer 7202 outputs output data of the buffer 7201 to a trellis decoder (i.e., TCM decoder) corresponding to the even number trellis encoder. The demultiplexer 7202 receives data fed back from the block deinterleaver 7507, and outputs the feed-back data to the same trellis decoder (i.e., TCM decoder) corresponding to the even number trellis encoder.

In this case, output data of each trellis decoder (TCM decoder) corresponds to a log likelihood ratio (LLR) value. The LLR value is a result from taking a logarithm of a soft decision value. More specifically, the LLR value corresponds to a log likelihood ratio (LLR) between a likelihood of input bit being equal to '1' and a likelihood of input bit being equal to '0'. An initial value of the LLR is set to zero. The LLR value is transferred to the even component decoder corresponding to the even component encoder contained in the signaling encoder of the transmission system. Input/output (I/O) data of the even component decoder is such an LLR value as well. In this case, since a single even number trellis decoder interoperates with a single even component decoder, an even component encoder and an even number trellis encoder are considered as a single encoder (effective component encoder). Hence, the even number trellis decoder and the even component decoder can be merged into a single effective component decoder. In the case where the two decoders configure a single decoder, decoding performance will be enhanced although complexity increases due to the increased number of states.

Output signals of the even component decoders 7300 to 7305 are sequentially transferred to the multiplexer 7306 and are then transferred to the block interleaver 7307. The block interleaver 7307 has the same configuration as a block interleaver used for the signaling encoder of the transmitting side.

The LLR value block-interleaved by the block interleaver 7307 is fed back to the demultiplexer 7402. The demultiplexer 7402 outputs the LLR value to a corresponding trellis decoder (i.e., TCM decoder) from among six trellis decoders, and at the same time transmits output data of the buffer 2401 to the trellis decoder. For example, provided that the LLR value fed back from the block deinterleaver 7507 is an LLR value of the first decoder 7500, the demultiplexer 7402 outputs this feed-back LLR value and the output data of the buffer 7401 to the trellis decoder of the first decoder 7500.

The above-mentioned rules are equally applied to the demultiplexer 7202. The odd number trellis decoder and the odd component decoder can be operated in the same manner as in the even number trellis decoder and the even component decoder. Likewise, the odd number trellis decoder and the odd component decoder can be implemented as a single effective component decoder.

Output signals of the odd number decoders 7500 to 7505 are sequentially transferred to the multiplexer 7506, and are then forwarded to the block deinterleaver 7507. The block deinterleaver 7507 is an inverse process of the block interleaver. Thus, the LLR value block-deinterleaved by the block deinterleaver 7507 is input to the demultiplexer 7202 to accomplish the iterative turbo decoding.

After the iterative turbo decoding has been repeatedly performed at a predetermined level, the iterative turbo-decoded result is output to the derandomizer 7112.

At this point, in the above-mentioned iterative turbo decoding process, the even and odd decoders must have trellis diagram information of a corresponding encoder. Each of the encoders shown in FIGS. 41(*a*) and 41(*b*) has five memories D0 to D4 so as to obtain 32 states (i.e., $2^5$ states). However, the number of states acquired when start states of all the signaling information areas are constant may be limited to the number of only some states among a total of 32 states. That is, if it is assumed that a start state of the effective component encoder is limited to a specific state, the effective component encoder may have a smaller number of states as compared to 32 states.

For example, all memories of the even/odd component encoders of the iterative turbo encoder (i.e., PCCC encoder) are each set to zero at the beginning of each signaling information area of a single data group. Because the signaling information area just follows a first known data sequence (i.e., $1^{st}$ training sequence) and the first known data sequence is designed to allow all memories in each of the twelve trellis encoders to have a state of zero at the end of the first known data sequence. As a result, the respective memories of the effective component encoder always start from a state '00000'. That is, all memories of the effective component encoder are each set to a state of zero at the beginning of the signaling information area. In this way, provided that all memories of the effective component encoders in the signaling information area start from the state '00000', the data encoding can be achieved using only specific states among 32 states although data of the signaling information area is considered to be random.

The signaling information area ranges from a first segment of an M/H block 'B4' of a data group to some parts of a second segment thereof. That is, 276 (=207+69) bytes of the M/H block 'B4' of each data group are assigned to an area for inserting signaling information. In other words, the signaling information area is composed of 207 bytes corresponding to a first segment of the M/H block 'B4' and first 69 bytes of a second segment thereof. In addition, the first known data sequence (i.e., the first training sequence) is inserted into the last 2 segments of an M/H block 'B3', and a second known data sequence (i.e., the second training sequence) is inserted into second and third segments of an M/H block 'B4'. In this case, the second known data sequence is located just behind the signaling information area. Third to sixth known data sequences (i.e., third to sixth training sequences) are respectively inserted into the last 2 segments of the M/H blocks B4, B5, B6, and B7.

Figure 41A:
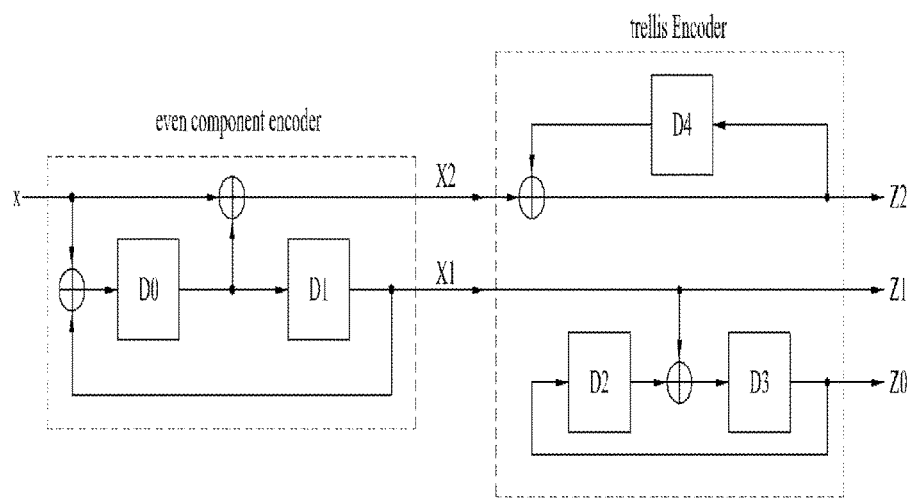
FIG. 41(a) illustrates an exemplary case in which a trellis encoder is serially concatenated with an even component encoder.

FIG. 41(a) illustrates an exemplary case in which a trellis encoder is serially concatenated with the even component encoder.

In fact, although a plurality of blocks are located between the even component encoder and the trellis encoder, the receiving system considers two blocks to be concatenated with each other, so that it decodes data. In other words, the trellis encoder performs precoding on the high-order bit 'X2' generated from the even component encoder, and outputs the precoded result as a most significant bit 'Z2'. In addition, the trellis encoder performs trellis-encoding on the low-order bit 'X1', so that it outputs the trellis-encoded result as two output bits Z1 and Z0.

Figure 41B:
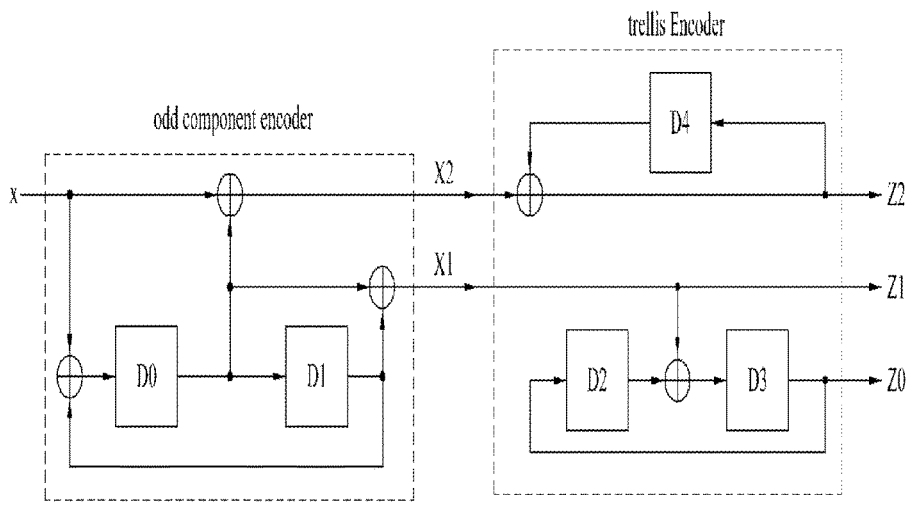
FIG. 41(b) illustrates an exemplary case in which a trellis encoder is serially concatenated with an odd component encoder.

FIG. 41(b) illustrates an exemplary case in which a trellis encoder is serially concatenated with the odd component encoder.

In fact, although a plurality of blocks are located between the even component encoder and the trellis encoder, the receiving system considers two blocks to be concatenated with each other, so that it decodes data. The trellis encoder performs precoding on the high-order bit 'X2' generated from the odd component encoder, and outputs the precoded result as a most significant bit 'Z2'. In addition, the trellis encoder performs trellis-encoding on the low-order bit 'X1', so that it outputs the trellis-encoded result as two output bits Z1 and Z0.

Figure 42:
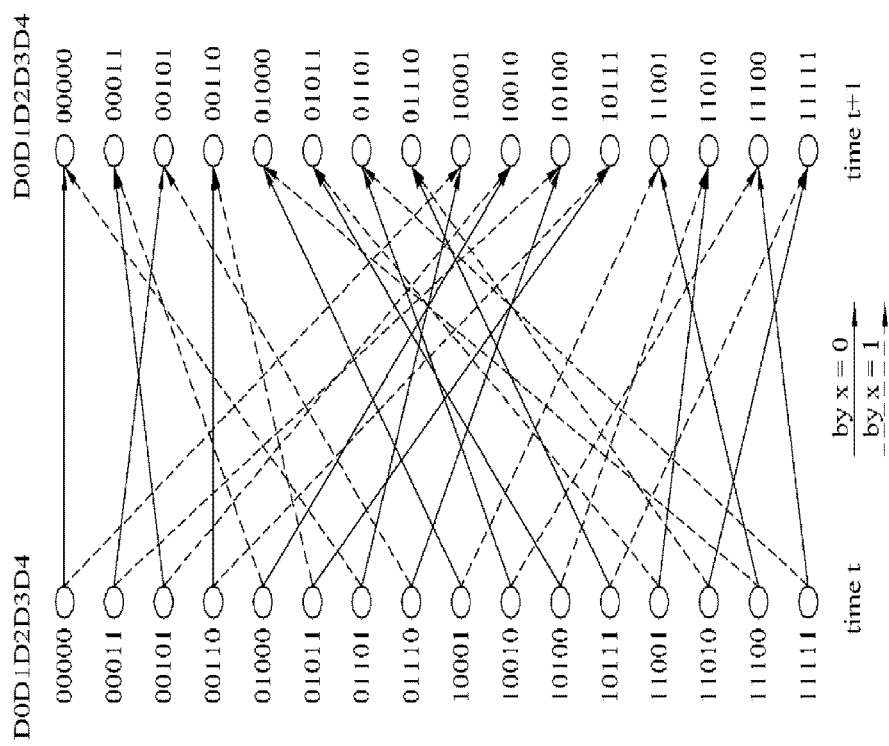
FIG. 42 is a trellis diagram including states capable of being acquired when a start state for an even decoder is set to '00000'.
Figure 43:
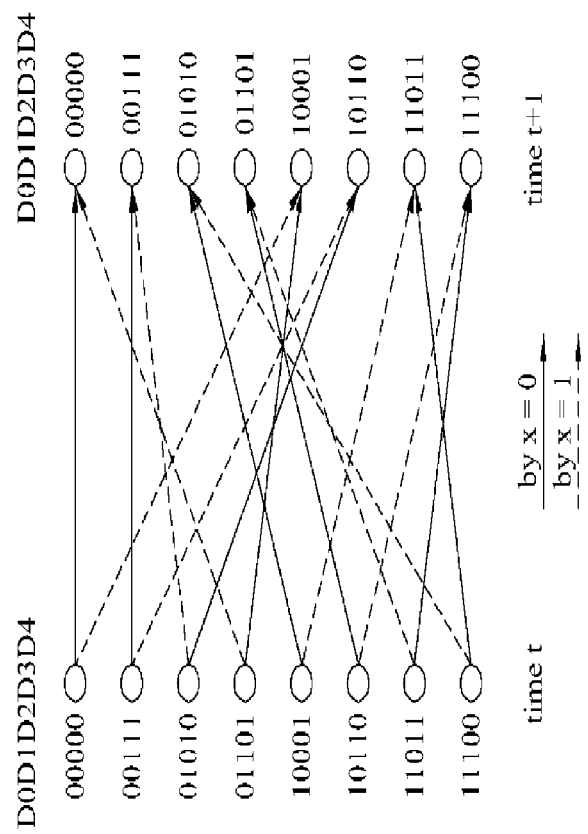
FIG. 43 is a trellis diagram including states capable of being acquired when a start state for an odd decoder is set to '00000'.

FIG. 42 is a trellis diagram including states capable of being acquired when a start state for the even decoder is set to '00000'. FIG. 43 is a trellis diagram including states capable of being acquired when a start state for the odd decoder is set to '00000'

For example, if it is assumed that the even component encoder and the trellis encoder are regarded as a single encoder (i.e., a single effective component encoder) in the same manner as in FIG. 41(a), only 16 states from among 32 states are effective as shown in FIG. 42. For another example, if it is assumed that the odd component encoder and the trellis encoder are regarded as a single encoder (i.e., a single effective trellis encoder) in the same manner as in FIG. 41(b), only 8 states are effective as shown in FIG. 43.

In this way, in the case where the component encoder and the trellis encoder are implemented as a single effective component encoder and then the encoding of data is carried out in the single effective component encoder, the number of states to be selected from among 32 states for the above-mentioned encoding process is changed according to the component encoder structures. In this case, states to be used for the encoding process are changed according to which one of states is used as a start state.

For example, if it is assumed that the odd component encoder and the trellis encoder are regarded as a single effective component encoder in the same manner as in FIG. 41(b), the number of states to be used for the encoding is 8. In addition, if it is assumed that memories of the effective component encoder shown in FIG. 41(b) are designed to always start from the state '00000' in the signaling information area, the above 8 states become '00000', '00111', '01010', '01101', '10001', '10110', '11011', and '11100', respectively.

In this way, since only some states from among a total of states are used when the transmission system encodes data of the signaling information area, the iterative turbo decoder 7111 of the signaling decoder 1306 can perform turbo decoding of data using only the effective states, thereby greatly reducing complexity of the turbo decoder.

Meanwhile, the derandomizer 7112 performs derandomizing of the iterative turbo-decoded data, and outputs the derandomized result to the demultiplexer 7113. The demultiplexer (Demux) 7113 discriminates between TPC data composed of 18 bytes and FIC data composed of 51 bytes on the basis of the derandomized data.

Here, the TPC data is output to the RS decoder 7114 corresponding to an RS (18, 10) of a GF 256. The RS decoder 7114 receives a result of hard decision from the iterative turbo decoder 7111 so as to perform general RS decoding, or the RS decoder 7114 receives the result of soft decision from the iterative turbo decoder 7111 so as to perform RS erasure decoding. TPC data (i.e., transmission parameter information) error-corrected by the RS decoder 7114 is output to the operation controller 1307. In this case, the RS decoder 7114 further transmits the decision result to the operation controller 1307, so that it prevents the occurrence of operational failure which may be generated from misjudgment of the transmission parameter.

Also, since some information of the TPC data is repeatedly transmitted to each group, decoding performance can be improved using such a feature. For example, in case of FEC mode information such as SCCC or RS, since information of next M/H frame is repeatedly transmitted to three sub frames at the rear of one M/H frame, even though decoding is successfully performed once within the three subframes, there is no problem in receiving the next M/H frame.

The FIC data discriminated by the demultiplexer 7113 is output to a (TNoG×51) block deinterleaver 7115. The block deinterleaver 7115 is an inverse process of the (TNoG×51) block interleaver of the signaling encoder of the transmitting side.

For example, the (TNoG×51) block interleaver of the transmitting side is a variable-length block interleaver, and interleaves FIC data contained in each subframe in units of a (TNoG (columns)×51 (rows)) block. In this case, 'TNoG' is indicative of a total number of data groups allocated to a subframe contained in a single M/H frame.

The FIC data block-deinterleaved by the block deinterleaver 7115 is input to the RS decoder 7116 corresponding to the RS (51, 37) of the GF 256. In the same manner as in the RS decoder 7114 for TPC data, the RS decoder 7116 is able to use both the hard decision value and the soft decision value, and FIC data error-corrected by the RS decoder 7116 is output to the FIC processor 1308.

Meanwhile, TNoG value required by the block deinterleaver 7115 can be acquired from the TPC data output from the RS decoder 7114. To this end, the block deinterleaver 7115 includes a controller.

However, since TNoG of next M/H frame is transmitted to three subframes at the rear of one M/H frame, information of TNoG of the current subframe may not be obtained through TPC data decoding. For example, if the broadcast receiver is turned on at the third subframe (sub-frame #2) and starts to perform FIC decoding to obtain channel information, and performs FIC block deinterleaving using TNoG within the TPC data, the broadcast receiver cannot decode the FIC data until it reaches the next M/H frame.

Accordingly, the present invention suggests a method for decoding FIC data by acquiring TNoG even without using RS-decoded TPC data.

Figure 44:
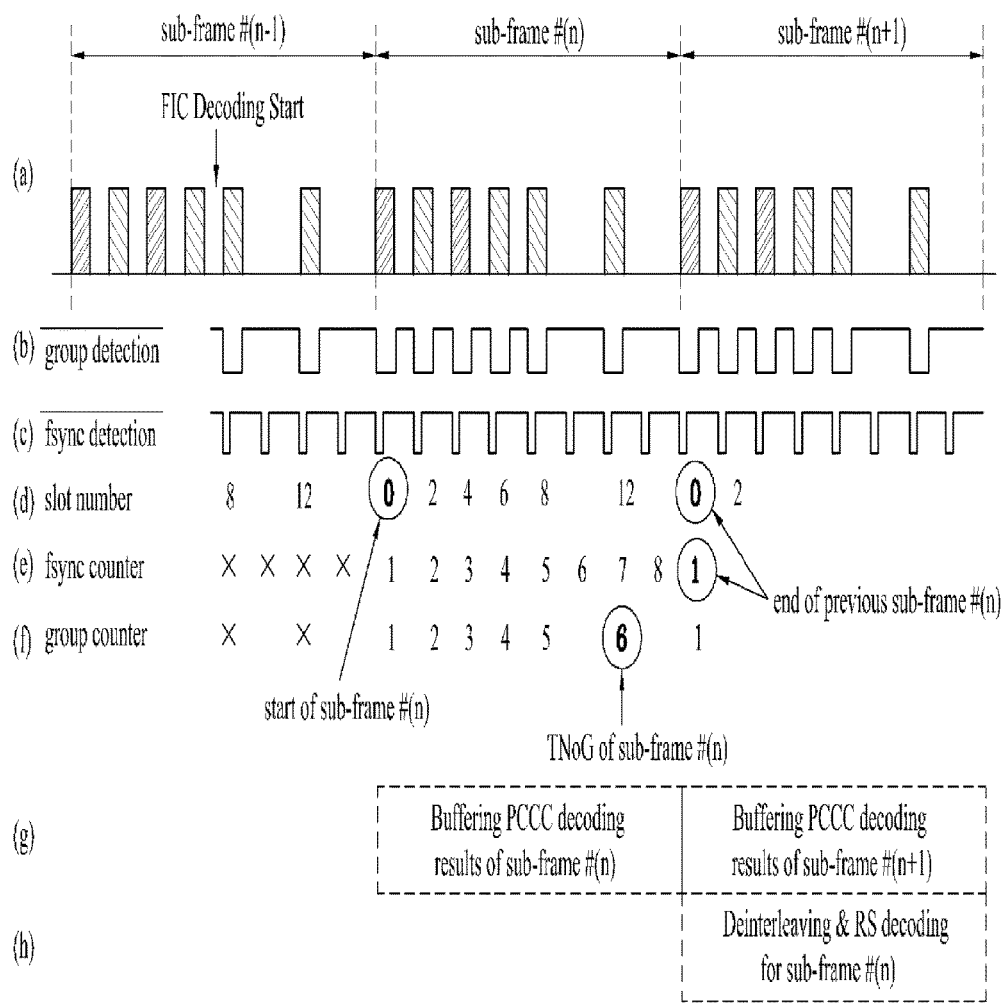
FIG. 44 illustrates a detailed embodiment of a process of extracting a TNoG according to an embodiment of the present invention.

FIG. 44 illustrates a detailed embodiment of a process of extracting TNoG in accordance with the present invention.

The process of acquiring TNoG according to the present invention may be performed by the signaling decoder 1306, or may be performed by the operation controller 1307. According to one embodiment of the present invention, TNoG is acquired by the signaling decoder 1306. In particular, according to one embodiment of the present invention, a controller is provided at the block deinterleaver 7115 within the signaling decoder 1306, and acquires TNoG. This is only one example, and the controller may be provided outside the block deinterleaver 7115.

In other words, if a command to start FIC decoding is input, the signaling decoder 1306 searches start of next subframe. For example, it is supposed that a command to start FIC decoding is input at the middle of the n−1th subframe within one M/H frame as shown in (a) of FIG. 44. In this case, start of the nth subframe is searched.

Namely, if the command to start FIC decoding is input, in order to extract start of the subframe, it is identified whether a data group exists in a corresponding slot. For example, 16 slots are assigned to one subframe. At this time, since known data exist in the data group, it is identified whether the data group exists in the corresponding slot as shown in (b) of FIG. 44 through correlation between a pre-determined pattern of known data and received data. As another example, information as to whether the data group exists in the corresponding slot may be provided from the operation controller 1307.

At this time, if it is identified whether the data group exists in the corresponding slot, the signaling decoder 1306 performs turbo decoding, signaling derandomizing, and demultiplexing for data of the signaling information area within the data group to split TPC data, and performs RS decoding for the split TPC data. Then, the signaling decoder 1306 acquires a slot number from the RS-decoded TPC data as shown in (d) of FIG. 44.

The slot number becomes 0 at a start slot of each sub frame, and has a value of 15 at the last slot of the corresponding subframe. Accordingly, start of the subframe can be identified by using the slot number.

In other words, the signaling decoder 1306 repeatedly performs the signaling decoding process until the slot number having a value of 0 is detected from the TPC data. If the data group within the subframe is assigned and transmitted as shown in (a) of FIG. 44 and the command to start FIC decoding is input at the middle of the n−1th subframe, start of the nth subframe is detected through the signaling decoding process. If the start of the subframe is detected, the group counter value is reset to 0.

If start of the nth subframe is detected through the above process, the signaling decoder 1306 detects a data group from the nth sub frame.

The presence of the data group may be identified using the correlation between the known data pattern and the received data, or may be provided from the operation controller 1307.

If the data group is detected, the group counter value increases by 1 as shown in (f) of FIG. 44. The turbo decoder 7111 and the derandomizer 7112 perform turbo decoding and derandomizing for data of the signaling information area within the data group. Subsequently, the demultiplexer 7113 performs demultiplexing for the derandomized data to split TPC data from FIC data, and the RS decoder 7114 performs RS decoding for the split TPC data. The slot number is acquired from the RS-decoded TPC data. Also, the split FIC data (i.e., 51 bytes) are stored in a buffer (not shown) of the block deinterleaver 7115.

The steps are performed whenever the data group is detected from the subframe to increase the group counter value by 1, and the buffer of the block deinterleaver 7115 stores the split FIC data by the demultiplexer 7113.

This process is performed until the end of the subframe is detected. According to one embodiment of the present invention, the end of the subframe is detected using the slot number such as (d) of FIG. 44. According to another embodiment of the present invention, the end of the subframe is detected using the field synchronizing counter value such as (e) of FIG. 44.

If the end of the subframe is identified, TNoG is calculated using the group counter value.

The TNoG value is applied to the FIC data stored in the buffer of the block deinterleaver 7115 to perform block deinterleaving. The block deinterleaved FIC data are input to the RS decoder 7116 and then RS-decoded by the RS decoder 7116. In case of (g) and (h) of FIG. 44, turbo decoding and derandomizing are performed for the FIC data included in each data group of the nth sub frame for the nth subframe interval and then stored in the buffer of the block deinterleaver 7115. The TNoG calculated is applied to the FIC data of the nth subframe stored in the buffer of the block deinterleaver 7115 to perform block deinterleaving, RS decoding is performed for the block deinterleaved FIC data.

Meanwhile, the end of the subframe may be detected using either the slot number such as (d) of FIG. 44 or the field synchronizing counter value such as (e) of FIG. 44.

In other words, if the slot number acquired from the RS-decoded TPC data becomes 0, it means that a new subframe starts. Accordingly, if the slot number becomes 0, it is determined that the previous subframe has ended. In this case, since the group counter value increases by 1, the value obtained by subtracting 1 from the group counter value becomes the TNoG value.

However, next subframe is the first subframe of new M/H frame, and data group may not exist in next M/H frame due to PRC. Under the circumstances, if the end of the subframe is detected using the slot number, TNoG cannot be identified until M/H frame where data group exists is detected, whereby FIC decoding time may be delayed. In this case, start of the subframe can be determined using the new slot number, and the number of field synchronization values can be counted to identify the end of the subframe. This is because that eight field synchronization values in one subframe and field synchronization values are transmitted regardless of the presence of the data group. For example, if the field synchronization counter value is 8, it is determined as the end of the subframe. In this case, the group counter value becomes the TNoG value. The field synchronization values can also be detected through correlation.

FIG. 45 is a diagram showing the form of a known data sequence according to an embodiment of the present invention.

FIG. 45(a) shows a long known data sequence. In one embodiment, such a long known data sequence may be inserted into a part without interference of main service data in a data group. In a broadcast system, known data is inserted into a specific region of a data group, for reception performance improvement. This known data may be used for carrier synchronization restoration, frame synchronization restoration and channel equalization in a receiver.

FIG. 45(b) shows a segmented known data sequence additionally inserted in an SFCMM.

A broadcast system according to the present invention includes two transmission modes. In a transmission mode which may be defined as a first transmission mode or a core mobile mode (CMM), at least 38 packets of 157 packets which may be transmitted during one slot are reserved for main service data. In a transmission mode which may be defined as a second transmission mode or a scalable full channel mobile mode (SFCMM), less than 38 packets of 157 packets which may be transmitted during one slot are reserved for main service data.

That is, the SFCMM refers to a mode in which all or some of VSB data symbols of a transmission field for broadcast are corrected or extended for mobile reception, in the existing system.

In SFCMM, additional known data is inserted into a data group so as to extend a mobile reception region. Additionally provided known data is not continuously connected due to VSB main data symbol interference according to a transmission mode and is scattered and segmented. For example, known data may be additionally inserted into regions C, D and/or E of a data group and the known data inserted into these regions may be segmented. Additionally inserted known data may have different patterns according to transmission modes and the number of unknown VSB data symbols in a known data period may be changed.

Figure 46:
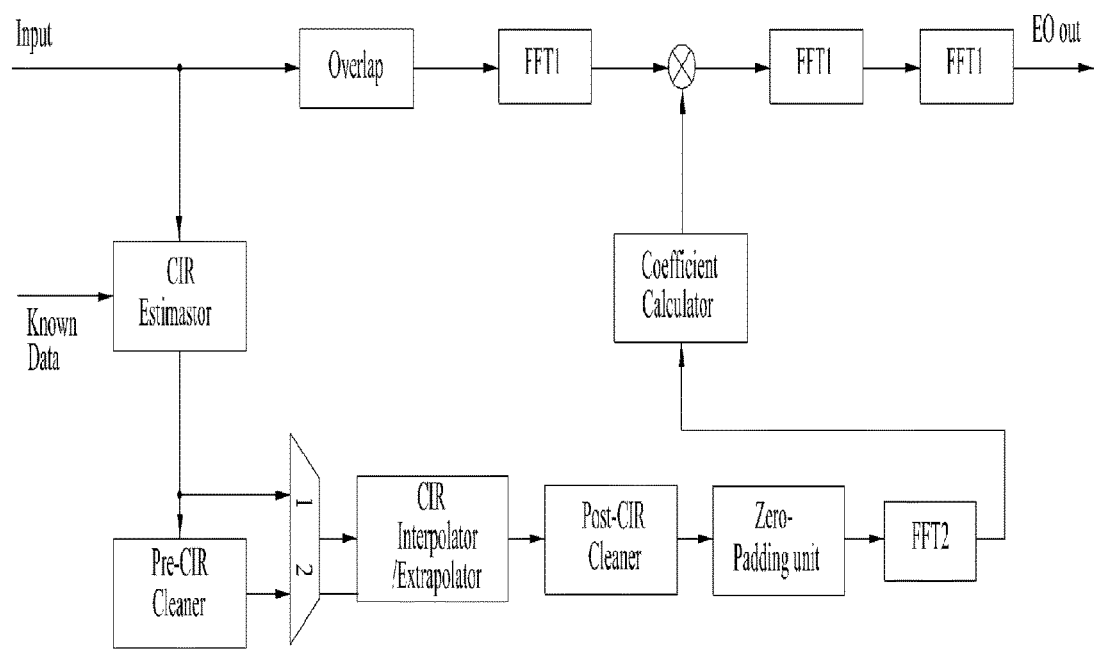
FIG. 46 is a diagram showing the structure of a channel equalizer according to an embodiment of the present invention.

FIG. 46 is a diagram showing the structure of a channel equalizer according to an embodiment of the present invention.

A CIR estimator may estimate a channel impulse response (CIR) using a least squares (LS) method. The LS estimation method obtains a cross correlation value p between known data passing through a channel during a known data period and known data of a receiver and obtains a self correlation value R of the known data. Then, the CIR of a transport channel is estimated by performing a matrix operation of $R^{-1} \cdot p$ so as to eliminate a self correlation portion present in p which is the cross correlation value between the received data and the original known data.

The CIR estimator may estimate the CIR using a least means square (LMS) method. The basic principle of the LMS CIR estimator receives the output of an unknown transport channel and updates a coefficient value of an adaptive filter such that a difference between the output value of this channel and the output value of the adaptive filter is minimized.

The CIR of a data period other than known data may be estimated using interpolation between CIRs obtained in a known data period, and channel equalization is performed by a frequency domain equalizer (FDEQ) so as to obtain equalized data symbols.

As described above, in an SFCMM system, known data which is additionally provided is not continuously connected by an unknown VSB main data symbol according to transmission modes and is scattered and segmented. The VSB main data symbol of the received additional scattered known data period has an unknown value and may not be used as known data. Accordingly, the value of the VSB main data symbol received between known data may be set to 0 and the CIR may then be estimated. However, in this case, a correlation property between the actually received unknown VSB data symbol and the set known data may be very bad and thus channel estimation performance may be deteriorated.

Accordingly, in the embodiment of the present invention, using the basic CIR estimation and FDEQ structure and the iterative structure of a decision device, the value of an unknown VSB data symbol in scattered known data additionally provided in the SFCMM is set to a decided symbol so as to substantially secure the length of a training sequence and to eliminate interference of an unknown data symbol, thereby improving CIR estimation performance.

The description of the other configuration of the channel equalizer is replaced with the description of the structure of the channel equalizer of FIG. 29.

Figure 47:
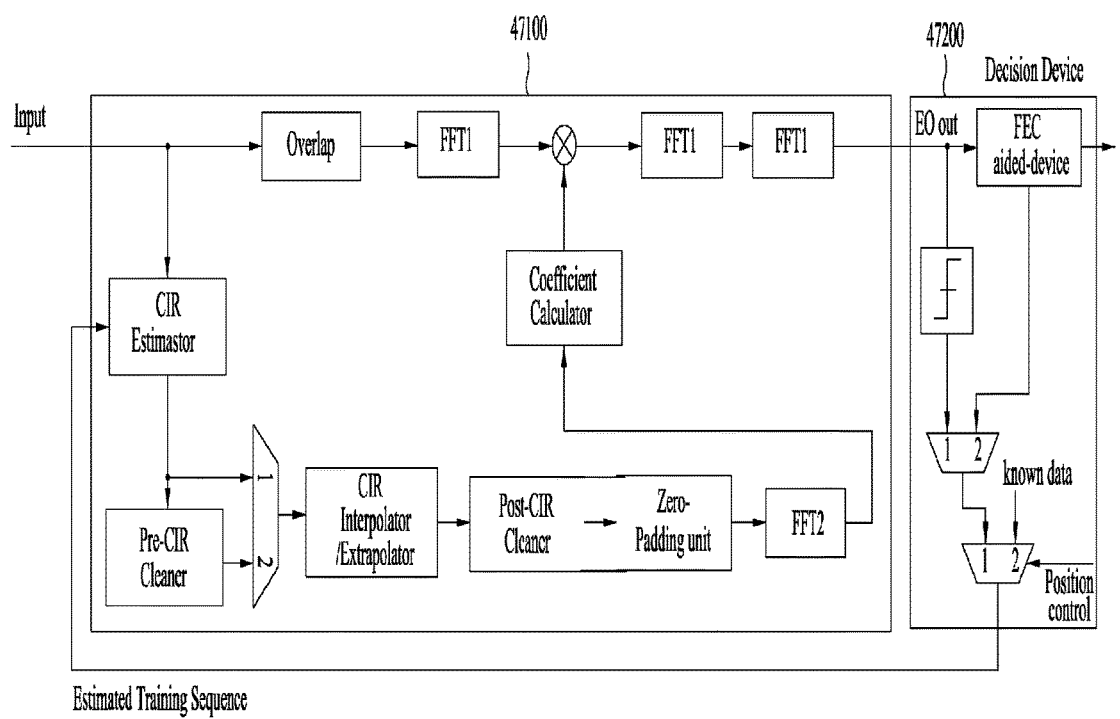
FIG. 47 is a diagram showing the structure of a channel equalizer according to another embodiment of the present invention.

FIG. 47 is a diagram showing the structure of a channel equalizer according to another embodiment of the present invention.

The channel equalizer according to another embodiment of the present invention includes a channel equalizer 47100 having a CIR estimation and FDEQ structure and/or a decision device 47200.

The description of the channel equalizer 47100 is replaced with the above description of the channel equalizers.

The decision device 47200 may decide data (VSB data) included between segmented known data sequences using equalizer output and an input error-corrected by an FEC aided-device. A newly estimated known data sequence decided by the decision device 47200 is used as an input of a known data sequence necessary for CIR estimation of a next iteration.

A channel equalization method according to another embodiment of the present invention will now be described.

Symbols passing through the channel equalizer 47100 including a CIR estimator and an FDEQ are input to the decision device 47200. The VSB data symbol located in the additionally provided scattered known data period is used to estimate and decide the transmitted symbol in the decision device 47200. The decision device 47200 may use hard decision. The decision value used for decision may be set in four or eight steps. As necessary, the decision value may be weighted. The signal input to the decision device 47200 may use the output of the channel equalizer as described above and the accuracy of symbol decision using the symbol error-corrected by FEC may be improved to obtain improved performance. A known data sequence which will be used in a next iteration uses a known pattern without change in a scattered known data period and is replaced with an estimated symbol only at the position of the unknown VSB symbol, thereby configuring a known data sequence.

In case of an equalizer output symbol passing through an initial channel equalizer, channel estimation performance is deteriorated due to interference of an unknown data symbol in known data and an SNR of the equalizer output is bad. However, a plurality of channel equalization orders is iterative such that a large number of unknown VSB data is decided as an actual transmission symbol. Thus, CIR estimation and channel equalization performance can be improved.

FIG. 48 is a diagram showing an iterative channel equalizer according to an embodiment of the present invention.

As shown in FIG. 48, iterative channel equalizers 48120 and 48220 and decision devices 48130 and 48230 are connected and such a connection relationship is conceptually repeated. FIG. 48(a) is a conceptual diagram of the serialized structure of steps. Delay buffers 48110 and 48210 are necessary for CIR estimation, FDEQ and decision of a new training sequence. A symbol input to the channel equalizers is subjected to N iterations so as to obtain a channel-equalized symbol.

FIG. 48(b) shows a structure in which a CIR estimator 48320 and a decision device 48330 are configured and a data symbol input to a channel equalizer necessary for each iteration and a new known data sequence decided in a previous iteration are selected as an input. The output of the channel estimator 48320 is connected to the output of the decision device 48330 up to an (N−1)-th iteration and an equalized symbol is output in an N-th iteration.

In the iterative channel equalizer, the input of the decision device may be configured by receiving the output of the symbol error-corrected by FEC in addition to the output of the channel equalizer. At this time, in case of the delay buffer, a delay time necessary to reconfigure the output of the error-corrected symbol must be considered.

Figure 49:
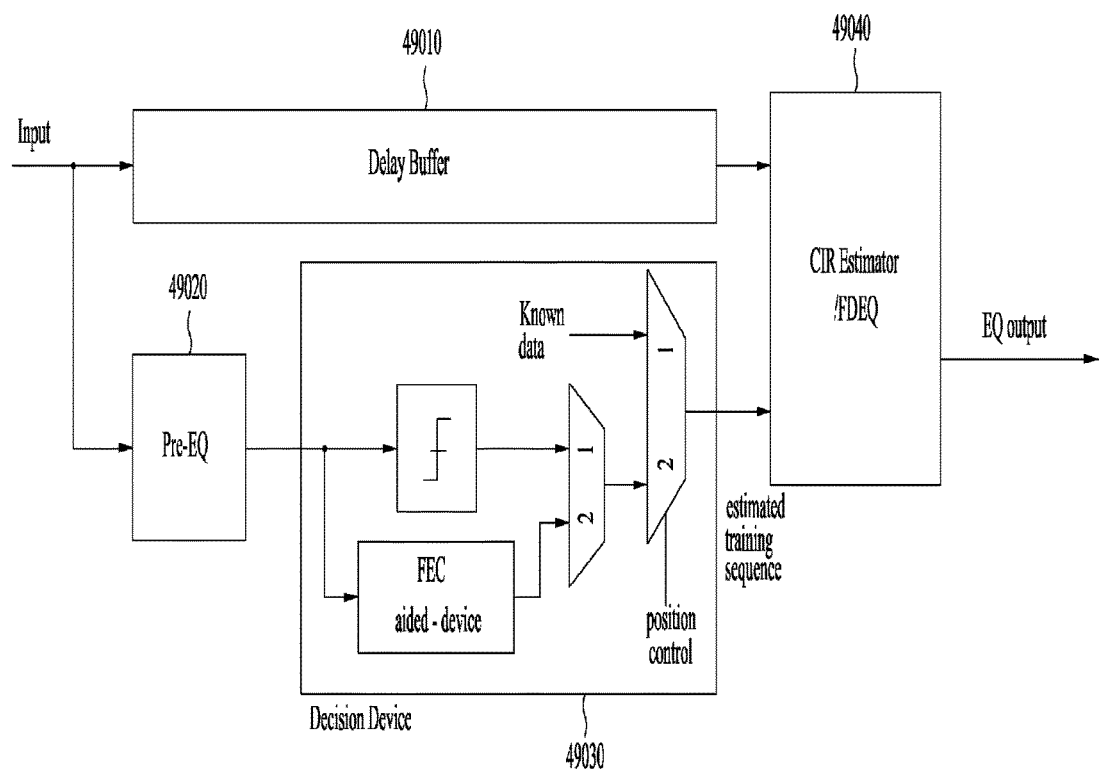
FIG. 49 is a diagram showing a channel equalizer including a pre-equalizer and a post equalizer according to an embodiment of the present invention.

FIG. 49 is a diagram showing a channel equalizer including a pre-equalizer and a post equalizer according to an embodiment of the present invention.

The channel equalizer including the pre-equalizer and the post equalizer according to the embodiment of the present invention may include a delay buffer 49010, a pre-equalizer 49020, a decision device 49030 and/or a post equalizer 49040 (CIR estimator/FDEQ).

The delay buffer 49010 serves to buffer an input signal in consideration of a delay time required for processing of a signal in the pre-equalizer 49020 and the decision device 49030. At this time, if an error-corrected symbol is used as an input of the decision device 49030, the size of the buffer may be decided in consideration of the delay time.

The pre-equalizer 49020 performs a pre equalization process in order to prevent performance from being deteriorated in a known data period due to unknown VSB data, before channel equalization is performed by the post equalizer 49040. The pre-equalizer 49020 serves to configure a new known sequence estimated by reducing decision error with respect to an unknown VSB data symbol located in the scattered known data period through an iterative convergence process in the additionally provided scattered known data period.

The decision device 49030 serves to estimate the unknown VSB data symbol located between scattered known data. For example, the decision device 49030 receives the output of the pre-equalizer, performs error correction by FEC and decides a CSB data symbol based on the error-corrected symbol.

The decision value used for decision may be set in four or eight steps. As necessary, the decision values may be weighted. A known data sequence to be used in the post equalizer 49040 uses a known pattern without change in a scattered known data period and is replaced with an estimated symbol only at the position of the unknown VSB symbol, thereby configuring a known data sequence.

The post equalizer 49040 estimates a CIR of an input signal, approximates the CIR, and performs channel equalization using an FDEQ. The post equalizer 49040 approximates the CIR using interpolation in a data period other than the estimated known data sequence period. The post equalizer 49040 may receive a new known data sequence processed by the pre-equalizer 49020 and the decision device 49030 and perform channel equalization. The post equalizer 49040 may have the structure of the above-described channel equalizer.

As described above, in the present invention, a pre-equalization process is performed with respect to additional scattered known data by the pre-equalizer 49020 at a previous stage of the post equalizer 49040, and a new training sequence processed by the decision device 49030 is input to the post equalizer, thereby improving channel equalization performance.

Figure 50:
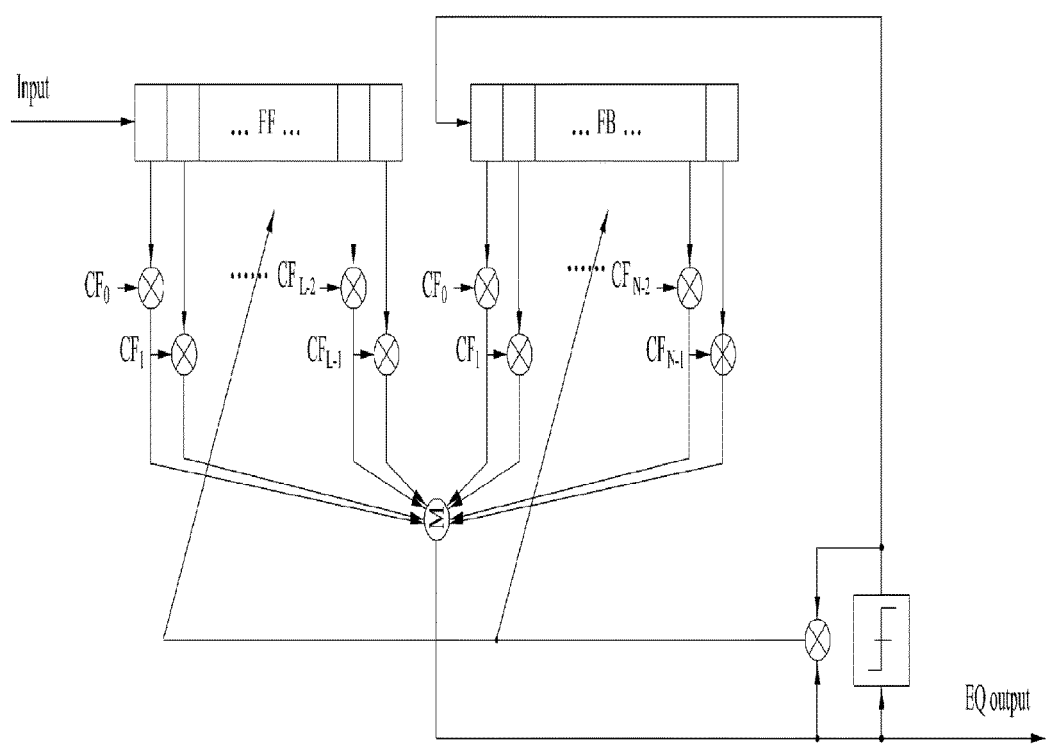
FIG. 50 shows the structure of a decision feedback equalizer of a pre-equalizer according to an embodiment of the present invention.

FIG. 50 shows the structure of a decision feedback equalizer of a pre-equalizer according to an embodiment of the present invention.

The pre-equalizer may include a channel equalizer which is a decision feedback equalizer of FIG. 46. The decision feedback equalizer includes a feed-forward filter and a feed-back filter and updates a filter coefficient using decision errors. A convergence time necessary for filter coefficient convergence of the decision feedback equalizer may be set to a predetermined value and the update process may be finished if an output SNR of the pre-equalizer is equal to or greater than a predetermined threshold.

Figure 51:
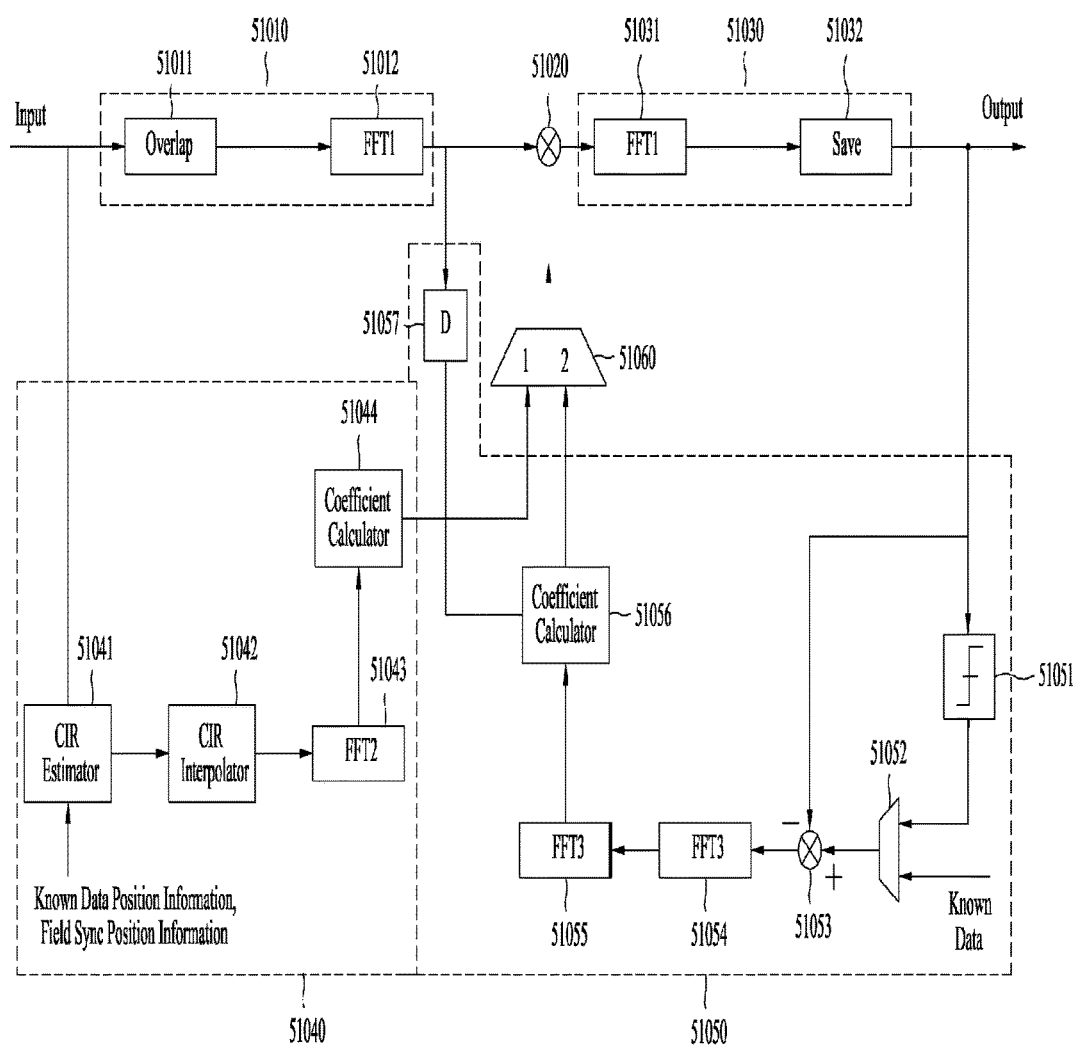
FIG. 51 is a diagram showing the structure of a channel equalizer according to another embodiment of the present invention.

FIG. 51 is a diagram showing the structure of a channel equalizer according to another embodiment of the present invention.

As shown in FIG. 51, the channel equalizer may include a frequency region converter 51010, a distortion compensator 51020, a time region converter 51030, a first coefficient calculator 51040, a second coefficient calculator 51050 and/or a coefficient selector 51060.

The frequency region converter 51010 may include an overlap unit 51011 and/or a first FFT unit 51012.

The time region converter 51030 may include an IFFT unit 51031 and/or a save unit 51032.

The first coefficient calculator 51040 may include a CIR estimator 51041, an interpolator 51041, a second FFT unit 51043 and/or a coefficient calculator 51044.

The second coefficient calculator 51050 may include a decider 51051, a selector 51052, a subtractor 51053, a zero padding unit 51054, a third FFT unit 51055, a coefficient update unit 51056 and/or a delay unit 51057.

At this time, the coefficient selector 51060 may include a multiplexer (MUX) for selecting input data depending on whether current input data is data of the region A/B or the region C/D or E. That is, the coefficient selector 51060 selects the equalization coefficient of the first coefficient calculator 51040 if the input data is data of the region A/B and selects the equalization coefficient of the second coefficient calculator 51050 if the input data is data of the region C/D or E.

In the channel equalizer according to the embodiment of the present invention, the received data is input to the overlap unit 51011 of the frequency region converter 51010 and the first coefficient calculator 51040. The overlap unit 51011 overlaps the input data according to a predetermined overlap ratio and outputs the overlap data to the first FFT unit 51012. The first FFT 51012 transforms the overlap data of a time region into overlap data of a frequency region through FFT and outputs the overlap data of the frequency region to the distortion compensation unit 51020 and the delay unit 51057 of the second coefficient calculator 51050.

The distortion compensation unit 51020 complex-multiplies the overlap data of the frequency region output from the first FFT unit 51012 by an equalization coefficient output from the coefficient selector 51060 to compensate for channel distortion of the overlap data output from the first FFT 51012 and outputs the compensated data to the IFFT unit 51031 of the time region converter 51030. The IFFT 51031 IFFTs the overlap data, channel distortion of which is compensated for, to transform the overlap data into the overlap data of the time region and outputs the overlap data of the time region to the save unit 51032. The save unit 51032 extracts only valid data from the overlap data of the time region subjected to channel equalization, outputs the extracted valid data for data decoding and outputs the valid data to the second coefficient calculator 51050 for coefficient update.

The CIR estimator 51041 of the first coefficient calculator 51040 estimates a CIR using data received during a known data period and reference known data generated by a receiver and outputs the CIR to the interpolation unit 51042. The CIR estimator 51041 estimates the CIR using data received during a field synchronization period and reference field synchronization data generated by the receiver and outputs the CIR to the interpolation unit 51042.

The interpolation unit 51042 estimates CIRs located between the estimated CIRs, that is, CIRs of a period in which known data is not present, using the input CIRs by a predetermined interpolation method and outputs the estimated result to the second FFT 51043. The second FFT unit 51043 transforms the input CIRs into the CIRs of the frequency region and outputs the CIRs to the coefficient calculator 51044. The coefficient calculator 51044 calculates a frequency region equalization coefficient satisfying a condition for minimizing mean square error using the CIRs of the frequency region and outputs the frequency region equalization coefficient to the coefficient selector 51060.

The decider 51051 of the second coefficient calculator 51050 selects a decision value closest to the equalized data from among a plurality of decision values, for example, eight decision values and outputs the selected decision value to the selector 51052. The selector 51052 selects the decision value of the decider 51051 in a general data period, selects known data in a known data period, and outputs the selected decision value or known data to the subtractor 51053. The subtractor 51053 subtracts the output of the time region converter 51030 from the output of the selector 51052 to obtain an error value and outputs the error value to the zero padding unit 51054.

The zero padding unit 51054 pads zero to the input error value by the overlap amount of the received data and outputs the error value, to which zero is padded, to the third FFT unit 51055. The third FFT unit 51055 transforms the error value of the time region, to which zero is padded, into the error value of the frequency region and outputs the error value of the frequency region to the coefficient update unit 51056. The coefficient update unit 51056 updates a previous equalization coefficient using the delayed data of the frequency region and the error value of the frequency region and outputs the updated equalization coefficient to the coefficient selector 51060. At this time, the updated equalization coefficient is stored to be used as a previous equalization coefficient in the future.

The coefficient selector 51060 selects the equalization coefficient calculated by the first coefficient calculator 51040 if the input data is data of the region A/B, selects the equalization coefficient updated by the second coefficient calculator 51050 if the input data is data of the region C/D or E, and outputs the selected equalization coefficient to the distortion compensation unit 51020.

Figure 52:
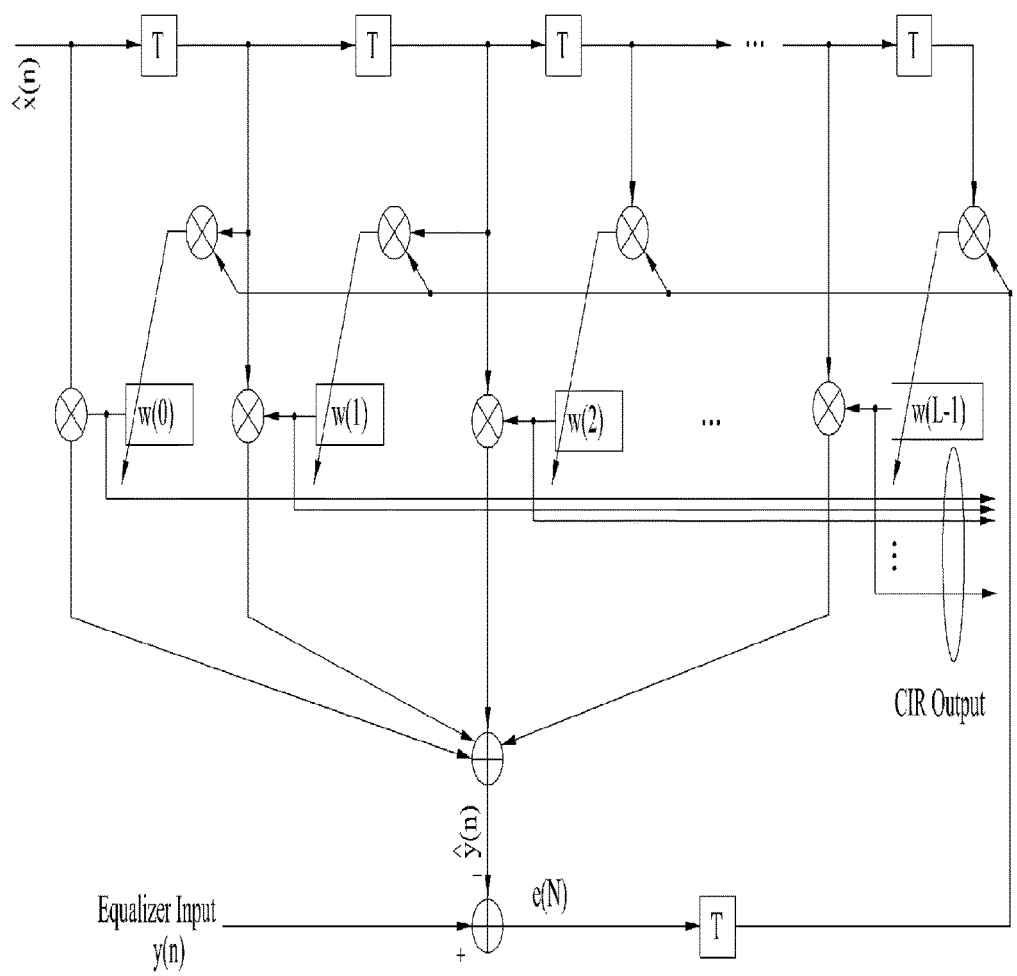
FIG. 52 is a diagram showing a CIR estimator according to an embodiment of the present invention.

FIG. 52 is a diagram showing a CIR estimator according to an embodiment of the present invention.

Referring to FIG. 52, the CIR estimator includes delay units T for sequentially delaying output data $\hat{x}^{(n)}$ of a previous stage of the CIR estimator, multipliers for multiplying the output data of the delay units T by error data e(n) and coefficient update units for updating coefficients by the outputs of the multipliers, the number of which is equal to the number of tabs.

For convenience of description, the multipliers, the number of which is equal to the number of tabs, are referred to as a first multiplier unit. Multipliers for multiplying the output data of the previous stage of the CIR estimator and the output data of the delay units T (excluding the output data of the last delay unit) by the output data of the coefficient update units are further included, the number of which is equal to the number of tabs. For convenience of description, these multipliers are referred to as a second multiplier unit. An adder for adding all the output data of the multipliers of the second multiplier unit and outputting an equalizer input estimation value $\hat{y}^{(n)}$ and a subtractor for outputting a difference between the output $\hat{y}^{(n)}$ of the adder and equalizer input data y(n) as error data e(n) are further included.

The decision value of the equalized data is input to the first delay unit and the first multiplier of the second multiplier unit in the CIR estimator in a general data period and the know data is input to the first delay unit and the first multiplier of the second multiplier unit in the CIR estimator in the known data period.

The input data $\hat{x}^{(n)}$ is sequentially delayed through the delay units corresponding in number to the number of tabs and connected in series. The output data of the delay units and the error data e(n) are multiplied by the multipliers of the first multiplier unit to update the coefficients of the coefficient update units. The updated coefficients of the coefficient update unit are multiplied by the input data $\hat{x}^{(n)}$ and the output data of the delay unit excluding the last delay unit by the multipliers of the second multiplier unit and the multiplied coefficients are input to the adder. The adder adds all the output data of the multipliers of the second multiplier unit and outputs the equalizer input estimation value $\hat{y}^{(n)}$ to the subtractor. The subtractor outputs the difference between the estimation value $\hat{y}^{(n)}$ and the equalizer input data y(n) to the multipliers of the first multiplier unit as the error data e(n). At this time, the error data e(n) is output to the multipliers of the first multiplier unit through the delay units T.

The coefficient of the filter is continuously updated using the above-described process and the outputs of the coefficient update units become the CIR outputs of the CIR estimator in every FFT period.

The CIR estimator according to the present invention may estimate channel impulse response (CIR) using a least squares (LS) method. The LS estimation method obtains a cross correlation value p between known data passing through a channel during a known data period and known data of a receiver and obtains a self correlation value R of the known data. Then, the CIR of a transport channel is estimated by performing a matrix operation of $R^{-1} \cdot p$ so as to eliminate a self correlation portion present in p which is the cross correlation value between the received data and the original known data.

In addition, the CIR estimator may estimate a CIR using a least means square (LMS) method. The basic principle of the LMS CIR estimator receives the output of an unknown transport channel and updates a coefficient value of an adaptive filter such that a difference between the output value of this channel and the output value of the adaptive filter is minimized. When transmission data is x(n), a transport channel may be modeled to a finite impulse response (FIR) filter in which an impulse response is h(n) and an adder for adding a noise component n(n). When the output of this channel is input to an equalizer, an equalizer input y(n) is expressed as follows.

$$y(n) = \vec{x}(n) * \vec{h}(n) + n(n) = \sum_{k=0}^{k=L-1} x(n-k)h(k) + n(n)$$

In this equation, "*" denotes a convolution operation and L denotes channel length.

The LMS channel estimator configures an equalizer input estimation value $\hat{y}^{(n)}$ using a discrimination value $\hat{x}^{(n)}$ and a coefficient $\vec{w}^{(n)}$ of the equalizer as follows.

$$\hat{y}(n) = \vec{\hat{x}}(n) * \vec{w}(n) = \sum_{k=0}^{k=L-1} \hat{x}(n-k)w(k)$$

The filter coefficient $\vec{w}^{(n)}$ is updated using the difference between the equalizer input and the equalizer input estimation value as errors.

$$e(n) = y(n) - \hat{y}(n)$$

$$w(i+1) = w(i) + \mu \cdot e(n) \cdot x(n), (i=0, 1, \ldots, L-1)$$

In this equation, μ denotes a step size of errors.

If known data is used for LMS CIR estimation, since the receiver is already aware of the value of the data, instead of the discrimination value $\hat{x}^{(n)}$ of the equalizer, the transmission data value x(n) may be used. An iterative CIR may be estimated with respect to one known data region.

When the CIR estimator obtains a cross correlation value between the received data and the original known data using a correlator, an approximate CIR is obtained and this information may be used for LMS CIR estimation. It is assumed that a channel tab having a highest correlation value among cross correlation values is referred to as a main tab and a middle value between the position of an earliest channel tab (pre tab) and the position of a latest channel tab (post tab) is referred to as a channel center point. At this time, it is assumed that a value obtained by subtracting the position of the main tab from the position of the channel center point is referred to as a channel center movement value s. This value may have a positive value or a negative value.

The methods of obtaining the CIR for channel equalization in each region of the data group, which have been described up to now, are only exemplary and may be variously applied, although the present invention is not limited to the above-described embodiments.

Figure 53:
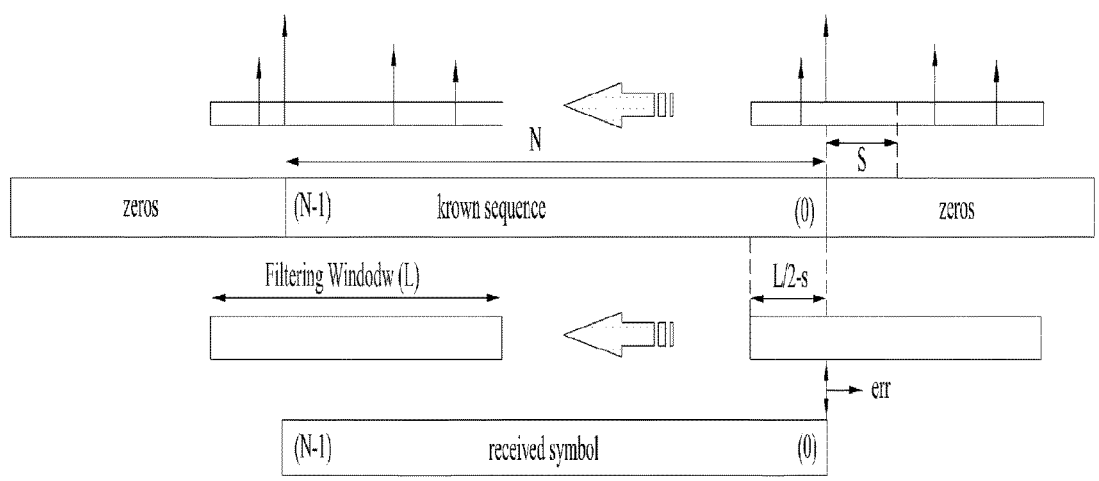
FIG. 53 shows a CIR estimation method of a known data region according to an embodiment of the present invention.

FIG. 53 shows a CIR estimation method of a known data region according to an embodiment of the present invention.

The LMS CIR estimation method of the known data region shown in FIG. 53 will now be described. In iterative LMS CIR estimation, known data or a value of 0 is input to x(n) and received data is input to y(n). When the length of known data is N, received data corresponding to a first part of the known data region is $y_k(0)$ and an input corresponding to a last part thereof is $y_k(N-1)$. With respect to any positive integer a, $y_k(-a)$ denotes a value which is input earlier than $y_k(0)$ by a and $y_k(N-1+a)$ denotes a value which is input later than $y_k(N-1)$ by a. First data of known data is $x_k(0)$, last data is $x_k(N-1)$, and $x_k(-a)$ and $x_k(N-1+a)$ have a value of 0.

$$\hat{y}_k(n) = w(0) \cdot x_k(L/2-s+n) + w(1) \cdot x_k(L/2-s-1+n) + \ldots + w(L-1) \cdot x_k(L/2-s-L+1+n)$$

$\hat{y}_k(n)$ is defined by the above equation and a filter coefficient is updated using a difference between $\hat{y}_k(n)$ and $y_k(n)$ as errors. This operation is performed from n=0 to n=N−1 and is performed again at n=0. CIR estimation performance may be changed according to a method of setting the range of n.

Figure 54:
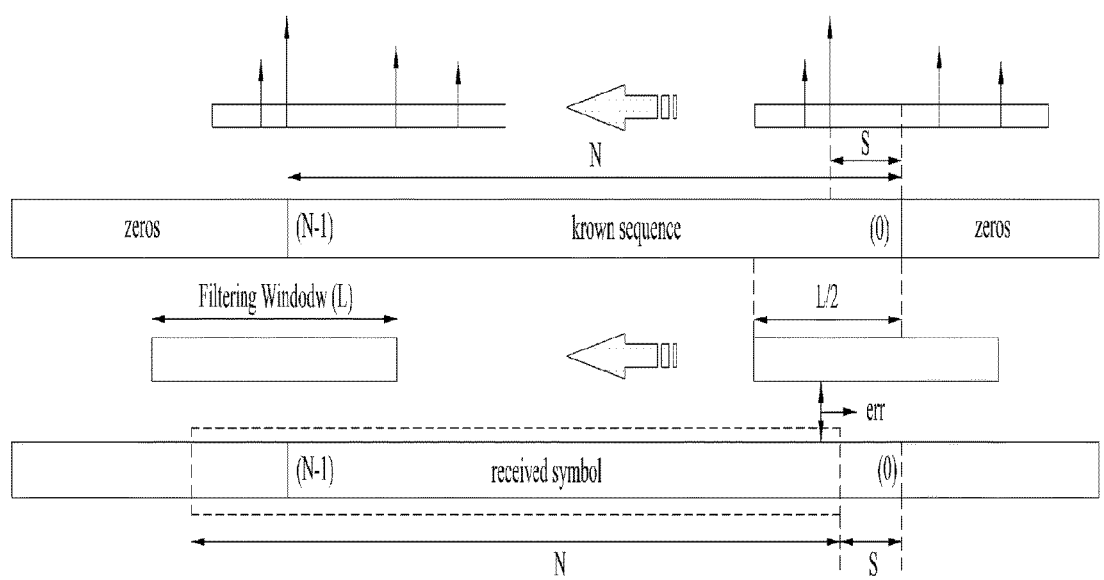
FIG. 54 is a diagram showing a CIR estimation method of a known data region according to another embodiment of the present invention.

FIG. 54 is a diagram showing a CIR estimation method of a known data region according to another embodiment of the present invention.

FIG. 54 is a conceptual diagram when performing LMS CIR estimation using the CIR estimation method of FIG. 53 from n=s to n=N−1+s. The CIR estimation method is described above with reference to FIG. 53 and a detailed description thereof will thus be omitted.

Figure 55:
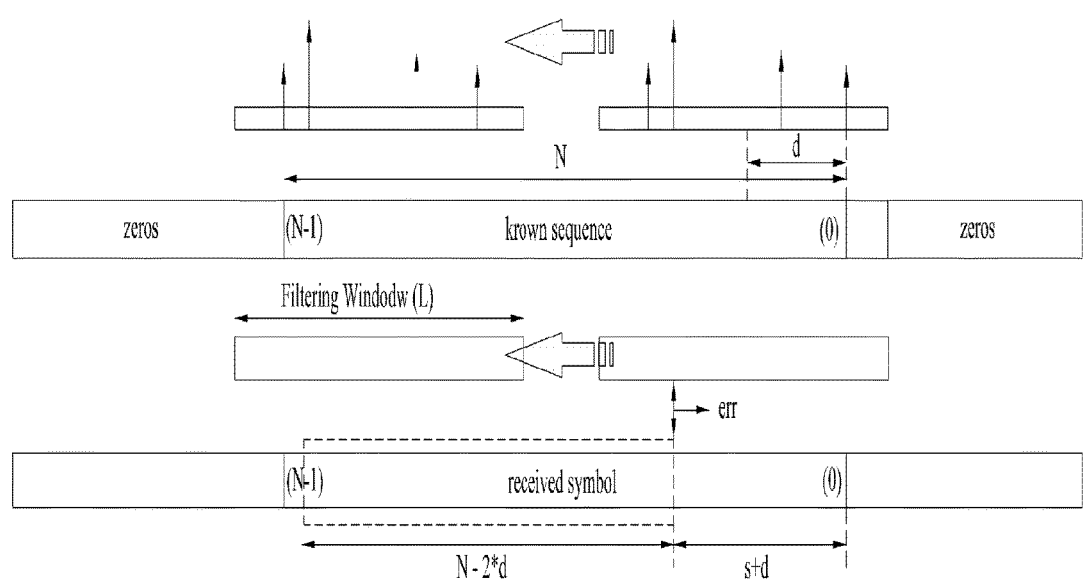
FIG. 55 is a diagram showing a CIR estimation method of a known data region according to another embodiment of the present invention.

FIG. 55 is a diagram showing a CIR estimation method of a known data region according to another embodiment of the present invention.

The CIR estimation method is described with reference to FIGS. 53 and 54. CIR estimation of FIG. 55 is narrower than that of FIG. 54.

For example, a combination of the method of FIG. 54 and the method of FIG. 55 may be used. For example, in iterative LMS CIR, CIR estimation is first performed several times using the method of FIG. 54 and is then performed several times using the method of FIG. 55. An approximate CIR value obtained using a correlator may be used as an initial value of a filter coefficient.

Figure 56:
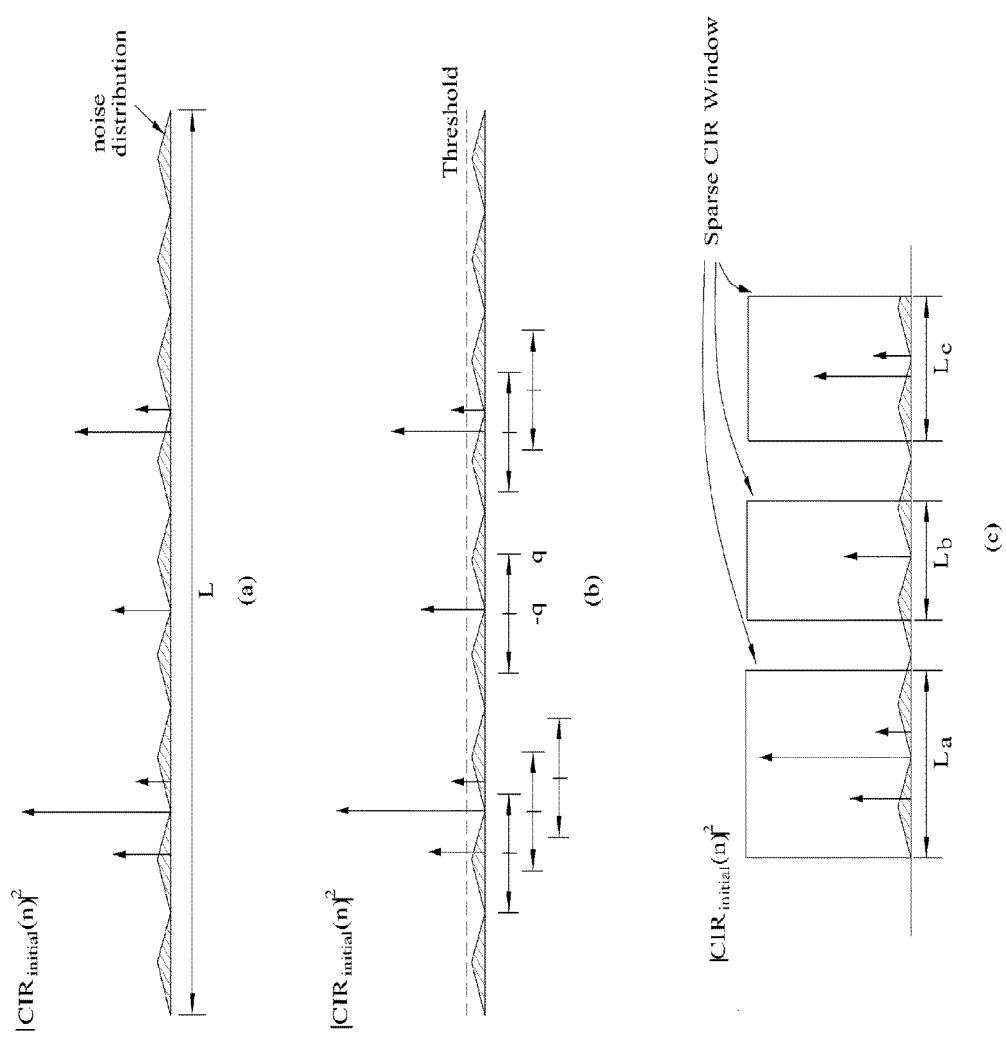
FIG. 56 is a diagram showing a method of selecting a sparse window for CIR measurement according to an embodiment of the present invention.

FIG. 56 is a diagram showing a method of selecting a sparse window for CIR measurement according to an embodiment of the present invention.

In CIR estimation using an LMS method, a sparse LMS CIR estimation method of selectively discriminating CIR equal to or greater than a certain threshold and updating a filter coefficient in which the length of the selected channel is less than L is applicable. The sparse LMS CIR estimation method updates only the filter coefficient corresponding to a valid CIR in which the length is less than the total length L, thereby improving a convergence speed. In addition, noise interference in an invalid period is eliminated to increase accuracy of CIR estimation.

In order to perform the sparse LMS CIR estimation method, initial CIR information necessary to obtain the position of a valid sparse CIR window is necessary. The necessary CIR may be obtained by the following embodiment.

First, an output value of cross correlation between original known data, of which a receiver is aware, and received data is divided by an average power intensity of $y_k(n)$ and normalized to obtain approximate CIR information. The CIR information may be computed using the following equation.

$$CIR_{initial}(n) = \frac{y_k(n) * x(n)}{E[|y_k(n)|^2]} = \frac{\sum_{l=0}^{L_{PN}-1} y_k(n-l)x(l)}{E[|y_k(n)|^2]},$$

$$(n = 0, 1, \ldots, L-1)$$

$$L_{PN}$$

where, $L_{pn}$ denotes the length of the known data.

Second, in a current known data period, a filter coefficient $w(n)^m$ by which LMS CIR estimation is performed with respect to a previous tab having a channel length of L is used as approximate CIR information up to m initial iterations.

$$CIR_{Initial}(n) = w(n)^m, (n=0, 1, \ldots, L-1)$$

Third, final CIR information estimated in a previous known data period may be stored and used.

If a position where the power level of a CIR exceeds a certain threshold $\lambda_{Threshold}$ is p, a period of p±q centered on P is discriminated as a valid CIR region. Finally, a sum of detected windows of a plurality of CIRs exceeding the threshold is decided as a sparse window.

In FIG. 56(a), the total length of the channel is L, valid channel information is located at a part of the total period, and errors may be caused due to noise present in the whole period in a process of obtaining $\hat{y}_k(n)$.

In FIG. 56(b), a valid CIR is selected in a region of ±q centered on p with respect to the position of the CIR exceeding a certain threshold.

Finally, as shown in FIG. 56(c), a sparse window may be decided by a sum of detected windows.

The decided sparse window is mapped to the filter coefficient corresponding to $CIR_{initial}(n)$ and a filter coefficient corresponding to an invalid region may be set to "0". An initial value of a sparse LMS CIR estimation method may be set to a filter coefficient to which a window is mapped, and a filter coefficient to which a window is mapped is updated and converged using an iterative method.

As to the LMS CIR estimation method, a convergence speed and a jitter property after convergence are applied according to a step size. At this time, the range of a converged step size is related to the number of selected filter coefficients. If the number of valid filter coefficients is reduced using the sparse LMS CIR estimation method, convergence is rapidly performed by increasing the allowed step size. For example, in an iterative convergence process, the step size is initially increased to achieve fast convergence and is then decreased to stabilize the jitter property after convergence.

Figure 57:
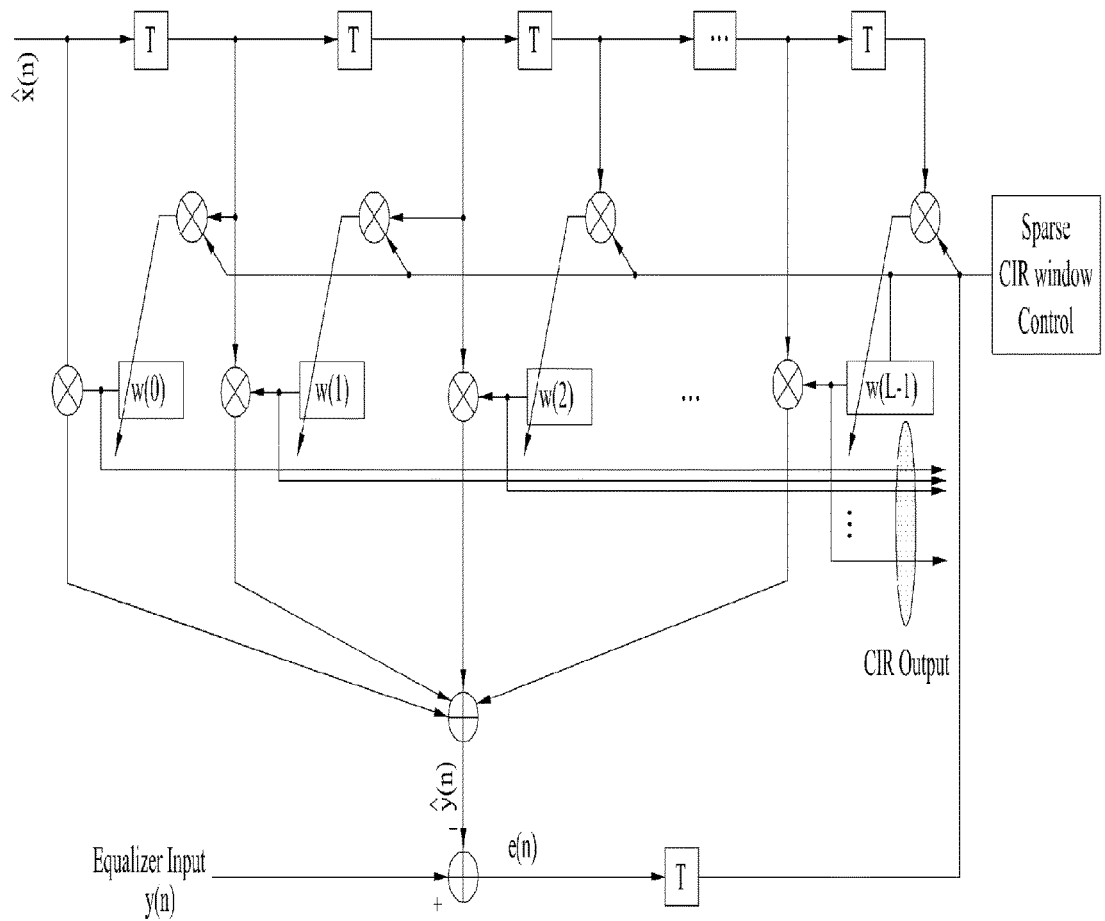
FIG. 57 is a diagram showing a sparse LMS CIR estimator according to an embodiment of the present invention.

FIG. 57 is a diagram showing a sparse LMS CIR estimator according to an embodiment of the present invention.

The CIR estimator of FIG. 57 has a structure similar to that of the estimator of FIG. 52. The sparse LMS CIR estimator of FIG. 57 receives a CIR having a channel length of L, which is obtained by the above-described method, as an input of a sparse CIR window controller and decides the position of a valid CIR using the received CIR.

A CIR obtained in a known data region included in the structure of the data group shown in FIG. 4 interpolated with a region other than known data in the region B4, B5, B6 and/or B7 so as to estimate the CIR of this region.

At this time, if the sparse LMS CIR estimation method is used, error rate may be increased in the interpolation process due to a difference between sparse windows estimated in the previous and next known data regions.

Figure 58:
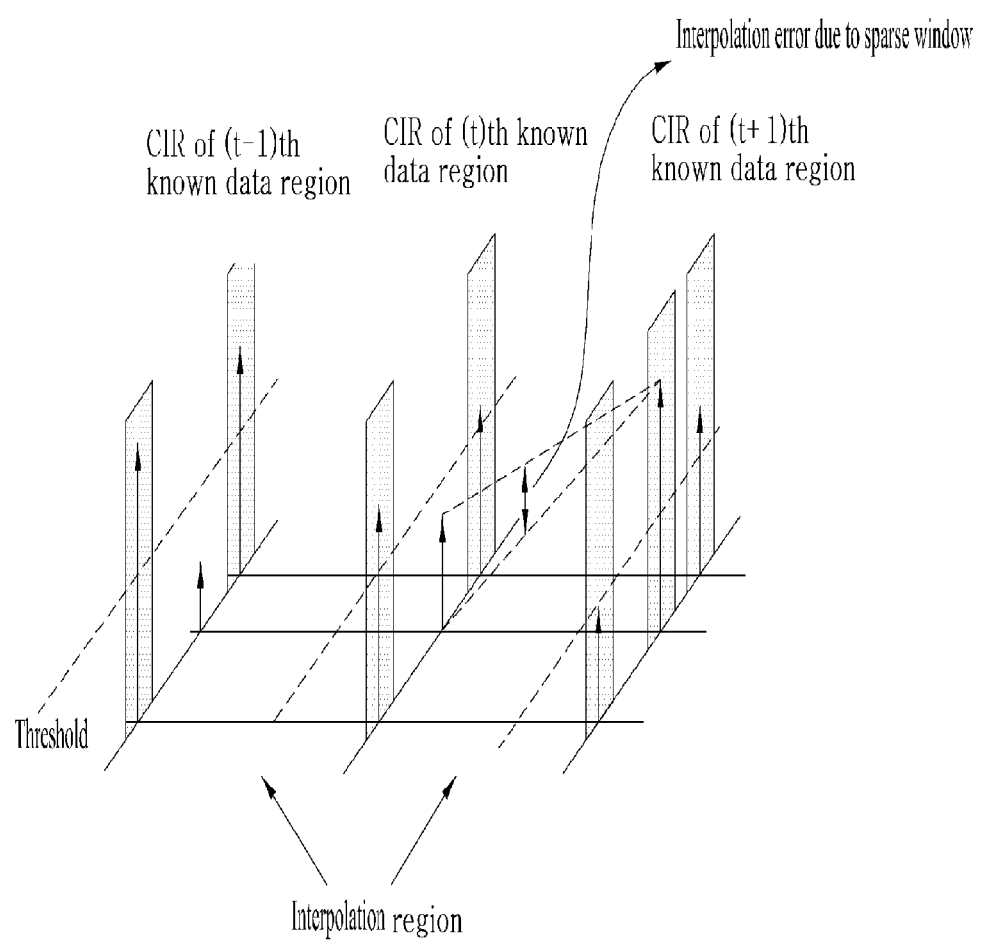
FIG. 58 is a diagram showing generation of interpolation error due to a sparse window according to an embodiment of the present invention.

FIG. 58 is a diagram showing generation of interpolation error due to a sparse window according to an embodiment of the present invention.

Referring to FIG. 58, in case of a CIR in known data regions of (t−1) and t, a middle tab is equal to or less than a certain threshold, is regarded as an invalid CIR and is excluded from the sparse window so as not to influence performance in the interpolation period. However, as to a CIR in a known data region of (t+1), a middle tab is greater than the threshold and is regarded as a valid CIR, and interpolation error may be caused in the interpolation period due to discontinuity of the selected sparse windows in the known data regions of t and (t+1). Accordingly, in order to minimize error of the interpolation period, the selected sparse windows in the adjacent known data periods must have continuity. FIG. 9 shows an embodiment of using information about adjacent sparse windows for minimizing interpolation error.

Figure 59:
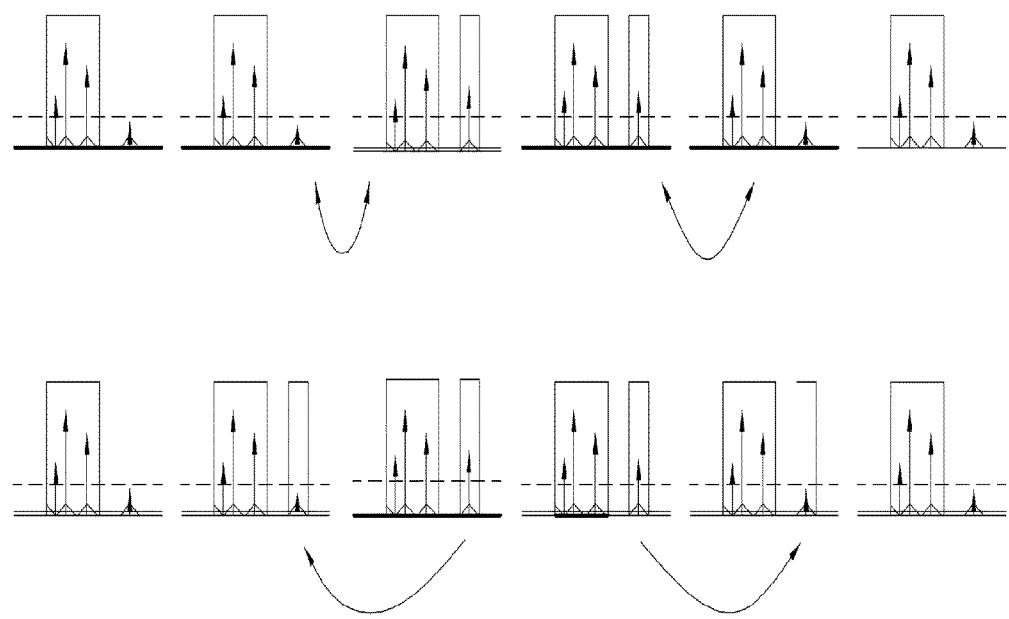
FIG. 59 is a diagram showing a method of using information about adjacent sparse windows for minimizing error in an interpolation period according to an embodiment of the present invention.

FIG. 59 is a diagram showing a method of using information about adjacent sparse windows for minimizing error in an interpolation period according to an embodiment of the present invention.

In the initial CIR information obtained by the above-described methods, the sparse window information obtained in the known data regions of t−1, t and t+1 shown in FIG. 58 are respectively referred to as $WIN_{t-1}$, $WIN_t$ and $WIN_{t+1}$. In order to minimize interpolation error, the final sparse window $WIN_t^f$ of the known data region of t may be acquired using an OR operation such that discontinuity between the sparse window $WIN_{t-1}$ and $WIN_{t+1}$ of t−1 and t+1 corresponding to the previous and next known data regions is removed.

$$WIN_t^f = (WIN_{t-1}) \text{ OR } (WIN_t) \text{ OR } (WIN_{t+1})$$

As to first or last known data, sparse window information of one piece of adjacent known data may be used.

A filter coefficient corresponding to the final sparse window $WIN_t^f$ is updated as an initial value using the CIR obtained by the above-described methods and an iterative LMS CIR estimation method is performed.

In the iterative LMS CIR estimation process described in FIGS. 53 and 54, the filter coefficient is updated in order from $y_k(0)$ to $y_k(N-1)$ or from $y_k(s)$ to $y_k(N-1+s)$ according to the input order of known data and the process of updating the filter coefficient at the position corresponding to first input data is repeated in the next iteration. However, repeating the process of updating the filter coefficient at the position of the first data in next iteration requires a process of filling a known data sequence buffer $\vec{x}_k(n)$ for obtaining $\hat{y}_k(n)$ with new data and thus excess time delay occurs. In order to reduce excess time delay, in first iteration, the filter is sequentially updated from $y_k(0)$ to $y_k(N-1)$ or from $y_k(s)$ to $y_k(N-1+s)$ and, in the next iteration, the filter is updated in reverse order, that is, from $y_k(N-1)$ to $y_k(0)$ or from $y_k(N-1+s)$ to $y_k(s)$, such that the input value in the known data sequence buffer $\vec{x}_k(n)$ is changed one by one. Thus, it is possible to reduce time necessary to correct the buffer per iteration.

FIG. 60 is a flowchart illustrating a method of receiving and processing a broadcast signal at a receiver according to an embodiment of the present invention.

A tuner of a broadcast receiver receives a DTV signal including a data group (s60010). The received data group includes mobile service data, segmented known data sequences, long known data sequences and/or transmission parameter data. In the segmented known data sequences and the long known data sequences, as shown in FIGS. 8 to 17, long known data connected to exceed one segment of the data group may be defined as a long known data sequence and short known data scattered in one segment may be defined as a segmented known data sequence. This process may be performed by the channel synchronizer or the antenna unit of the receiver shown in FIG. 22.

The broadcast receiver compensates for a carrier frequency offset of the DTV signal (s60020). The broadcast receiver may compensate for the carrier frequency offset by multiplying the carrier recovered by the carrier recovery block of the channel synchronizer by an input signal. For example, this process may be performed by the channel synchronizer of the receiver shown in FIG. 22.

The broadcast receiver performs channel equalization with respect to the DTV signal, in which the carrier frequency offset is compensated for, using at least one known data sequence of the segmented known data sequences and the long known data sequences included in the data group (s60030). The channel equalization process may include the techniques described above in association with the channel equalizer. For example, the channel equalization process may be used to perform forward error correction (FEC) decoding with respect to data located between the segmented known data sequences and estimate a channel impulse response (CIR) using the FEC-decoded data as known data. This process may be performed by the channel equalizer of the receiver shown in FIG. 22.

As described above, the transmitting system, the receiving system, and the method of processing broadcast signals according to the present invention have the following advantages.

When transmitting mobile service data through a channel, the present invention may be robust against errors and backward compatible with the conventional digital broadcast receiving system.

This invention extends a region for mobile service data in a slot. Thus, the transmitter can transmit more mobile service data.

This invention has an advantage enhancing the reception performance of a broadcast signal at a reception system, and a method for processing a broadcast signal by inserting additional known data in regions C, D and E.

When performing block deinterleaving on the turbo-decoded FIC data, by acquiring TNoG using slot information and data group information, the present invention may decode the FIC data, even when the TNoG information of the current subframe cannot be acquired by TPC data decoding. Therefore, the decoding performance of the FIC data may be enhanced.

After performing CRC-RS decoding, a CRC syndrome check may be performed once again on the RS frame, and the checked result is marked on an error_indicator field of the M/H service data packets configuring the payload of the RS frame. Thus, the likelihood of malfunction occurring in the block receiving and processing the M/H service data packet may be reduced, thereby enhancing the overall performance of the receiving system.

According to the embodiments of the present invention, it is possible to perform channel equalization using segmented known data sequences.

According to the embodiments of the present invention it is possible to shorten a time required for performing channel equalization.

Finally, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for transmitting a broadcast signal by a transmission system, the method comprising:
   first encoding broadcast service data for a service;
   second encoding the first encoded broadcast service data;
   interleaving the second encoded broadcast service data;
   mapping the interleaved broadcast service data into a data unit; and
   transmitting the broadcast signal including a signal frame having the data unit, wherein the signal frame includes broadcast service data symbols corresponding to the interleaved broadcast service data in the data unit, wherein the data unit includes a variable number of broadcast service data symbols,
   wherein the signal frame further includes scattered known data and transmission parameter data, and
   wherein the transmission parameter data includes information indicating the variable number of broadcast service data symbols,
   wherein a pattern of the scattered known data is based on a transmission mode, and distances between the scattered known data are based on the pattern of the scattered known data,
   wherein the broadcast service data symbol has the scattered known data according to the pattern of the scattered known data.

2. The method of claim 1, wherein the transmission parameter data further includes version information representing a version of a structure of the transmission parameter data.

3. The method of claim 1, wherein, if a plurality of data units are present in the signal frame, at least two of the plurality of data units are concatenated in time.

4. The method of claim 1, wherein the signal frame further includes signaling information required for service scan and wherein the transmission parameter data further include information related to the signaling information.

5. An apparatus for transmitting a broadcast signal, the apparatus comprising:
   a first encoder for first encoding broadcast service data for a service;
   a second encoder for second encoding the first encoded broadcast service data;
   an interleaver for interleaving the second encoded broadcast service data;
   a formatter for mapping the interleaved broadcast service data into a data unit; and
   a transmitter for transmitting the broadcast signal including a signal frame having the data unit,
   wherein the signal frame includes broadcast service data symbols corresponding to the interleaved broadcast service data in the data unit, wherein the data unit includes a variable number of broadcast service data symbols,
   wherein the signal frame further includes scattered known data and transmission parameter data, and wherein the transmission parameter data includes information indicating the variable number of broadcast service data symbols, wherein a pattern of the scattered known data is based on a transmission mode, and distances between the scattered known data are based on the pattern of the scattered known data, wherein the broadcast service data symbol has the scattered known data according to the pattern of the scattered known data.

6. The apparatus of claim 5, wherein the transmission parameter data further includes version information representing a version of a structure of the transmission parameter data.

7. The apparatus of claim 5, wherein, if a plurality of data units are present in the signal frame, at least two of the plurality of data units are concatenated in time.

8. The apparatus of claim 5, wherein the signal frame further includes signaling information required for service scan and wherein the transmission parameter data further include information related to the signaling information.

* * * * *